US012187183B2

(12) United States Patent
Ota et al.

(10) Patent No.: US 12,187,183 B2
(45) Date of Patent: Jan. 7, 2025

(54) VEHICULAR LAMP SYSTEM, POWER SUPPLY CIRCUIT

(71) Applicant: KOITO MANUFACTURING CO., LTD., Tokyo (JP)

(72) Inventors: Yu Ota, Shizuoka (JP); Masashi Kato, Shizuoka (JP); Shohei Yanagizu, Shizuoka (JP); Satoshi Kikuchi, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 90 days.

(21) Appl. No.: 18/063,307

(22) Filed: Dec. 8, 2022

(65) Prior Publication Data

US 2023/0108612 A1    Apr. 6, 2023

Related U.S. Application Data

(63) Continuation of application No. PCT/JP2021/021725, filed on Jun. 8, 2021.

(30) Foreign Application Priority Data

Jun. 9, 2020 (JP) ................................ 2020-100450
Jun. 9, 2020 (JP) ................................ 2020-100451
Jun. 9, 2020 (JP) ................................ 2020-100452

(51) Int. Cl.
*B60Q 1/076* (2006.01)
*B60Q 1/14* (2006.01)
(Continued)

(52) U.S. Cl.
CPC ........... *B60Q 1/076* (2013.01); *B60Q 1/1423* (2013.01); *B60Q 1/16* (2013.01); *F21S 41/663* (2018.01);
(Continued)

(58) Field of Classification Search
CPC ........ B60Q 1/076; B60Q 1/1423; B60Q 1/16; F21S 43/663; F21V 23/003
See application file for complete search history.

(56) References Cited

U.S. PATENT DOCUMENTS

2007/0091036 A1    4/2007  Han et al.
2013/0026926 A1*   1/2013  Oh ........................ G09G 3/342
                                                           315/192
(Continued)

FOREIGN PATENT DOCUMENTS

DE    102008030365 A1    8/2009
JP      2007242477 A      9/2007
(Continued)

OTHER PUBLICATIONS

Office Action (Communication pursuant to Rule 164(1) EPC/The Partial Supplementary European Search Report) issued on Nov. 29, 2023, in corresponding European Patent Application No. 21821624.0. (13 pages).

(Continued)

*Primary Examiner* — Bryon T Gyllstrom
(74) *Attorney, Agent, or Firm* — Buchanan Ingersoll & Rooney PC

(57) ABSTRACT

An array-type light-emitting device includes multiple pixel circuits electrically coupled in parallel and spatially arranged in a matrix. A power supply circuit supplies electric power to the array-type light-emitting device. A DC/DC converter has an output coupled to a power supply terminal of the array-type light-emitting device via a power supply line. A power supply control circuit sets a target value that corresponds to a light distribution pattern, and controls the DC/DC converter such that the control target voltage approaches the target value.

30 Claims, 43 Drawing Sheets

(51) Int. Cl.
*B60Q 1/16* (2006.01)
*F21S 41/663* (2018.01)
*F21V 23/00* (2015.01)
*F21Y 115/10* (2016.01)
*H01L 27/15* (2006.01)

(52) U.S. Cl.
CPC ......... *F21V 23/003* (2013.01); *F21Y 2115/10* (2016.08); *H01L 27/156* (2013.01)

(56) References Cited

U.S. PATENT DOCUMENTS

| | | | | |
|---|---|---|---|---|
| 2013/0320850 A1* | 12/2013 | Nakamura | ............ | H05B 45/48 315/186 |
| 2015/0022115 A1* | 1/2015 | Hast | ............ | H05B 47/18 315/294 |
| 2016/0323972 A1* | 11/2016 | Bora | ............ | H05B 47/11 |
| 2018/0056853 A1* | 3/2018 | Muramatsu | ............ | H05B 45/375 |
| 2018/0283637 A1* | 10/2018 | Murakami | ............ | H05B 45/3725 |
| 2019/0004370 A1* | 1/2019 | Gamperl | ............ | G09G 3/3426 |
| 2023/0020077 A1* | 1/2023 | Deckers | ............ | H05K 1/181 |

FOREIGN PATENT DOCUMENTS

| | | |
|---|---|---|
| JP | 2011009564 A | 1/2011 |
| JP | 2013030458 A | 2/2013 |
| JP | 2016203863 A | 12/2016 |
| JP | 2018032553 A | 3/2018 |
| JP | 2018172038 A | 11/2018 |

OTHER PUBLICATIONS

International Search Report (PCT/ISA/210) and Written Opinion (PCT/ISA/237), both with English translations, mailed on Jul. 20, 2021, by the Japan Patent Office as the International Searching Authority for International Application No. PCT/JP2021/021725.

Office Action (Notification of Reason(s) for Refusal) issued on Jul. 23, 2024, in corresponding Japanese Patent Application No. 2022-530575 and machine English translation of the Office Action. (7 pages).

* cited by examiner

VEHICULAR LAMP SYSTEM, POWER SUPPLY CIRCUIT

BACKGROUND

1. Technical Field

The present invention relates to an automotive lamp.

2. Description of the Related Art

Typical automotive lamps are capable of switching between a low-beam mode and a high-beam mode. The low-beam mode is used to illuminate a close range in the vicinity of the user's vehicle with a predetermined light intensity. In the low-beam mode, light distribution is determined so as to prevent glare being imparted to an oncoming vehicle or a leading vehicle. The low-beam mode is mainly used when the vehicle is traveling in an urban area. In contrast, the high-beam mode is used to illuminate a distant range over a wide area ahead of the vehicle with a relatively high light intensity. The high-beam mode is mainly used when the vehicle is traveling at high speed along a road where there are a small number of oncoming vehicles and leading vehicles. Accordingly, the high-beam mode provides the driver with high visibility, which is an advantage, as compared with the low-beam mode. However, the high-beam mode has a problem of imparting glare to a pedestrian or a driver of a vehicle ahead of the vehicle.

In recent years, the Adaptive Driving Beam (ADB) technique has been proposed in which a high-beam distribution pattern is dynamically and adaptively controlled based on the state of the surroundings of a vehicle. With the ADB technique, the presence or absence of a leading vehicle, an oncoming vehicle, or a pedestrian ahead of the vehicle is detected, and the illumination is reduced or turned off for a region that corresponds to such a vehicle or pedestrian thus detected, thereby reducing glare imparted to such a vehicle or pedestrian.

As an ADB lamp, an arrangement using a bypass method, which is a combination of an LED (light-emitting diode) string and a bypass circuit, has been put to practical use. FIG. 1 is a block diagram showing a lamp 1R using the bypass method.

The ADB lamp 1R includes an LED string (LED bar) 50, a constant current driver 70, and a bypass circuit 80. The LED string 50 includes multiple LEDs 52_1 through 52_n (n 2) coupled in series. The ADB lamp 1R is configured such that the output beams of the multiple LEDs 52_1 through 52_n are irradiated to different regions on a virtual vertical screen 40 in front of the vehicle.

The constant current driver 70 includes a current source 72 configured to generate a driving current $I_{LED}$ stabilized to a predetermined amount of current, and to supply the driving current $I_{LED}$ to the LED string 50. The bypass circuit 80 includes multiple switches SW1 through SWn arranged in parallel with the multiple LEDs 52_1 through 52_n.

In the off state of a given switch SWi (1≤i≤n) of the bypass circuit 80, the current $I_{LED}$ generated by the current source 72 flows through the LED 52_i, thereby turning on the LED 52_i. In the on state of the switch SWi, the current $I_{LED}$ generated by the current source 72 is bypassed via the switch SWi, thereby turning off the LED 52_i.

A light distribution pattern 42 is formed on the virtual vertical screen 40 according to the on/off states of the multiple bypass switches SW1 through SWn.

With the lamp using the bypass method shown in FIG. 1, the number n of the LEDs 52, i.e., the number of divisions of on/off controllable regions, is only on the order of several to several dozen at most. In order to achieve a larger number of divisions, an ADB lamp using an LED (light-emitting diode) array method has been proposed. FIG. 2 is a block diagram showing an ADB lamp 1S using the LED array method. The ADB lamp 1S includes an LED array device 10, a light distribution controller 20, and a power supply circuit 30. The LED array device 10 includes multiple LEDs 12 arranged in an array, and an LED driver 14 that drives the multiple LEDs 12, which are packaged as a single device (which will be referred to as an array-type light-emitting device). Each pixel (which will also be referred to as a "pixel circuit") is configured including an LED 12 and an LED driver 14. The LED driver 14 includes a current source (switch) coupled to the LED 12 in series. For each pixel, the LED driver 14 controls the on/off state of the current source so as to switch between the on state (lighting-on state) and the off state (lighting-off state).

The power supply circuit 30 supplies a power supply voltage $V_{DD}$ to the LED array device 10. The power supply circuit 30 includes a DC/DC converter 32 and a controller 34 thereof. A feedback voltage $V_{FB}$ based on the output voltage $V_{OUT}$ of the DC/DC converter 32 is fed back to the controller 34. The controller 34 controls the DC/DC converter 32 such that the feedback voltage $V_{FB}$ approaches a target value $V_{REF}$.

The light distribution controller 20 generates a control signal for specifying the on/off states of the multiple pixels, and transmits the control signal to the LED array device 10. The output beam of the LED array device 10 is irradiated to the virtual vertical screen 40 via an unshown optical system. A light distribution pattern 42 is formed on the virtual vertical screen 40 according to the on/off states of the multiple light-emitting elements 12.

Problem 1. As a result of investigating the ADB lamp is shown in FIG. 2, the present inventor has come to recognize the following problem.

With the circuit shown in FIG. 2, the (N) multiple pixel circuits are coupled in parallel. Accordingly, the maximum value of the output current $I_{OUT}$ of the power supply circuit 30 is represented by $I_{OUT(MAX)}=I_{LED} \times N$. At present, the LED array device 10 has been developed with a number of pixels N from several thousand to ten thousand or more.

For example, in a case in which $I_{LED}=10$ mA and the number N of the LEDs=3000, the maximum output current $I_{OUT(MAX)}$ reaches 30 A.

A power supply cable 16 and a connector each have a DC resistance component R. Accordingly, a voltage drop $V_{DROP}$ (=$R \times I_{OUT}$) occurs due to the flow of a large amount of current. With the voltage at the output terminal of the power supply circuit 30 as $V_{OUT}$, the power supply voltage (which will also be referred to as "load input terminal voltage") $V_{DD}$ supplied to the power supply terminal of the LED array device 10 is represented by $V_{DD}=V_{OUT}-R \times I_{OUT}$. In order to allow each pixel circuit to operate normally, the load input terminal voltage $V_{DD}$ must be larger than $V_{DD(MIN)}=Vf+V_{SAT}+\alpha$. Here, Vf represents the forward voltage, $V_{SAT}$ represents the terminal voltage (minimum operating voltage) across both terminals of the LED driver 14 and α represents the voltage margin.

Accordingly, in the power supply circuit 30, it is necessary to design the controller 34 such that the target voltage $V_{OUT(REF)}$ of the output voltage $V_{OUT}$ satisfies $V_{OUT(REF)}>V_{DD(MIN)}+R \times I_{OUT}$.

FIGS. 3A and 3B are operation waveform diagrams of the ADB lamp 1S shown in FIG. 2. The output current $I_{OUT}$ changes in a range between 0 and $I_{OUT(MAX)}$. Assuming the maximum output current $I_{OUT(MAX)}$, the target value $V_{OUT(REF)}$ of the output voltage $V_{OUT}$ is determined such that it satisfies the following condition.

$$V_{OUT(REF)} = V_{DD(MIN)} + R \times I_{OUT(MAX)}$$

In this case, in a situation in which $I_{OUT} \approx 0$, the load input terminal voltage $V_{DD}$ becomes larger than the minimum voltage $V_{DD(MIN)}$. Accordingly, this leads to unnecessary power consumption, as represented by $(V_{DD} - V_{DD(MIN)}) \times I_{OUT}$. In a case in which the target value $V_{OUT(REF)}$ is set to a low value, there is a high probability that the load input terminal voltage $V_{DD}$ will become lower than the minimum operating voltage $V_{DD(MIN)}$. This becomes a cause of flickering or lighting turning off.

As shown in FIG. 3A, in a case in which the controller 34 has a response delay at the time point to when the output current $I_{OUT}$ suddenly changes, this lowers the output voltage $V_{OUT}$, leading to a fall in the power supply voltage $V_{DD}$. When the power supply voltage $V_{DD}$ becomes lower than the minimum operating voltage $V_{DD(MIN)}$, flickering occurs.

Problem 2. With a commercially available LED array device 10, the minimum operating voltage $V_{DD(MIN)}$ is determined in specifications. The minimum operating voltage $V_{DD(MIN)}$ is based on the minimum operating voltage of each pixel. Specifically, the minimum operating voltage $V_{DD(MIN)}$ is based on the sum of the forward voltage $V_F$ of the LED 12 and the voltage drop $V_D$ across the current source.

The minimum operating voltage of each pixel is affected by process variation. Accordingly, there is a difference in the minimum operating voltage of each pixel between pixels in the same chip and between individual LED array devices 10. Furthermore, the minimum operating voltage $V_{DD(MIN)}$ is affected by temperature. Typically, the value $V_{DD(SPEC)}$ is determined in specifications giving consideration to variation of individual LED array devices 10 and temperature variation. Specifically, the $V_{DD(SPEC)}$ is determined to be higher than the true value of the minimum operating voltage $V_{DD(MIN)}$ giving consideration to a margin. Accordingly, in a case in which the operating conditions of the power supply circuit 30 are designed based on the value $V_{DD(SPEC)}$ determined in specifications, in many cases, this leads to a situation in which excessive voltage is supplied to an actual LED array device 10. This becomes a cause of an increase in power consumption.

SUMMARY

An embodiment of the present disclosure has been made in order to solve the problem 1.

An embodiment of the present disclosure has been made in order to solve the problem 2.

1. An embodiment of the present disclosure relates to a lamp system. The lamp system includes: an array-type light-emitting device including multiple pixel circuits electrically coupled in parallel, and spatially arranged in a matrix; and a power supply circuit structured to supply electric power to the array-type light-emitting device. The power supply circuit includes: a DC/DC converter having an output coupled to the array-type light-emitting device via a power supply cable; and a power supply control circuit structured to set a target value according to a light distribution pattern, and to control the DC/DC converter such that a control target voltage approaches the target value.

2. An embodiment of the present disclosure relates to a lamp system. The lamp system includes: an array-type light-emitting device including multiple pixel circuits electrically coupled in parallel, and spatially arranged in a matrix; a power supply circuit structured to supply electric power to the array-type light-emitting device; and a coupling means including a power supply cable structured to couple the power supply circuit and the array-type light-emitting device. The power supply circuit includes: a DC/DC converter having an output coupled to the array-type light-emitting device via a power supply cable; and a power supply control circuit structured to acquire a voltage drop across the power supply cable, to set a target value according to the voltage drop across the power supply cable, and to control the DC/DC converter such that an output voltage of the DC/DC converter approaches the target value.

3. An embodiment of the present disclosure relates to a lamp system. The lamp system includes: a variable light distribution light source including an array-type light-emitting device; and a power supply circuit structured to supply electric power to the array-type light-emitting device. The array-type light-emitting device includes multiple pixel circuits. The multiple pixel circuits are electrically coupled in parallel, spatially arranged in a matrix, and each include a light-emitting element and a current source coupled in series. The array-type light-emitting device is structured to generate data with respect to voltage drops across the multiple light-emitting elements included in the multiple pixel circuits, and to transmit the data to an external circuit. The power supply circuit includes: a DC/DC converter having an output coupled to the array-type light-emitting device via a power supply cable; and a power supply control circuit structured to control the DC/DC converter such that the control target voltage approaches a target value that corresponds to the data.

It should be noted that any combination of the components described above or any component or any manifestation of the present disclosure may be mutually substituted between a method, apparatus, system, and so forth, which are also effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 1:
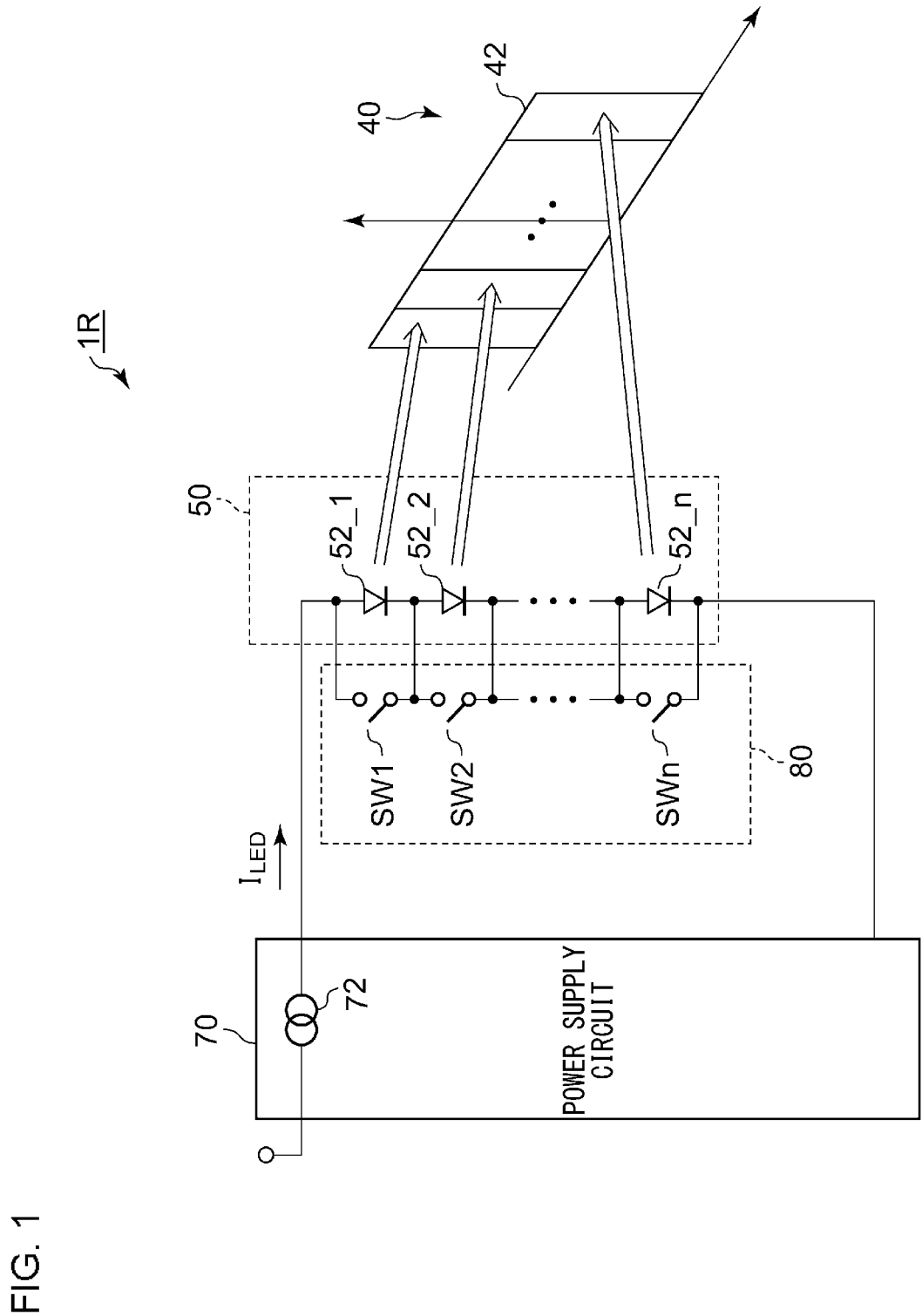
FIG. 1 is a block diagram showing a lamp using a bypass method.
Figure 2:
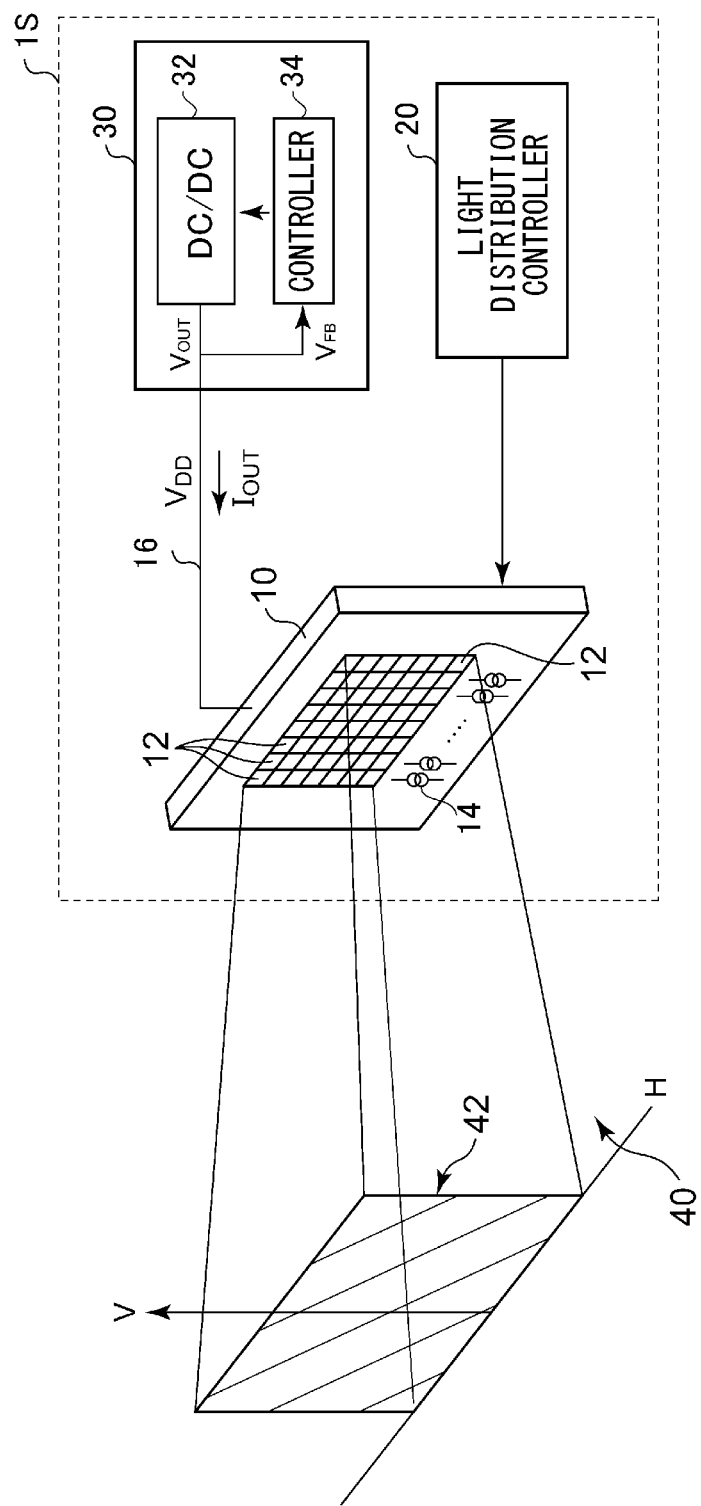
FIG. 2 is a block diagram of an ADB lamp using an LED array method.
Figure 3A:
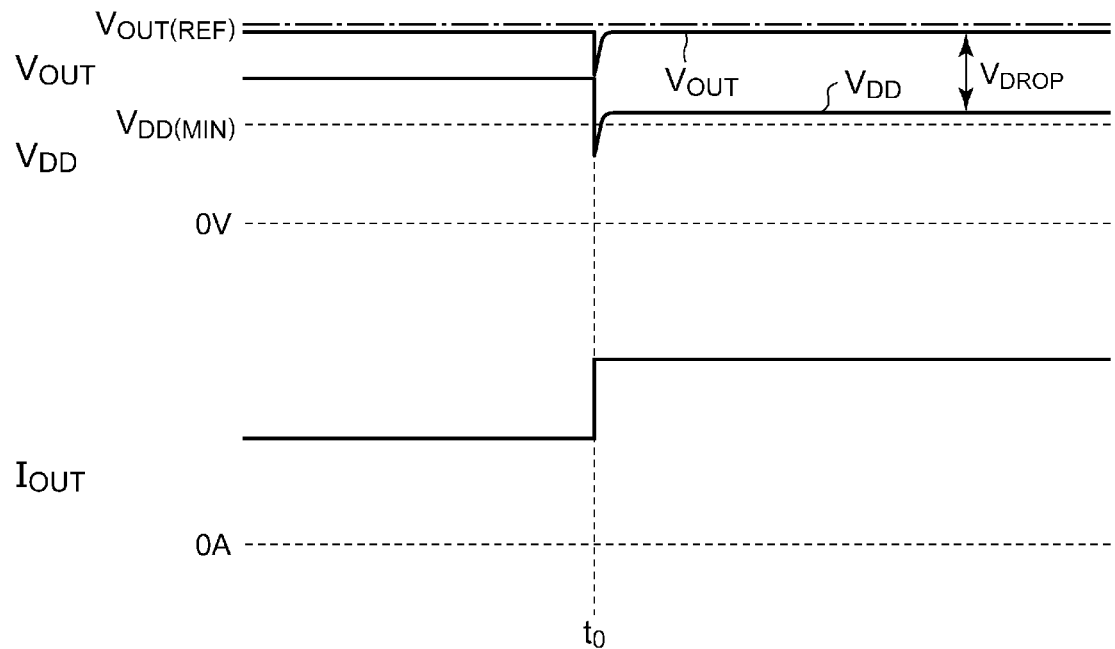
FIGS. 3A and 3B are operation waveform diagrams of the ADB lamp shown in FIG. 2.
Figure 3B:
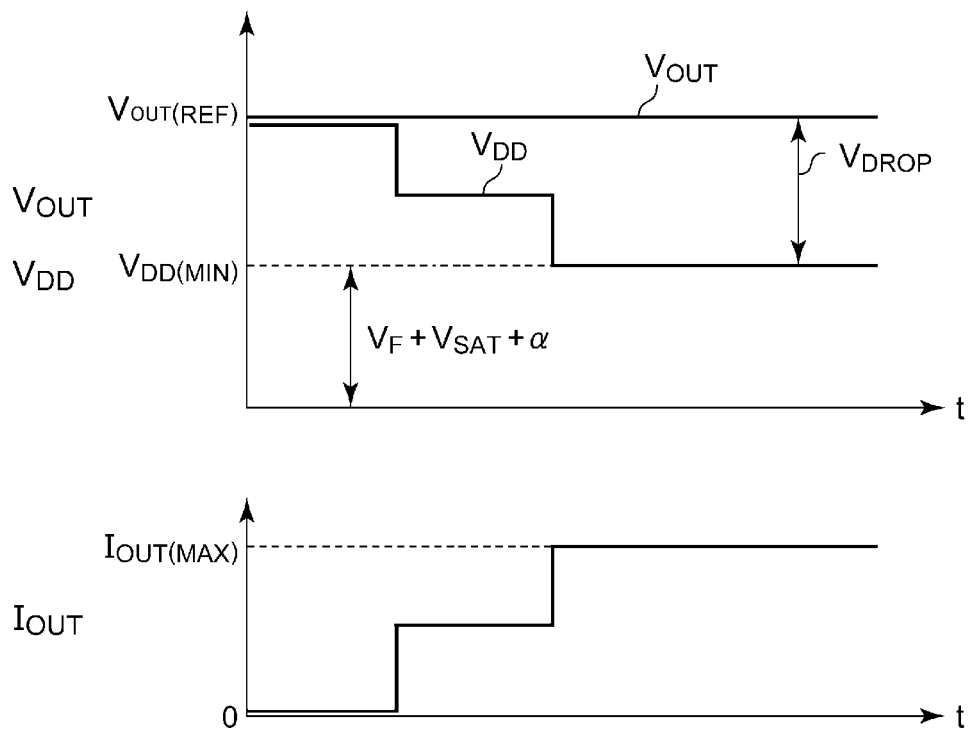

Description will be made regarding the outline of several exemplary embodiments of the present disclosure. The outline is a simplified explanation regarding several concepts of one or multiple embodiments as a preface to the detailed description described later in order to provide a basic understanding of the embodiments. That is to say, the outline described below is by no means intended to restrict the scope of the present invention and the present disclosure. Furthermore, the outline described below is by no means a comprehensive outline of all possible embodiments. That is to say, the outline is by no means intended to identify the indispensable or essential elements of all the embodiments, and is by no means intended to define the scope of a part of or all the embodiments. For convenience, in some cases, an "embodiment" as used in the present specification represents a single or multiple embodiments (examples and modifications) disclosed in the present specification.

1. A lamp system according to an embodiment includes: an array-type light-emitting device including multiple pixel circuits electrically coupled in parallel, and spatially arranged in a matrix; and a power supply circuit structured to supply electric power to the array-type light-emitting device. The power supply circuit includes: a DC/DC converter having an output coupled to the array-type light-emitting device via a power supply cable; and a power supply control circuit structured to set a target value according to a light distribution pattern, and to control the DC/DC converter such that a control target voltage approaches the target value.

The current that flows through the array-type light-emitting device changes according to the light distribution pattern. Accordingly, by dynamically and adaptively changing the target value of the control target voltage according to the light distribution pattern, this is capable of preventing the power supply voltage supplied to the array-type light-emitting device from becoming lower than the minimum operating voltage. Furthermore, this allows unnecessary power consumption to be reduced.

Also, the power supply control circuit may change the target value before the change of the light distribution pattern.

The lamp system according to an embodiment may further include a control unit structured to control the multiple pixel circuits according to the light distribution pattern. Also, the power supply control circuit may set the target value according to first data with respect to the light distribution pattern received from the control unit.

In an embodiment, the power supply control circuit may include: a voltage setting circuit structured to generate a correction voltage that corresponds to the light distribution pattern; a feedback circuit structured to generate a feedback voltage based on the control target voltage and the correction voltage; and a converter controller structured to receive the feedback voltage via a feedback pin thereof, and to control the DC/DC converter such that the feedback voltage approaches a predetermined reference voltage. In a case of employing a converter controller having an internal reference voltage that cannot be set by means of an external circuit, by shifting the feedback voltage according to the correction voltage, this is capable of setting the target value of the control target voltage.

In an embodiment, the voltage setting circuit may include: a microcontroller structured to generate a digital setting value that corresponds to the light distribution pattern; and a D/A converter structured to convert the setting value into the correction voltage in the form of an analog signal. With this, the target value of the control target voltage can be controlled in a software manner.

In an embodiment, the power supply control circuit includes: a voltage setting circuit structured to generate a reference signal that corresponds to the light distribution pattern; and a converter controller having a feedback pin structured to receive a feedback voltage that corresponds to the control target voltage and a reference voltage setting pin structured to receive the reference signal, and structured to control the DC/DC converter such that the feedback voltage approaches a reference voltage based on the reference signal. In a case of employing a converter controller having an internal reference voltage that can be controlled by means of an external circuit, by directly controlling the internal reference voltage of the converter controller according to data, this is capable of setting the target value of the control target voltage.

In an embodiment, the voltage setting circuit may include a microcontroller structured to generate a digital setting value that corresponds to the light distribution pattern. Also, the reference voltage may correspond to the setting value. With this, the target value of the control target voltage can be controlled in a software manner.

In an embodiment, the power supply circuit may further include a detection terminal to be coupled to a power supply terminal of the array-type light-emitting device via a detection line separate from the power supply cable. Also, the control target voltage may be a detection voltage that occurs at the detection terminal. With this configuration, a feedback loop is formed such that an appropriate power supply voltage is supplied to the power supply terminal of the array-type light-emitting device. Accordingly, this allows unnecessary power consumption to be reduced.

In an embodiment, the control target voltage may be an output voltage of the DC/DC converter. With this configuration, a feedback loop is formed such that the output voltage of the DC/DC converter approaches a target value. This allows a response speed required for the DC/DC converter to be reduced.

Also, the a-rray-type light-emitting device may be configured to generate second data with respect to voltage drops across multiple light-emitting elements included in the multiple pixel circuits, and to transmit the second data to an external circuit. Also, the power supply control circuit may set the target value based on the second data in addition to the light distribution pattern. By monitoring the voltage drop across the light-emitting elements that are actually operating, this allows the minimum operating voltage of the array-type light-emitting device to be accurately estimated. Furthermore, by feedback controlling the power supply circuit such that the feedback control reflects the voltage drops across the light-emitting elements in a real-time manner, this allows power consumption to be reduced.

2. A lamp system according to an embodiment includes: an array-type light-emitting device including multiple pixel circuits electrically coupled in parallel, and spatially arranged in a matrix; a power supply circuit structured to supply electric power to the array-type light-emitting device; and a coupling means including a power supply cable structured to couple the power supply circuit and the array-type light-emitting device. The power supply circuit includes: a DC/DC converter having an output coupled to the array-type light-emitting device via the power supply cable; and a power supply control circuit structured to acquire a voltage drop across the coupling means, to set a target value according to the voltage drop across the power supply cable, and to control the DC/DC converter such that an output voltage of the DC/DC converter approaches the target value.

By monitoring the voltage drop across the power supply cable, and dynamically and adaptively changing the target value of the output voltage according to the voltage drop, this is capable of preventing the power supply voltage supplied to the array-type light-emitting device from becoming lower than the minimum operating voltage. Furthermore, this allows unnecessary power consumption to be reduced.

In an embodiment, the power supply cable may include a power supply line that couples the positive output terminal of the DC/DC converter and the power supply terminal of the array-type light-emitting device. The power supply control circuit may sense the voltage drop across the power supply line. Also, the power supply control circuit may set a target value according to the voltage drop across the power supply line.

In an embodiment, the power supply cable may include a power supply line that couples the positive output terminal of the DC/DC converter and the power supply terminal of the array-type light-emitting device, and a ground line that couples the negative electrode output terminal of the DC/DC converter and the ground terminal of the array-type light-emitting device. The power supply control circuit may sense the voltage drop across the power supply line and the ground line. Also, the power supply control circuit may set a target value according to the voltage drop across the power supply line and the ground line.

In an embodiment, the power supply circuit may further include a current sensor structured to generate a current detection signal that corresponds to an output current of the DC/DC converter. Also, the power supply control circuit may set the target value according to the current detection signal.

In an embodiment, the power supply circuit may further include a detection terminal coupled to a power supply terminal of the array-type light-emitting device via a detection line separate from the power supply cable. Also, the power supply control circuit may sense the voltage drop across the coupling means based on a difference between an output voltage of the DC/DC converter and a detection voltage at the detection terminal.

In an embodiment, the power supply control circuit may include: a feedback circuit structured to generate a feedback voltage based on an output voltage of the DC/DC converter and a correction voltage that corresponds to the voltage drop across the coupling means; and a converter controller structured to receive the feedback voltage via a feedback pin, and to control the DC/DC converter such that the feedback voltage approaches a predetermined reference voltage.

In an embodiment, the power supply control circuit may include: a voltage setting circuit structured to generate a reference signal that corresponds to the voltage drop across the coupling means; and a converter controller including a feedback pin structured to receive a feedback voltage that corresponds to the output voltage and a reference voltage setting pin structured to receive the reference signal, and structured to control the DC/DC converter such that the feedback voltage approaches a reference voltage based on the reference signal.

3. A lamp system according to an embodiment includes: a variable light distribution light source including an array-type light-emitting device; and a power supply circuit structured to supply electric power to the array-type light-emitting device. The array-type light-emitting device includes multiple pixel circuits. The multiple pixel circuits are electrically coupled in parallel, spatially arranged in a matrix, and each include a light-emitting element and a current source coupled in series. The array-type light-emitting device is structured to generate data with respect to voltage drops across the multiple light-emitting elements included in the multiple pixel circuits, and to transmit the data to an external circuit. The power supply circuit includes: a DC/DC converter having an output coupled to the array-type light-emitting device via a power supply cable; and a power supply control circuit structured to control the DC/DC converter such that the control target voltage approaches a target value that corresponds to the data.

By monitoring the voltage drops across the light-emitting elements that are actually operating, this is capable of accurately estimating the minimum operating voltage of the array-type light-emitting device. With this, by feedback controlling the power supply circuit such that the feedback control reflects the voltage drops across the light-emitting elements in a real-time manner, this allows power consumption to be reduced.

In an embodiment, the target value may be designed based on the maximum value of voltage drops across the multiple light-emitting elements.

In an embodiment, the current control circuit may include: a voltage setting circuit structured to generate a correction voltage that corresponds to the data; a feedback circuit structured to generate a feedback voltage based on the control target voltage and the correction voltage; and a converter controller structured to receive the feedback voltage via a feedback pin, and to control the DC/DC converter such that the feedback voltage approaches a predetermined reference voltage. In a case of employing the converter controller having an internal reference voltage that cannot be set from an external circuit, by shifting the feedback voltage according to the correction voltage, this is capable of setting the target value of the control target voltage.

In an embodiment, the voltage setting circuit may include: a microcontroller structured to generate a digital setting value that corresponds to the data; and a D/A converter structured to convert the setting value into the correction voltage configured as an analog signal. With this, the target value of the control target voltage can be controlled in a software manner.

In an embodiment, the power supply control circuit may include: a voltage setting circuit structured to generate a setting signal that corresponds to the data; and a converter controller including a feedback pin structured to receive a feedback voltage that corresponds to the control target voltage and a reference voltage setting pin structured to receive the setting signal, and structured to control the DC/DC converter such that the feedback voltage approaches a reference voltage based on the reference signal. In a case of employing a converter controller having an internal reference voltage that can be controlled from an external circuit, by directly controlling an internal reference voltage of the converter controller according to the data, this is capable of setting the target value of the control target voltage.

In an embodiment, the voltage setting circuit may include a microcontroller structured to generate a digital setting value that corresponds to the data. Also, the reference voltage may correspond to the setting value. With this, the target value of the control target voltage can be controlled in a software manner.

In an embodiment, the power supply circuit may further include a detection terminal coupled to a power supply terminal of the array-type light-emitting device via a detection line separate from the power supply cable. The control target voltage may be a detection voltage that occurs at the detection terminal. With this configuration, a feedback loop is formed such that an appropriate power supply voltage is supplied to the power supply terminal of the array-type light-emitting device. Accordingly, this allows unnecessary power consumption to be reduced.

In an embodiment, the control target voltage may be an output voltage of the DC/DC converter. With this configuration, a feedback loop is formed such that the output voltage of the DC/DC converter approaches a target value. This allows a response speed required for the DC/DC converter to be reduced.

In an embodiment, the lamp system may further include a control unit coupled to an interface circuit of the array-type light-emitting device, and structured to control the on/off state of each of the multiple pixel circuits of the array-type light-emitting device. Also, the power supply control circuit may receive the data via the control unit.

In an embodiment, the microcontroller may acquire a difference between the control target voltage and the target value thereof based on the data. In a case in which the converter controller is not able to detect a situation in which the control target voltage deviates from the target value, by monitoring the difference between the control target voltage and the target value by the microcontroller, this is capable of detecting an abnormal state.

In an embodiment, when a difference between the control target voltage and the target value exceeds a predetermined threshold value, the microcontroller may judge that an abnormality has occurred.

In an embodiment, when the microcontroller has judged that an abnormality has occurred, the setting value may be fixed to a predetermined value. By setting the predetermined value to a high value, in an abnormal state, a high voltage is forcibly supplied to the array-type light-emitting device, thereby allowing the lighting-on state to be maintained.

In an embodiment, the microcontroller may store the history of the data. With such an arrangement in which the data is logged, such a log can be used by the vendor of the electronic device or the manufacturer of a device mounting such an electronic device to analyze a malfunction or to develop a new product. In particular, the voltage drops across the light-emitting elements are an important parameter that can be used as an index of efficiency or temperature. Accordingly, such logging is useful.

In an embodiment, the lamp system may further include a temperature sensor. Also, the microcontroller may store information with respect to the temperature sensed by the temperature sensor.

EMBODIMENTS

Description will be made below regarding preferred embodiments with reference to the drawings. In each drawing, the same or similar components, members, and processes are denoted by the same reference numerals, and redundant description thereof will be omitted as appropriate. The embodiments have been described for exemplary purposes only, and are by no means intended to restrict the present disclosure and the present invention. Also, it is not necessarily essential for the present disclosure and the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

In the present specification, the reference symbols denoting electric signals such as a voltage signal, current signal, or the like, and the reference symbols denoting circuit elements such as a resistor, capacitor, or the like, also represent the corresponding voltage value, current value, resistance value, or capacitance value as necessary.

Embodiment 1

Figure 4:
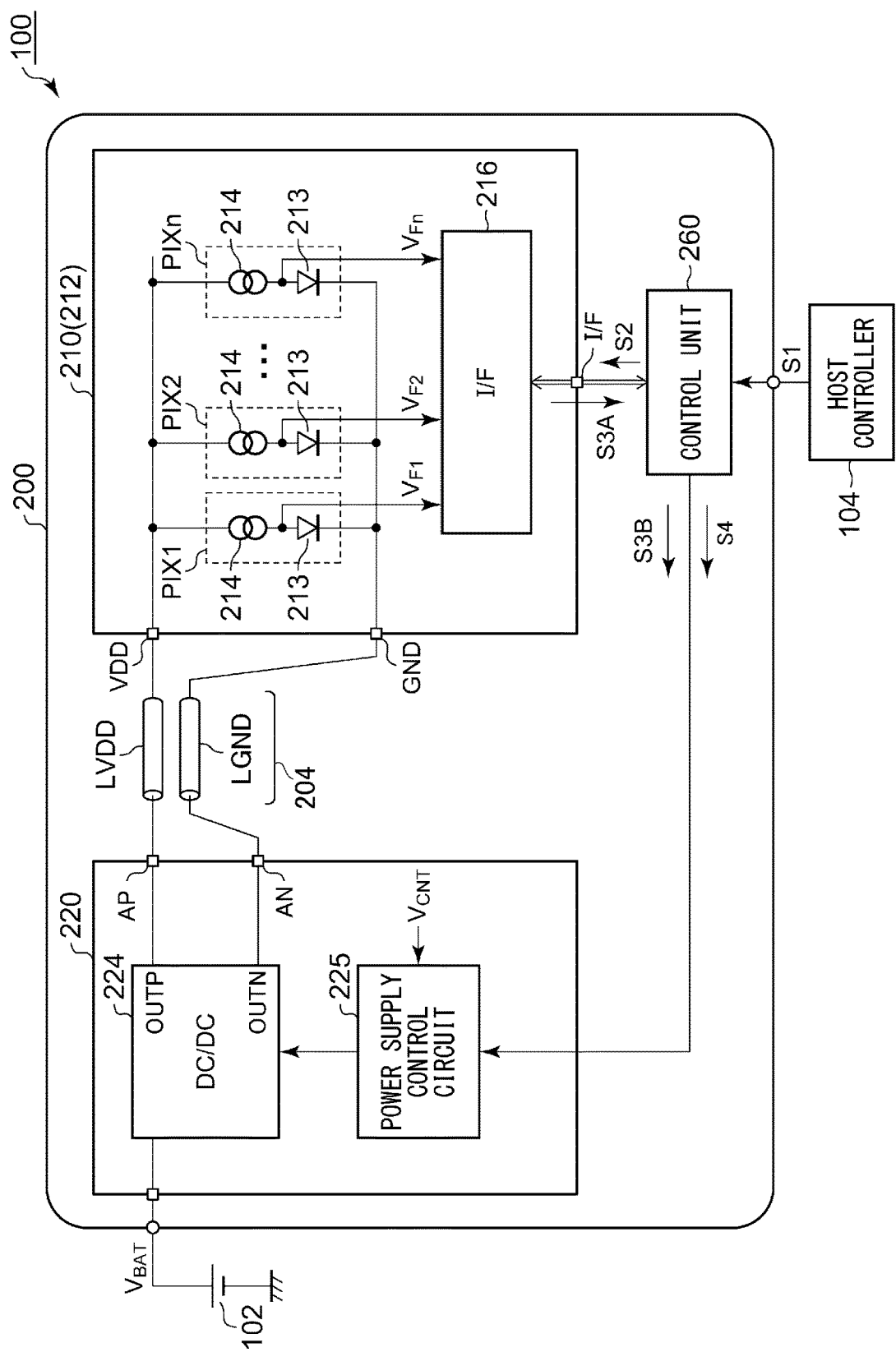
FIG. 4 is a block diagram showing a lamp system according to an embodiment 1.

FIG. 4 is a block diagram showing a lamp system 100 according to an embodiment 1. The lamp system 100 is configured as an ADB lamp system including a battery 102, a host controller 104, and a headlamp 200.

The host controller 104 generates a light distribution instruction for the headlamp 200. The light distribution instruction may include a lighting instruction and additional information. The lighting instruction may include a signal for specifying the on/off of the high beam or low beam. A basic light distribution to be formed by the headlamp 200 is determined according to the lighting instruction. On the other hand, the additional information may include data with respect to a region (shielded region) that should not be irradiated with the high beam and information with respect to the vehicle speed, steering angle, etc. The basic light distribution is modified according to the additional information, thereby determining the final light distribution. The host controller 104 may be configured as a vehicle-side ECU. Also, the host controller 104 may be configured as a lamp-side ECU built into the headlamp 200.

The headlamp 200 is configured as an ADB lamp including a variable light distribution light source 210, a power supply circuit 220, and a control unit 260.

The variable light distribution light source 210 is provided with multiple pixels arranged in an array, and is configured to be capable of independently controlling the on/off state of each pixel. In the headlamp 200, the on/off states of the multiple pixels are controlled so as to provide a desired light distribution.

More specifically, the variable light distribution light source 210 includes an array-type light-emitting device 212. The array-type light-emitting device 212 includes n pixel circuits PIX1 through PIXn and a power supply terminal VDD coupled to the multiple pixel circuits PIX1 through PIXn.

Each pixel circuit PIXj (1≤j≤n) includes a light-emitting element 213_j and a current source 214_j provided in series between the power supply terminal VDD and a ground terminal (ground line) GND. The multiple light-emitting elements 213_1 through 213_n are each configured as a semiconductor light-emitting element such as an LED, LD (semiconductor laser), organic EL element, or the like, and are spatially arranged in an array (in a matrix).

The multiple current sources 214_1 through 214_n are each configured to have independently controllable on/off states. When the j-th current source 214_j is turned on, the corresponding light-emitting element 213_j emits light. That is to say, the corresponding pixel circuit PIXj is set to the lighting-on state.

An interface circuit 216 controls the on/off states of the current sources 214_1 through 214_n according to a control signal S2 from the control unit 260. The interface circuit 216 is coupled to the control unit 260 via a high-speed serial interface, and receives the control signal S2 for specifying the on/off states of all the pixels.

The power supply circuit 220 supplies electric power to the variable light distribution light source 210. The power supply circuit 220 includes a converter for outputting a constant voltage. The power supply circuit 220 supplies the stabilized power supply voltage $V_{DD}$ to the power supply terminal VDD of the array-type light-emitting device 212. The power supply voltage $V_{DD}$ is determined based on $V_F + V_{SAT}$. Typically, the power supply voltage $V_{DD}$ is set to on the order of 4 to 5 V. Here, $V_F$ represents the forward voltage of the light-emitting element 213, and $V_{SAT}$ represents the minimum operating voltage of the current source 214. Accordingly, the power supply circuit 220 may be configured as a step-down converter (Buck converter) that steps down a battery voltage $V_{BAT}$ on the order of 12 V (or 24 V).

The control unit 260 receives a light distribution instruction S1 from the host controller 104, generates a control signal S2 that corresponds to the light distribution instruction S1, and transmits the control signal S2 to the variable light distribution light source 210. The control unit 260 will also be referred to as a "drawing ECU". For example, the control unit 260 PWM-controls the multiple pixel circuits PIX1 through PIXn of the array-type light-emitting device 212 so as to control the light distribution. A PWM frequency of several hundred Hz (e.g., 100 to 400 Hz) is employed. Accordingly, the PWM cycle is set to several milliseconds to several dozen milliseconds (ms).

Next, description will be made regarding a configuration of the power supply circuit 220. The power supply circuit 220 includes output terminals AP/AN, a ground terminal GND, a DC/DC converter 224, and a power supply control circuit 225.

The output terminals AP/AN are coupled to the power supply terminal VDD and the ground terminal GND of the array-type light-emitting device 212 via a power supply cable 204. The power supply cable 204 includes a power supply line LVDD and a ground line LGND. The positive electrode output OUTP of the DC/DC converter 224 is coupled to the power supply terminal VDD of the array-type light-emitting device 212 via the output terminal AP and the power supply line LVDD. The negative electrode output OUTN of the DC/DC converter 224 is coupled to the ground terminal GND of the array-type light-emitting device 212 via the output terminal AN and the ground line LGND. The voltage $V_{BAT}$ is supplied to the input of the DC/DC converter 224 from the battery.

The power supply control circuit 225 sets a target value $V_{CNT(REF)}$ of the control target voltage $V_{CNT}$ according to a light distribution pattern. The power supply control circuit 225 controls the DC/DC converter 224 such that the control target voltage $V_{CNT}$ approaches the target value $V_{CNT(REF)}$. For example, the power supply control circuit 225 receives data S4 including information with respect to the light distribution from the control unit 260.

Also, the control target voltage $V_{CNT}$ may be the power supply voltage $V_{DD}$ of the array-type light-emitting device 212. Also, the control target voltage $V_{CNT}$ may be the output voltage $V_{OUT}$ of the DC/DC converter 224. Detailed description thereof will be made later.

The above is the configuration of the lamp system 100. The present disclosure encompasses various kinds of apparatuses and circuits that can be regarded as a circuit configuration shown as the block diagram or circuit diagram in FIG. 4 or otherwise that can be obtained from the aforementioned description. That is to say, the present disclosure is not restricted to a specific configuration. More specific description will be made below regarding an example configuration for clarification and ease of understanding of the essence and the operation of the present invention. That is to say, the following description will by no means be intended to restrict the technical scope of the present invention.

Next, description will be made regarding the operation of the lamp system 100 with reference to several examples of control.

Control Example 1

Figure 5:
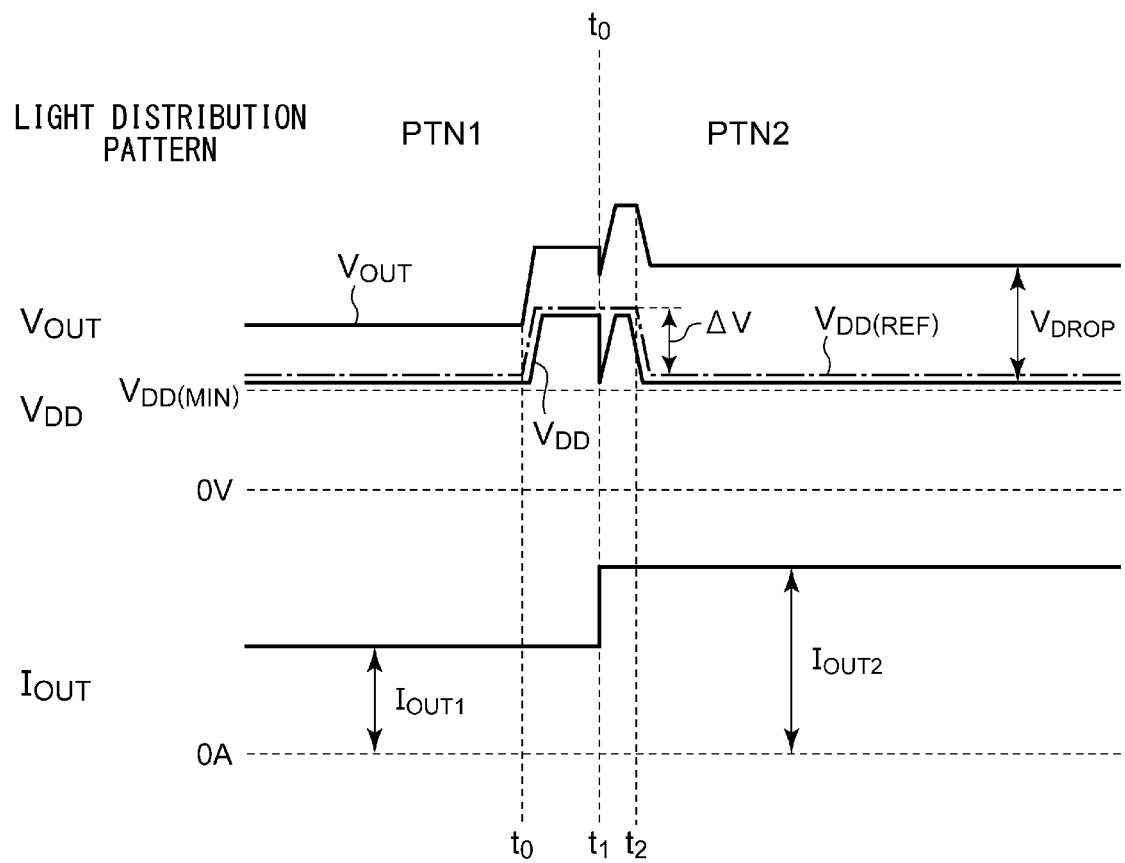
FIG. 5 is a diagram showing the operation of the lamp system shown in FIG. 4 according to an example control 1.

FIG. 5 is a diagram showing the operation of a control example 1 of the lamp system 100 shown in FIG. 4. Description will be made regarding the control example 1 assuming that the control target voltage $V_{CNT}$ is the power supply voltage $V_{DD}$ of the array-type light-emitting device 212, and the power supply control circuit 225 controls the target value $V_{DD(REF)}$ of the power supply voltage $V_{DD}$ according to the light distribution pattern.

Description will be made regarding a situation in which the light distribution pattern is changed from a first pattern PTN1 to a second pattern PTN2 at the time point $t_1$, and the current $I_{OUT2}$ of the second pattern PTN2 is larger than the current $I_{OUT}$ of the first pattern PTN1. For example, the first pattern PTN1 is used as a town-mode light distribution pattern in which the low-beam region is illuminated. The second pattern PTN2 is used as an active-mode light distribution in which the high-beam region is also illuminated. Accordingly, the second pattern PTN2 is designed with a relatively large number of lighting-on pixels, thereby involving a relatively large output current $I_{OUT}$.

In a steady state, the target value $V_{DD(REF)}$ of the power supply voltage $V_{DD}$ is set to on the order of the minimum operating voltage $V_{DD(MIN)}$.

Before the switching of the light distribution pattern PTN, i.e., at the time point to before the timing at which the current $I_{OUT}$ is increased, the power supply control circuit 225 increases the target value $V_{DD(REF)}$ of the power supply voltage $V_{DD}$ by $\Delta V$. The power supply voltage $V_{DD}$ rises according to the target value $V_{DD(REF)}$ of the power supply voltage $V_{DD}$. The amount of increase $\Delta V$ of the target value may preferably be determined based on the amount of decrease in a spike-shaped voltage drop across the power supply voltage $V_{DD}$ accompanying the change in current. The timing to at which the target value $V_{DD(REF)}$ is to be increased may be supplied from the control unit 260.

When the light distribution pattern PTN is switched at the time point $t_1$, the current $I_{OUT}$ increases. As a result, the power supply voltage $V_{DD}$ instantly drops due to the response delay in the power supply control circuit 225, leading to increased error between the power supply voltage $V_{DD}$ and the target value $V_{DD(REF)}$. Subsequently, the power supply voltage $V_{DD}$ returns to the target value $V_{DD(REF)}$.

At the time point $t_2$, the power supply control circuit 225 returns the target value $V_{DD(REF)}$ to the original voltage level. The power supply voltage $V_{DD}$ drops to the original voltage level following the target value $V_{DD(REF)}$.

It should be noted that, in the control example 1, the output voltage $V_{OUT}$ of the DC/DC converter 224 changes according to $V_{OUT}=V_{DD}+V_{DROP}$. Here, $V_{DROP}$ represents the voltage drop across the power supply line LVDD or a connector. Specifically, $V_{DROP}$ is represented by $V_{DROP}=I_{OUT} \times R$.

The above is the operation of the control example 1. With this control example in which the target voltage $V_{DD(REF)}$ of the power supply voltage $V_{DD}$ is increased by $\Delta V$ before the change of the light distribution pattern, such an arrangement is capable of maintaining the power supply voltage $V_{DD}$ such that it is higher than the minimum operating voltage $V_{DD(MIN)}$, thereby preventing flickering.

Control Example 2

Figure 6:
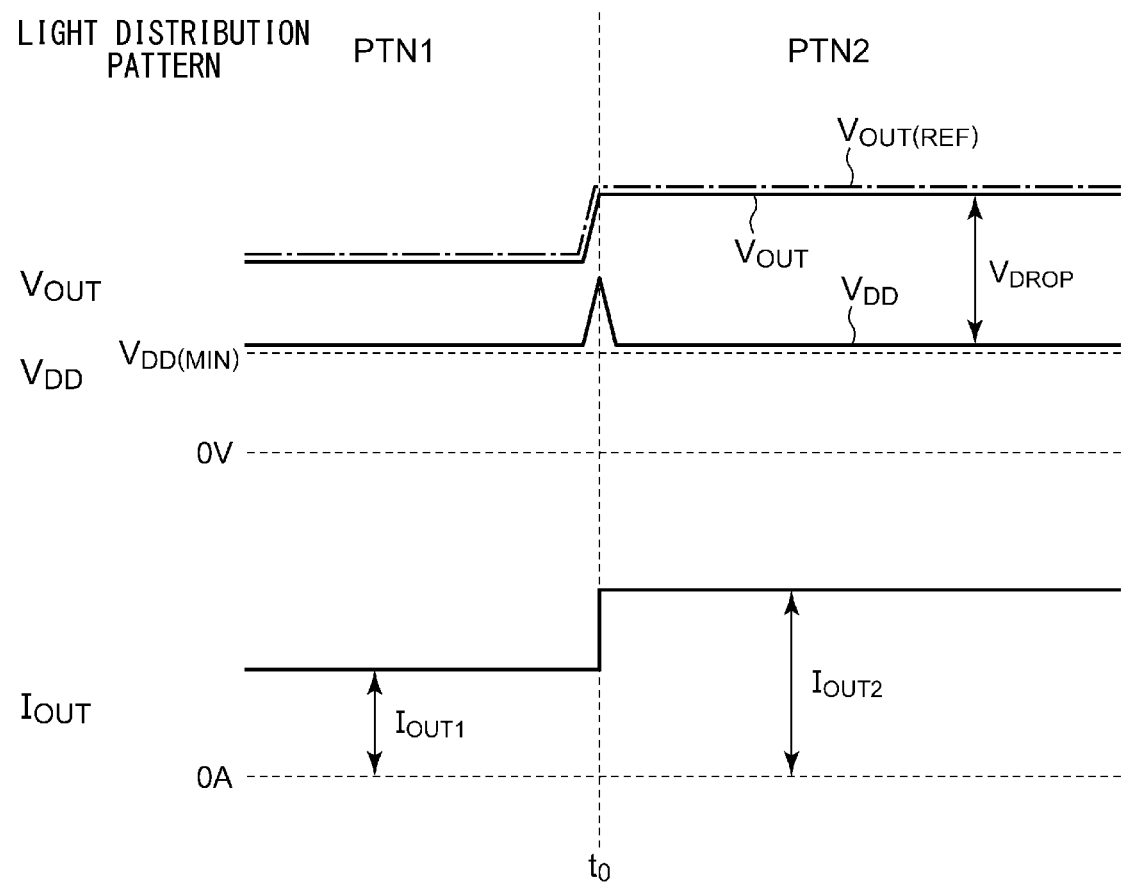
FIG. 6 is a diagram showing the operation of the lamp system shown in FIG. 4 according to an example control 2.

FIG. 6 is a diagram showing the operation according to a control example 2 of the lamp system 100 shown in FIG. 4. In the control example 2, the output voltage $V_{OUT}$ of the DC/DC converter 224 is employed as the control target voltage $V_{CNT}$. Specifically, the power supply control circuit 225 controls the target value $V_{OUT(REF)}$ of the output voltage $V_{OUT}$ according to the light distribution pattern. In the control example 2, description will be made assuming that the power supply control circuit 225 has a sufficiently high response speed such that the output voltage $V_{OUT}$ can be maintained at a constant level even if a sudden change occurs in the output current $I_{OUT}$.

The power supply control circuit 225 sets the target value $V_{OUT(REF)\#}$ based on the current amount $I_{OUT\#}$ for the light distribution pattern PTN #. The target value for each light distribution pattern is represented by the following Expression (A).

$$V_{OUT(REF)\#} = V_{DD(MIN)} + R \times I_{OUT\#} \quad (A)$$

The above is the operation according to the control example 2. With this control example, i.e., with such an arrangement in which the output voltage $V_{OUT}$ is employed as the control target voltage $V_{CNT}$, by setting the target value $V_{OUT(REF)}$ according to the output current $I_{OUT}$, such an arrangement is capable of maintaining the power supply voltage $V_{DD}$ in the vicinity of the minimum operating voltage $V_{DD(MIN)}$. This allows unnecessary power consumption to be reduced.

Control Example 3

In the control example 3, as with the control example 2, the control target voltage $V_{CNT}$ is the output voltage $V_{OUT}$ of the DC/DC converter 224. In the control example 3, as with the control example 2, the target value $V_{OUT(REF)}$ is set based on the Expression (A). In addition, in the control example 3, as with the control example 1, in a case in which the light distribution pattern is switched with a sudden change in current, the target value $V_{OUT(REF)}$ is increased by a predetermined amount $\Delta V$ before the switching of the light distribution pattern.

With the control example 3, even in a case in which the power supply control circuit 225 operates with a slow response speed, this allows flickering to be prevented.

Control Example 4

In the control example 4, as with the control example 2, the control target voltage $V_{CNT}$ is the output voltage $V_{OUT}$ of the DC/DC converter 224. In the control example 4, instead of setting the target value $V_{OUT(REF)}$ based on Expression (A), in the same manner as in the control example 1, in a case in which the light distribution pattern is to be switched with a sudden change of current, the target value $V_{OUT(REF)}$ is increased by a predetermined amount $\Delta V$ before the switching of the light distribution pattern.

With the example 4, even in a case in which the power supply control circuit 225 operates with a slow response speed, this allows flickering to be prevented.

Control Based on Device Information

Returning to FIG. 4, the lamp system 100 may be provided with the following features.

The interface circuit 216 of the array-type light-emitting device 212 is configured to monitor voltage drops (i.e., forward voltages) $V_{F1}$ through $V_{Fn}$ across the light-emitting elements 213 of the multiple respective pixel circuits PIX1 through PIXn, and to generate data S3A including information with respect to the forward voltages $V_{F1}$ through $V_{Fn}$. In the present embodiment, the data S3A is transmitted as the data S3B to the power supply circuit 220 via the control unit 260.

The power supply control circuit 225 adjusts the data S3B such that it reflects the target value $V_{CNT(REF)}$ of the control target voltage $V_{CNT}$. The target value $V_{CNT(REF)}$ of the control target voltage $V_{CNT}$ may correspond to the maximum value $V_{F(MAX)}$ of the forward voltages $V_{F1}$ through $V_{Fn}$ of the light-emitting elements 213 for all the channels. For example, the data S3B to be received by the power supply control circuit 225 may include the forward voltages $V_{F1}$ through $V_{Fn}$ of all the channels. In this case, the power supply control circuit 225 may sense the maximum value $V_{F(MAX)}$ of the forward voltages $V_{F1}$ through $V_{Fn}$, and may generate the target value $V_{CNT(REF)}$ based on the maximum value $V_{F(MAX)}$. Alternatively, an arrangement may be made in which the control unit 260 senses the maximum value $V_{F(MAX)}$ of the forward voltages $V_{F1}$ through $V_{Fn}$, and the data S3B including the maximum value $V_{F(MAX)}$ is transmitted to the power supply control circuit 225.

Figure 7A:
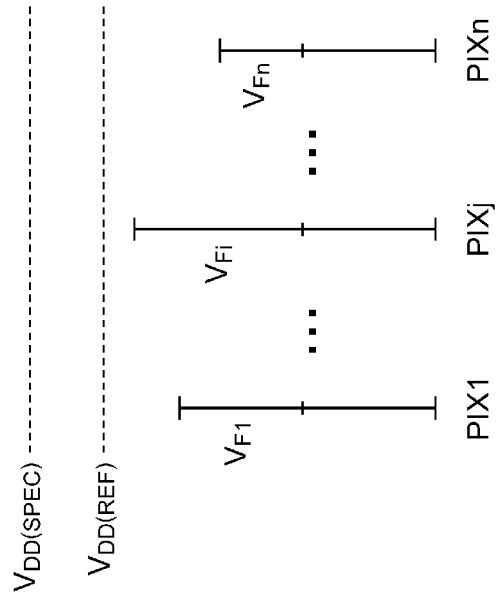
FIGS. 7A and 7B are diagrams for explaining control of a target value based on the forward voltage $V_F$.
Figure 7B:
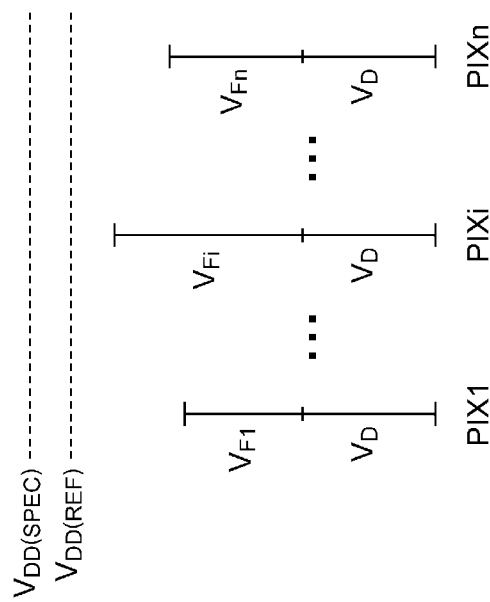

FIGS. 7A and 7B are diagrams for explaining the control of the target value based on the forward voltage $V_F$. FIGS. 7A and 7B show the operations of different individual lamp systems 100. FIG. 7A shows the operation in a case in which the forward voltage $V_{Fi}$ of the i-th pixel PIXi of the array-type light-emitting device 212 is the maximum value $V_{F(MAX)}$. The target value $V_{DD(REF)}$ of the power supply voltage $V_{DD}$ employed as the control target voltage $V_{CNT}$ may be determined based on $V_{DD}(REF)=V_D+V_{Fi(MAX)}+\alpha$. Here, $V_D$ represents the voltage drop across the current source 214, and $\alpha$ represents a margin.

FIG. 7B shows the operation in a case in which the forward voltage $V_{Fj}$ of the j-th pixel PIXj of the array-type light-emitting device 212 is the maximum value $V_{F(MAX)}$. The target value $V_{DD(REF)}$ of the power supply voltage $V_{DD}$ employed as the control target voltage $V_{CNT}$ is determined based on $V_{DD(REF)}=V_D+V_{Fj}+\alpha$.

As shown in FIGS. 7A and 7B, with such an arrangement in which the target value $V_{DD(REF)}$ is determined using the forward voltages $V_F$ measured for each actual product, this allows the power supply voltage $V_{DD}$ to be reduced such that it is lower than the value $V_{DD(SPEC)}$ defined in the specification. This allows the power consumption of the array-type light-emitting device 212 to be reduced.

Figure 8:
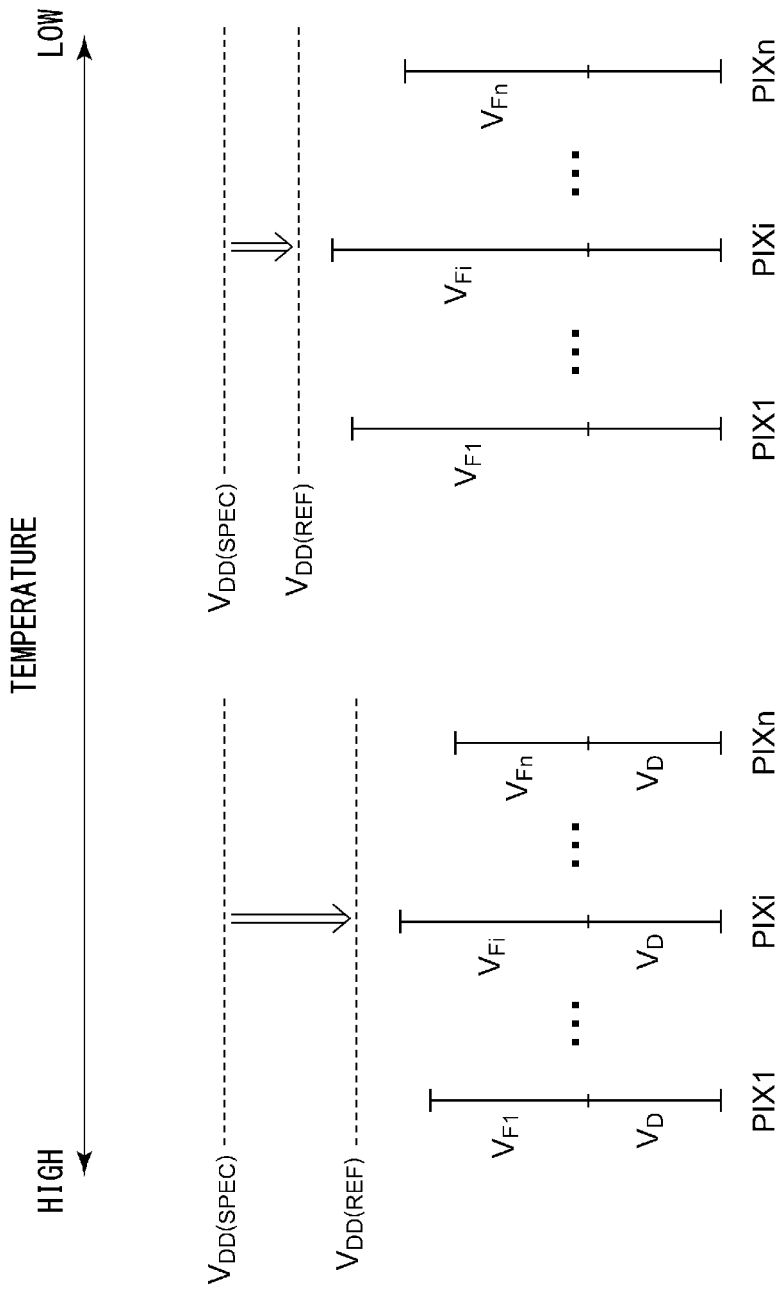
FIG. 8 is a diagram showing the operation of a lamp system.

FIG. 8 is a diagram showing the operation of the lamp system 100. FIG. 8 shows the operations of a single lamp system 100 in different temperature environments. The forward voltage $V_F$ of the LED has temperature dependence.

Specifically, as the temperature becomes higher, the forward voltage $V_F$ of the LED becomes smaller. With the present embodiment, such an arrangement is capable of adaptively setting the target value $V_{DD(REF)}$ of the control target voltage $V_{DD}$ according to the temperature, thereby allowing power consumption to be reduced.

The above is the control based on the device information. With the lamp system 100, the information with respect to the voltage drop $V_F$ included in the data S3B is modified in a real-time manner such that it is reflected in the feedback control of the power supply circuit 220, thereby allowing the power consumption to be reduced. Specifically, by monitoring the forward voltage $V_F$ of each light-emitting element 213 in actual operation, such an arrangement is capable of accurately estimating the actual minimum operating voltage $V_{DD(MIN)}$ of the array-type light-emitting device 212. The minimum operating voltage $V_{DD(MIN)}$ thus estimated reflects individual variation or temperature variation of the array-type light-emitting device 212. Specifically, the minimum operating voltage $V_{DD(MIN)}$ thus estimated is lower than the value $V_{DD(SPEC)}$ defined in the specification. Accordingly, by dynamically determining the operating conditions of the power supply circuit 220 based on the minimum accurate operating voltage $V_{DD(MIN)}$, this allows the power supply voltage $V_{DD}$ supplied to the array-type light-emitting device 212 to be reduced, thereby allowing the power consumption to be reduced.

Next, description will be made regarding specific example configurations of the headlamp 200. In the following description, description of the control of the target value based on the data S3 with respect to the forward voltages $V_F$ will be omitted.

Example 1.1

Figure 9:
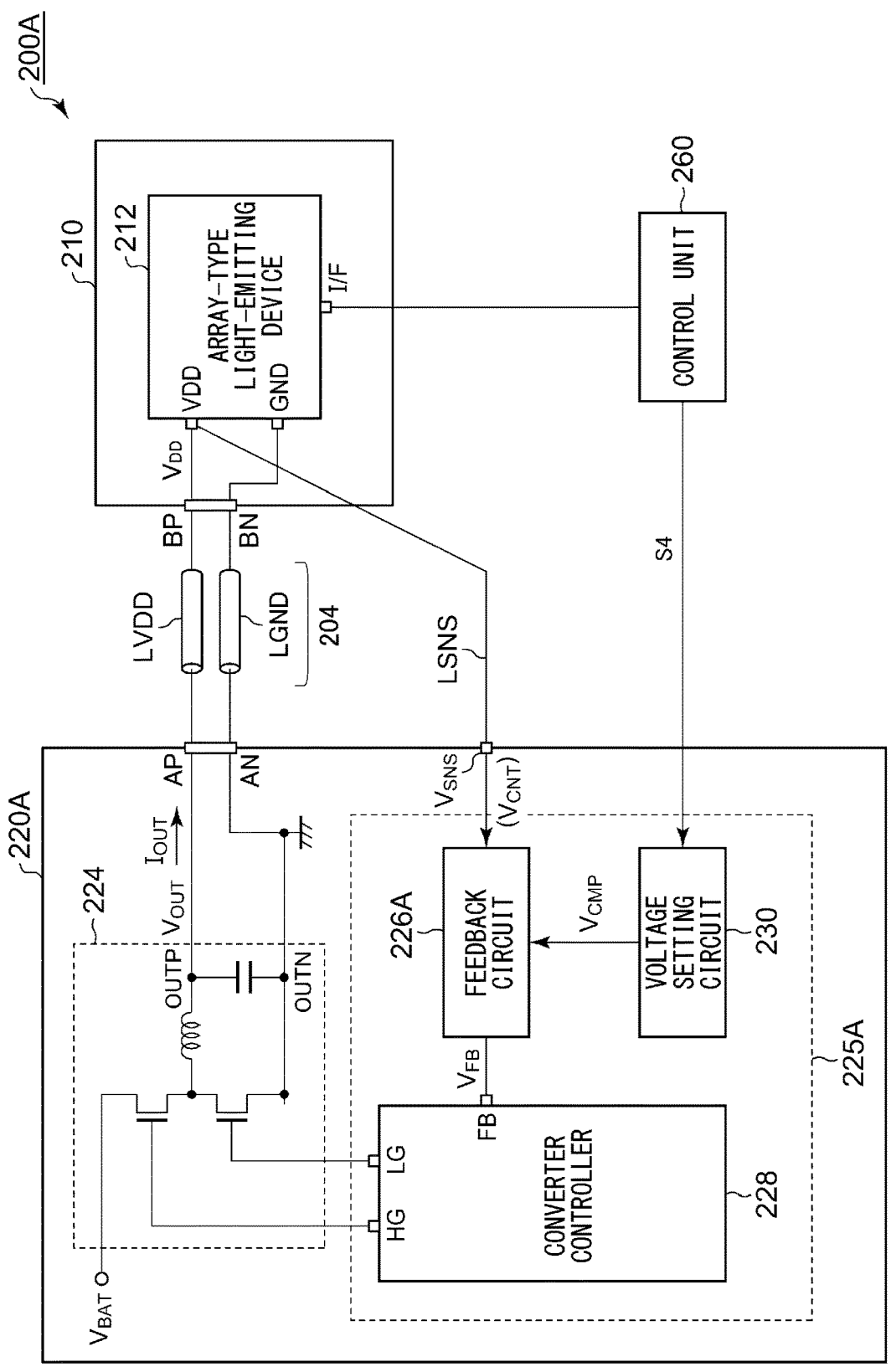
FIG. 9 is a block diagram showing a headlamp according to an example 1.1.

FIG. 9 is a block diagram showing a headlamp 200A according to an example 1.1. The headlamp 200A includes a variable light distribution light source 210, a power supply circuit 220A, and a control unit 260.

The power supply circuit 220A includes an output terminal OUT, a detection terminal SNS, a DC/DC converter 224, and a power supply control circuit 225A. The power supply control circuit 225A includes a feedback circuit 226A, a converter controller 228, and a voltage setting circuit 230.

As the converter controller 228, a commercially available DC/DC converter control integrated circuit (IC) may be employed. The converter controller 228 generates a pulse signal where at least one from among the pulse width, frequency, and duty cycle is controllable, that is adjusted such that the feedback voltage $V_{FB}$ input to the feedback pin FB approaches the internally generated reference voltage $V_{REF}$. With this, the converter controller 228 feedback controls the DC/DC converter 224 according to the pulse signal.

The voltage setting circuit 230 receives, as its input, data S4 generated by the array-type light-emitting device 212. The voltage setting circuit 230 generates a correction voltage $V_{CMP}$ based on the data S4 thus received. The feedback circuit 226A generates the feedback voltage $V_{FB}$ based on the correction voltage $V_{CMP}$ and a control target voltage $V_{CNT}$ that corresponds to the output voltage $V_{OUT}$ of the DC/DC converter 224, and supplies the feedback voltage $V_{FB}$ to the feedback pin FB of the converter controller 228. The feedback voltage $V_{FB}$ is a signal that changes according to each of the control target voltage $V_{CNT}$ and the correction voltage $V_{CMP}$. The feedback voltage $V_{FB}$ is represented by the following Expression (1).

$$V_{FB}=K_1 \cdot V_{CNT}+K_2 \cdot V_{CMP} \quad (1)$$

Here, $K_1$ is a constant that is larger than 0, and $K_2$ is a non-zero constant. Description will be made assuming that $K_2<0$. The converter controller 228 controls the DC/DC converter 224 such that the feedback signal $V_{FB}$ approaches the target value $V_{REF}$.

In a steady state in which the system is stabilized, the relation $K_1 \cdot V_{CNT}+K_2 \cdot V_{CMP}=V_{REF}$ holds true. Accordingly, in the steady state, the control target voltage $V_{CNT}$ is stabilized to the target value $V_{CNT(REF)}$.

$$V_{CNT(REF)}=(V_{REF}-K_2 \cdot V_{CMP})/K_1 \quad (2)$$

In the example 1.1, as the control target voltage $V_{CNT}$, the voltage $V_{DD}$ at the power supply terminal VDD of the array-type light-emitting device 212 is employed.

The detection terminal SNS of the power supply circuit 220A is coupled to the power supply terminal VDD of the array-type light-emitting device 212 via a detection line (single-signal line) separate from the power supply cable 204 (power supply line LVDD). The feedback circuit 226A has a sufficiently high input impedance. Accordingly, no current flows through the detection line LSNS. Accordingly, the detection voltage $V_{SNS}$ is equal to the voltage $V_{DD}$ at the power supply terminal VDD of the array-type light-emitting device 212. The detection voltage $V_{SNS}$ that occurs at the detection terminal SNS is input to the feedback circuit 226A as the control target voltage $V_{CNT}$. Accordingly, the target voltage $V_{DD(REF)}$ of the power supply voltage $V_{DD}$ is represented by the following Expression (3).

$$V_{DD(REF)}=(V_{REF}-K_2 \cdot V_{CMP})/K_1 \quad (3)$$

That is to say, by changing the correction voltage $V_{CMP}$ according to the data S4, this is capable of changing the target value $V_{DD(REF)}$ of the power supply voltage $V_{DD}$.

Figure 10:
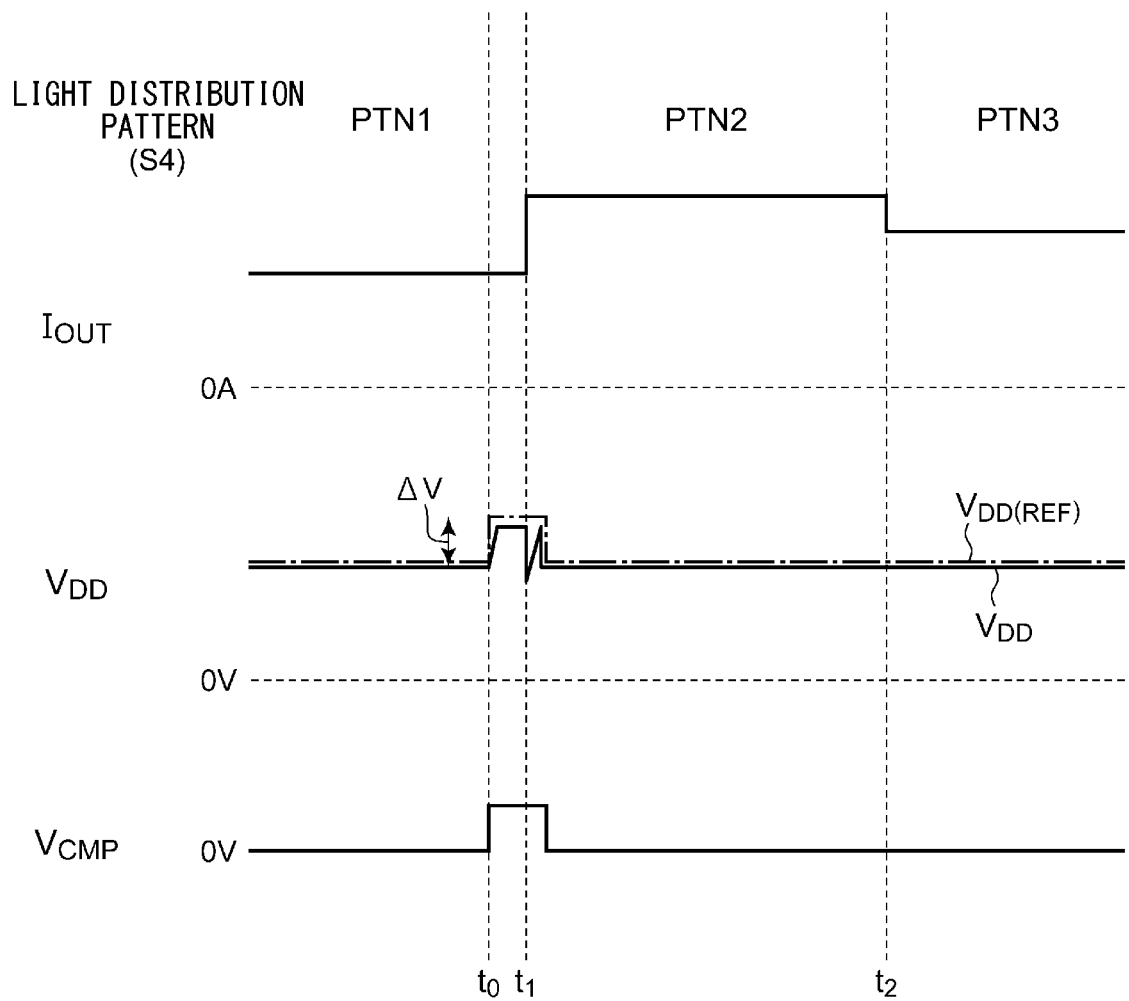
FIG. 10 is an operation waveform diagram of the headlamp shown in FIG. 9.

The above is the configuration of the headlamp 200A. Next, description will be made regarding the operation thereof. FIG. 10 is an operation waveform diagram of the headlamp 200A shown in FIG. 9. This operation corresponds to the control example 1 described above.

In a steady state, the correction voltage $V_{CMP}$ is set to a steady value (0 V, in this example). At the time point $t_1$, an instruction is made to switch the light distribution pattern PTN1 to PTN2. At the time point $t_0$ before the switching of the light distribution pattern, the voltage setting circuit 230 increases the correction voltage $V_{CMP}$. As a result, this is capable of shifting the target value $V_{DD(REF)}$ represented by Expression (3) toward the high-voltage side. Subsequently, the voltage setting circuit 230 returns the correction voltage $V_{CMP}$ to the steady value.

At the time point $t_2$, the light distribution pattern is switched with a decrease in the current $I_{OUT}$. In this case, the voltage setting circuit 230 may preferably maintain the correction voltage $V_{CMP}$ at the steady value.

The above is the operation of the headlamp 200A. With the headlamp 200A, by changing the correction voltage $V_{CMP}$ based on the data S4, such an arrangement is capable of dynamically controlling the target value $V_{DD(REF)}$ of the voltage $V_{DD}$ at the power supply terminal VDD of the array-type light-emitting device 212.

Next, description will be made regarding example configurations of the voltage setting circuit 230 and the feedback circuit 226A.

Figure 11:
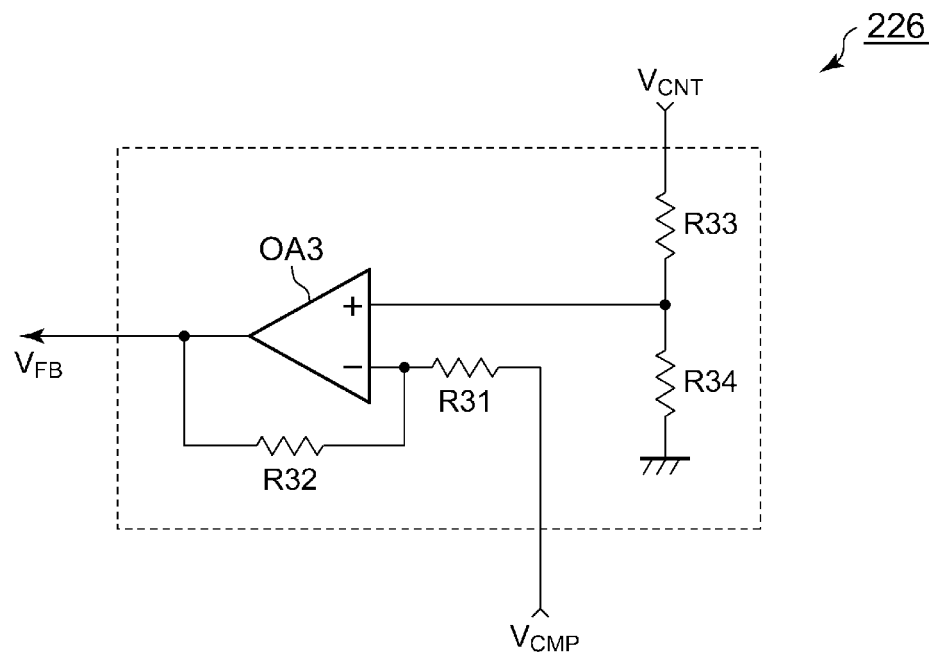
FIG. 11 is a circuit diagram showing an example configuration of a feedback circuit.

FIG. 11 is a circuit diagram showing an example configuration of the feedback circuit 226A. The feedback circuit 226A is configured as a subtraction circuit including an operational amplifier. Specifically, the feedback circuit 226A includes resistors R31 through R34 and an operational amplifier OA3. The input/output characteristics of the feedback circuit 226A are represented by the following Expression (5).

$$V_{FB}=(R31+R32)/R31 \times \{R34/(R33+R34) \times V_{CNT}-R32/(R31+R32) \times V_{CMP}\} \quad (5)$$

In contrast to Expressions (1) and (5), the following expressions can be obtained.

$$K_1=(R31+R32)/R31 \times R34/(R33+R34)$$

$$K_2=-(R31+R32)/R31 \times R32/(R31+R32)$$

It should be noted that the feedback circuit 226A may be configured as an adder circuit employing an operational amplifier. In this case, $K_1>0$ and $K_2>0$ hold true. In a case in which the correction voltage $V_{CMP}$ is a positive value, the target value of the control target voltage $V_{CNT}$ can be shifted toward the low electric potential side according to the correction voltage $V_{CMP}$.

Figure 12:
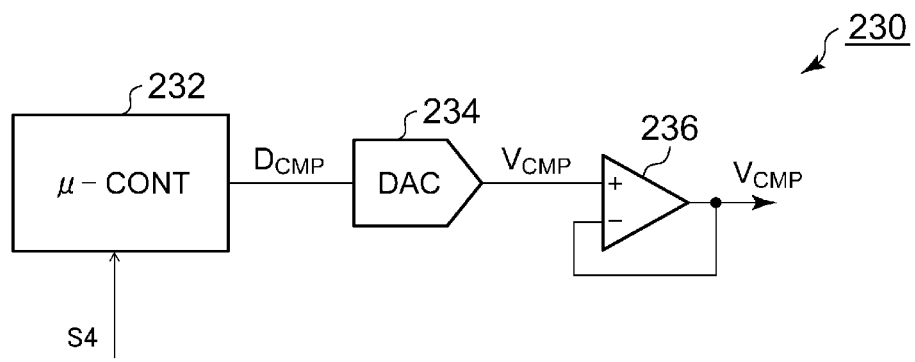
FIG. 12 is a circuit diagram showing an example configuration of a voltage setting circuit.

FIG. 12 is a circuit diagram showing an example configuration of the voltage setting circuit 230. The voltage setting circuit 230 includes a microcontroller 240, a D/A converter 234, and a buffer 236. The microcontroller 240 generates a digital setting value $D_{CMP}$ for specifying the correction voltage $V_{CMP}$ according to the data S4 with respect to the forward voltage $V_F$ of each light-emitting element 213. By employing the microcontroller 240, such an arrangement allows the correction voltage $V_{CMP}$ to be controlled by software.

The D/A converter 234 converts the setting value $D_{CMP}$ generated by the microcontroller 240 into an analog correction voltage $V_{CMP}$. The correction voltage $V_{CMP}$ is supplied to the feedback circuit 226A via the buffer 236. It should be noted that, in a case in which the D/A converter 234 has a sufficiently low output impedance, the buffer 236 may be omitted. Also, in a case of employing the microcontroller 240 including the D/A converter as a built-in component, the D/A converter 234 is provided as an internal component of the microcontroller 240.

Example 1.2

Figure 13:
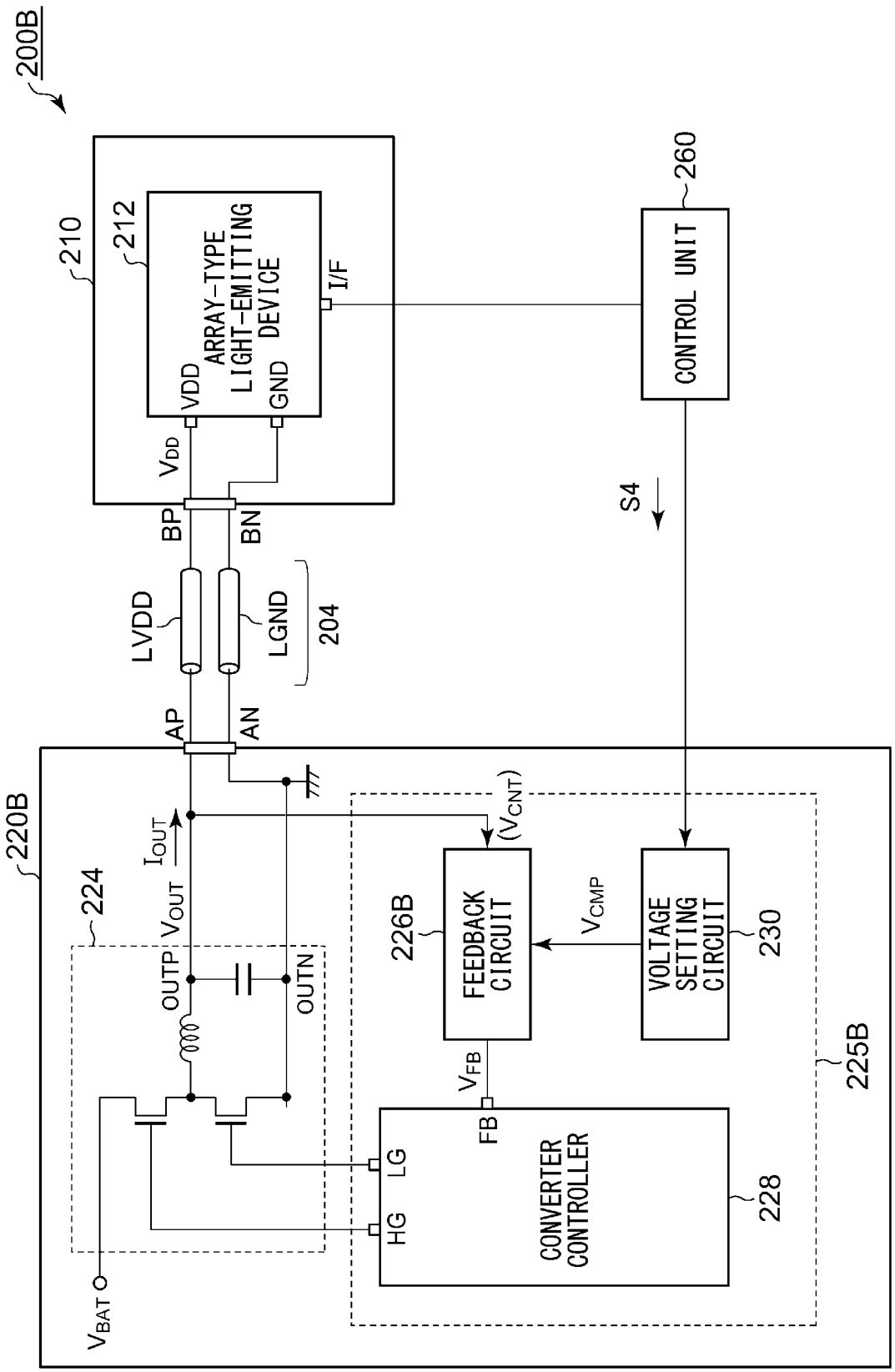
FIG. 13 is a block diagram showing a headlamp according to an example 1.2.

FIG. 13 is a block diagram showing a headlamp 200B according to an example 1.2. Description will be made regarding the configuration of the headlamp 200B directing attention to the points of difference from the example 1.1. The headlamp 200B includes a variable light distribution light source 210, a power supply circuit 220B, and a control unit 260. In the example 1.2, the power supply circuit 220B has a configuration that differs from that of the power supply circuit 220A according to the example 1.1.

The power supply circuit 220B includes an output terminal OUT, a DC/DC converter 224, and a power supply control circuit 225B. The power supply control circuit 225B includes a feedback circuit 226B, a converter controller 228, and a voltage setting circuit 230.

In the example 1.2, the output voltage $V_{OUT}$ of the DC/DC converter 224 is employed as the control target voltage $V_{CNT}$. The output voltage $V_{OUT}$ that occurs at the output terminal OUT is input as the control target voltage $V_{CNT}$ to the feedback circuit 226B. Accordingly, the target voltage $V_{OUT(REF)}$ of the output voltage $V_{OUT}$ is represented by the following Expression (6). As with the feedback circuit 226A according to the example 1.1, the feedback circuit 226B may be configured as a subtraction circuit.

$$V_{OUT(REF)}=(V_{REF}-K_2 \cdot V_{CMP})/K_1 \quad (6)$$

Next, description will be made regarding the operation of the headlamp 200B. In the example 1.2, control according to any of the control examples 2 through 4 may be employed.

Figure 14:
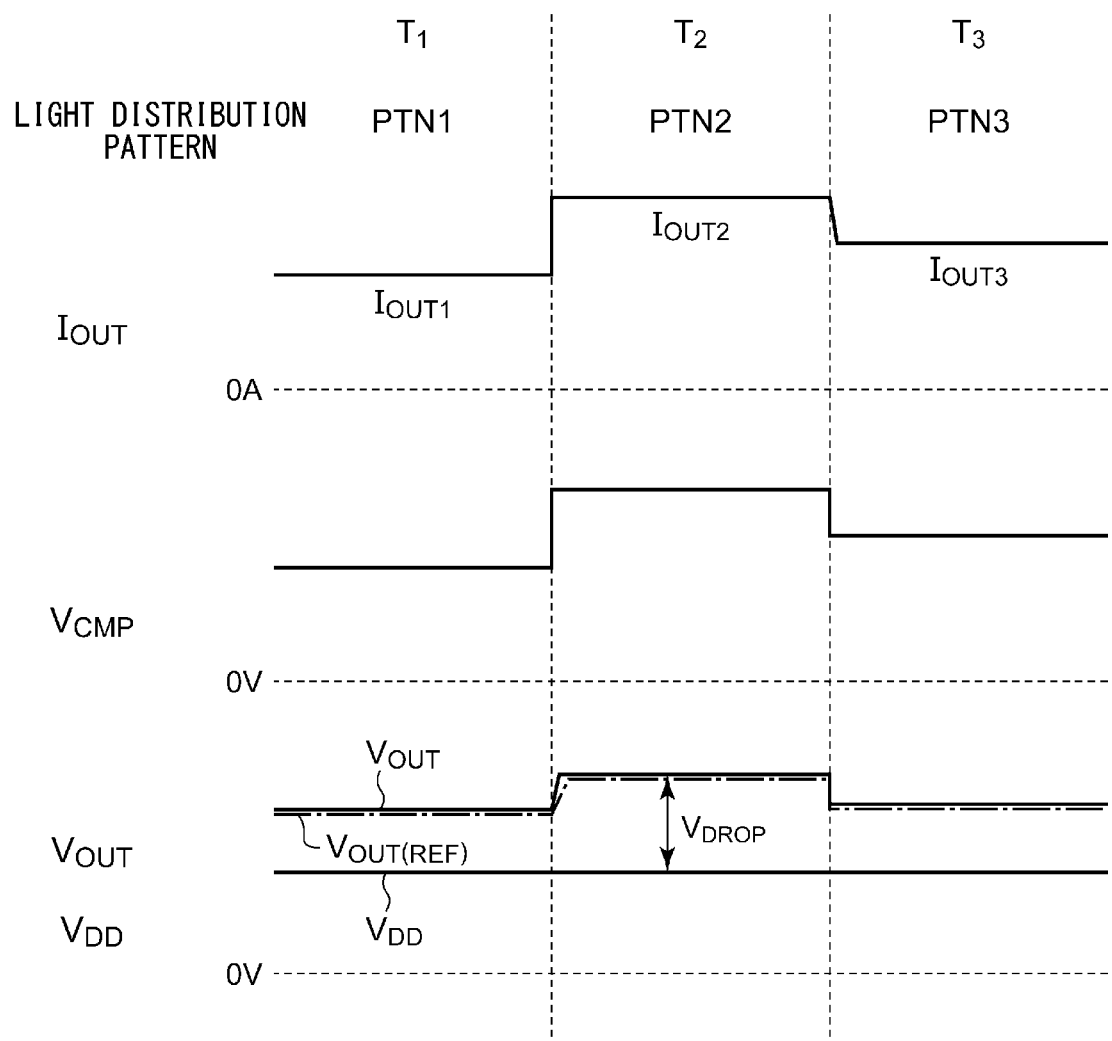
FIG. 14 is an operation waveform diagram of a headlamp employing an control example 2.

FIG. 14 is an operation waveform diagram of the headlamp 200B employing the control example 2. During periods $T_1$ through $T_3$, light distribution patterns PTN1 through PTN3 are set. In this state, the output current $I_{OUT}$ changes in the order of $I_{OUT1}$, $I_{OUT2}$, and $I_{OUT3}$.

The correction voltage $V_{CMP}$ is substantially proportional to the output current $I_{OUT}$ for the light distribution patterns PTN1 through PTN3. With this control, by changing the target value $V_{OUT(REF)}$ according to the output current $I_{OUT}$, this allows the power supply voltage $V_{DD}$ to be maintained at a constant level.

Figure 15:
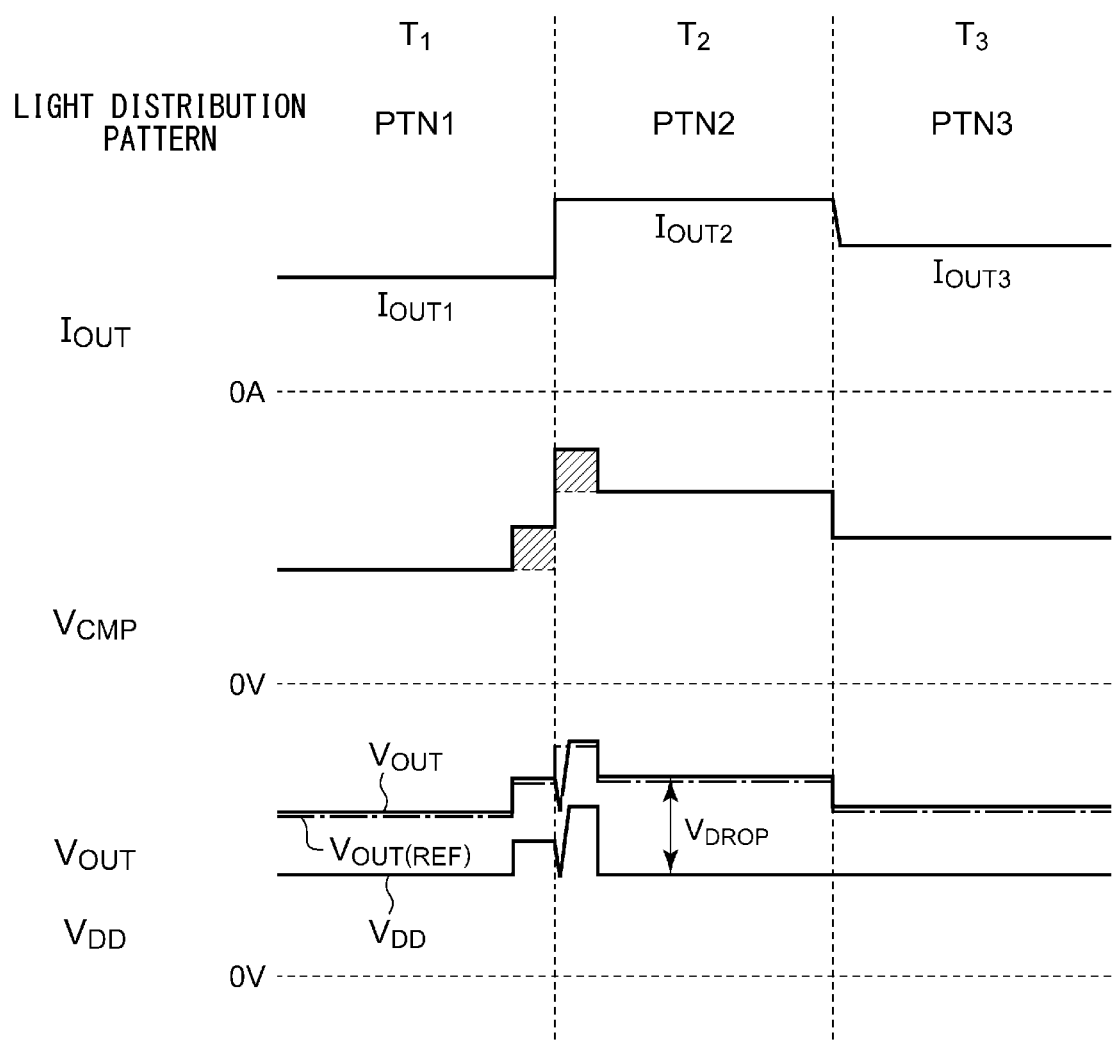
FIG. 15 is an operation waveform diagram of a headlamp employing an example 4.

FIG. 15 is an operation waveform diagram of the headlamp 200B employing the example control 4. The correction voltage $V_{CMP}$ includes a component that is substantially proportional to the output current $I_{OUT}$ and a component (hatched portion) that occurs in a certain period before and after the change of the light distribution pattern. The former component corresponds to the correction voltage $V_{CMP}$ shown in FIG. 14.

With the example control 4, such an arrangement is capable of temporarily increasing the target value $V_{OUT(REF)}$ of the output voltage $V_{OUT}$ when the light distribution pattern is changed with an increase in current.

The above is the operation of the headlamp 200B. With the headlamp 200B, this is capable of setting the target value of the output voltage $V_{OUT}$ of the DC/DC converter 224 according to the correction voltage $V_{CMP}$.

Example 1.3

Figure 16:
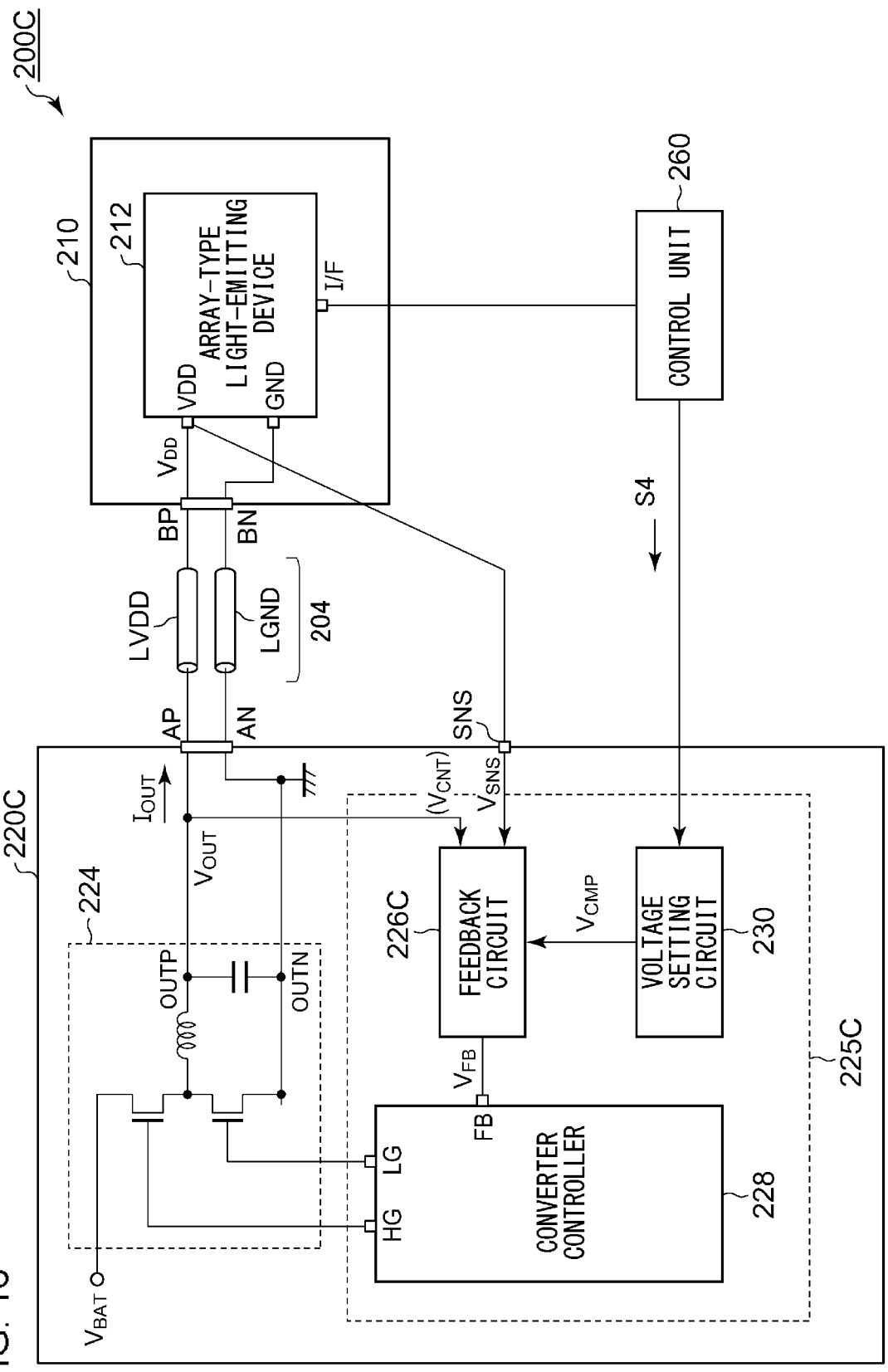
FIG. 16 is a block diagram showing a headlamp according to an example 1.3.

FIG. 16 is a block diagram showing a headlamp 200C according to an example 1.3. Description will be made regarding a configuration of the headlamp 200C directing attention to the points of difference from the example 1.2.

The headlamp 200C includes a variable light distribution light source 210, a power supply circuit 220C, and a control unit 260. In the example 1.3, the power supply circuit 220C has a configuration that differs from that of the power supply circuit 220B according to the example 1.2.

Description will be made regarding the configuration of the power supply circuit 220C. The power supply circuit 220C includes an output terminal OUT, a detection terminal SNS, a DC/DC converter 224, and a power supply control circuit 225C.

The power supply control circuit 225C includes a feedback circuit 226C, a converter controller 228, and a voltage setting circuit 230.

The feedback circuit 226C receives the input of the output voltage $V_{OUT}$ as the control target voltage $V_{CNT}$. Furthermore, the feedback circuit 226C receives the input of the power supply voltage $V_{DD}$ via the detection line LSNS. Moreover, the feedback circuit 226C receives the input of the correction voltage $V_{CMP}$ generated by the voltage setting circuit 230.

In the steady state, the correction voltage $V_{CMP}$ generated by the voltage setting circuit 230 is set to a steady value. When the light distribution pattern is switched with an increase in current, the voltage setting circuit 230 increases the correction voltage $V_{CMP}$.

The feedback circuit 226C generates the feedback voltage $V_{FB}$ based on the three voltages $V_{OUT}$, $V_{SNS}$, and $V_{CMP}$. The feedback circuit 226C detects the voltage drop $V_{DROP}=V_{OUT}-V_{SNS}$ across the power supply line LVDD based on the difference between $V_{OUT}$ and $V_{SNS}$.

The feedback voltage $V_{FB}$ generated by the feedback circuit 226C is represented by the following Expression (8).

$$V_{FB}=K_1 \cdot V_{OUT}+K_2 \cdot V_{CMP}+K_3 \cdot V_{DROP} \quad (8)$$

The above is the configuration of the headlamp 200C. In the headlamp 200C, the target value $V_{OUT(REF)}$ of the output voltage $V_{OUT}$, which is a control target voltage, is represented by the following Expression (9).

$$V_{OUT(REF)}=(V_{REF}-K_2 \cdot V_{CMP}-K_3 \cdot V_{DROP})/K_1 \quad (9)$$

Assuming that $K_2<0$ and $K_3<0$ hold true, the following Expression holds true.

$$V_{OUT(REF)}=(V_{REF}+|K_2| \cdot V_{CMP}+|K_3| \cdot V_{DROP})/K_1 \quad (9')$$

Assuming that $|K_3|=K_1$ holds true, the following Expression holds true.

$$V_{OUT(REF)}=(V_{REF}+|K_2| \cdot V_{CMP}/K_1+V_{DROP}) \quad (9'')$$

With the example 1.3, this is capable of optimizing the target value $V_{OUT(REF)}$ of the output voltage $V_{OUT}$ based on the actually detected voltage drop $V_{DROP}$, thereby allowing power consumption to be reduced. Furthermore, such an arrangement allows a drop in voltage due to response delay to be recovered using the correction voltage $V_{CMP}$. Moreover, by appropriately determining the gain K3, this is capable of correcting the voltage drop across the ground line LGND.

Figure 17:
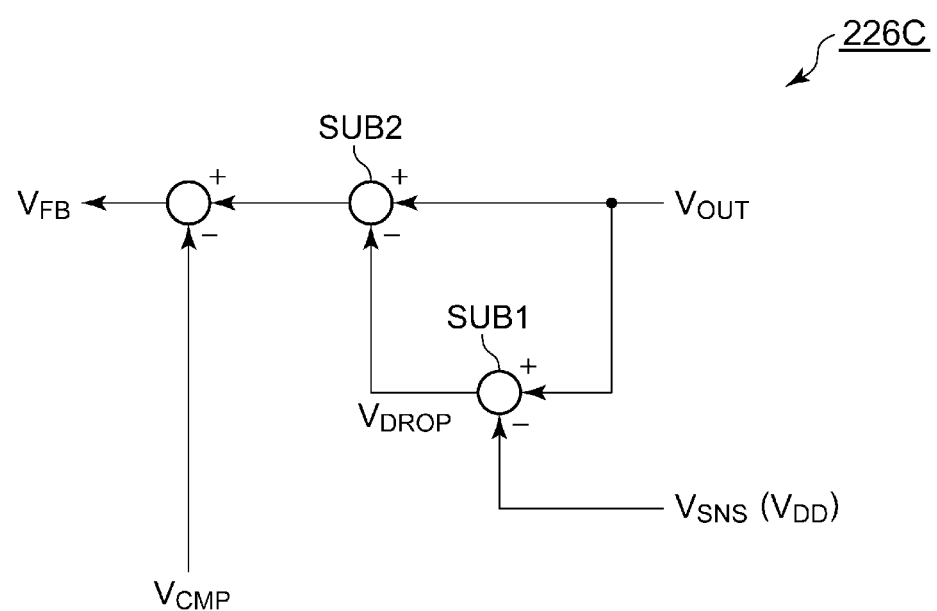
FIG. 17 is a function block diagram of a feedback circuit.

FIG. 17 is a function block diagram showing the feedback circuit 226C. The feedback circuit 226C may include three subtraction circuits SUB1 through SUB3. The subtraction circuit SUB1 subtracts the detection voltage $V_{SNS}$ from the output voltage $V_{OUT}$ so as to calculate the voltage drop $V_{DROP}$. The subtraction circuit SUB2 subtracts the voltage drop $V_{DROP}$ from the output voltage $V_{OUT}$. The subtraction circuit SUB3 subtracts the correction voltage $V_{CMP}$ from the output voltage of the subtraction circuit SUB2, i.e., ($V_{OUT}-V_{DROP}$). The subtraction order may be changed.

Example 1.4

Figure 18:
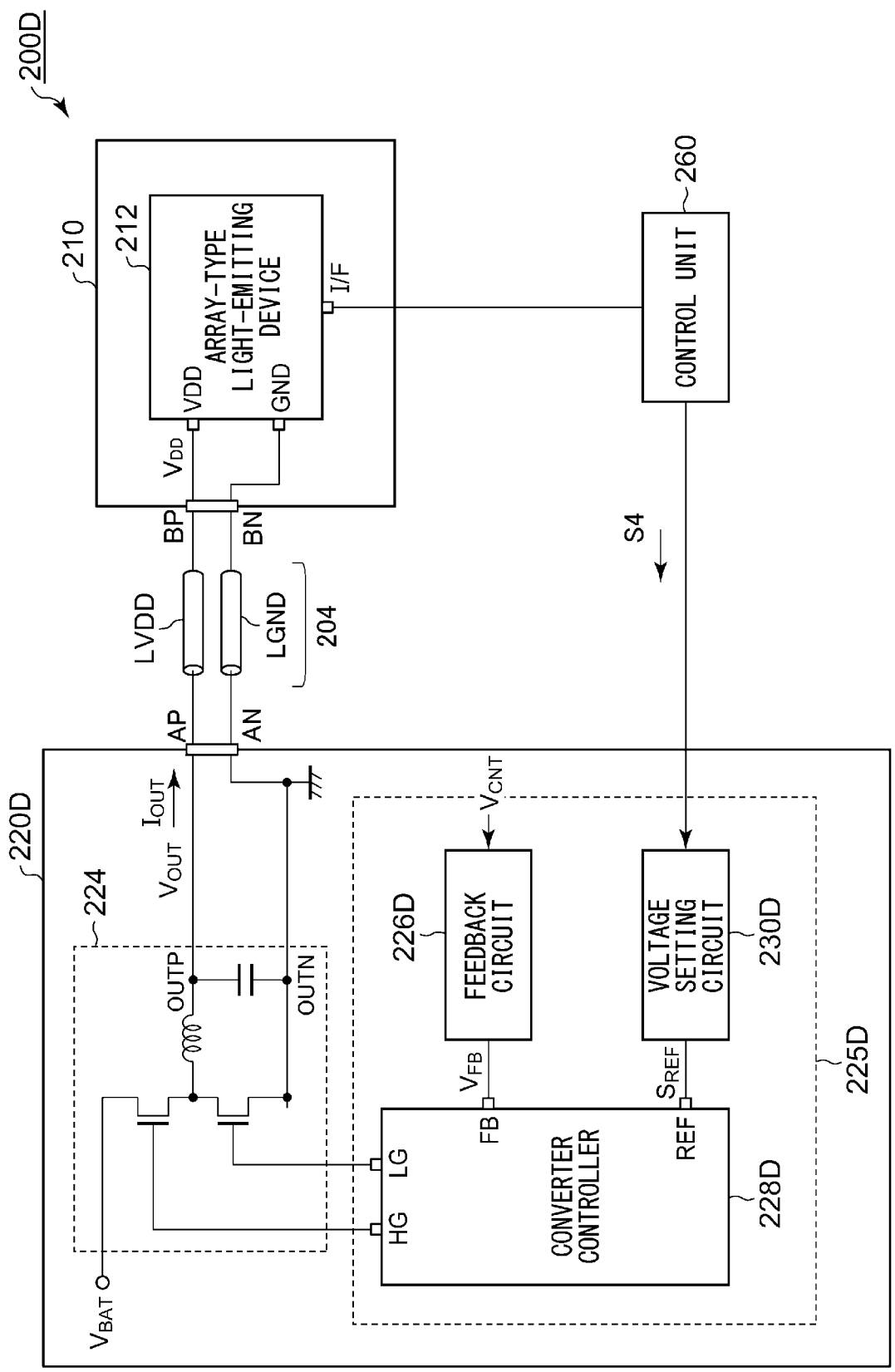
FIG. 18 is a circuit diagram of a headlamp according to an example 1.4.

FIG. 18 is a circuit diagram of a headlamp 200D according to an example 1.4. The headlamp 200D includes a variable light distribution light source 210, a power supply circuit 220D, and a control unit 260.

Description will be made regarding a configuration of the power supply circuit 220D. The power supply circuit 220D includes an output terminal OUT, a detection terminal SNS, a DC/DC converter 224, and a power supply control circuit 225D.

The power supply control circuit 225D includes a feedback circuit 226D, a converter controller 228D, and a voltage setting circuit 230D. In this example, the converter controller 228D includes a reference voltage setting pin REF, and is configured to be capable of setting the reference voltage $V_{REF}$ according to a reference signal $S_{REF}$ input to the reference voltage setting pin REF. The converter controller 228D may receive the reference signal $S_{REF}$ in the form of a digital signal, and may generate a reference voltage $V_{REF}$ using an internal voltage source. Alternatively, the converter controller 228D may receive an analog reference signal $S_{REF}$, and may employ the reference signal $S_{REF}$ itself as an internal reference voltage $V_{REF}$. The converter controller 228D feedback controls the DC/DC converter 224 such that the voltage $V_{FB}$ at the feedback pin FB approaches the reference voltage $V_{REF}$ based on the reference signal $S_{REF}$.

The voltage setting circuit 230D generates the reference signal $S_{REF}$ according to the data S4, and supplies the reference signal $S_{REF}$ to the reference voltage setting pin REF of the converter controller 228D. In a case in which the reference signal $S_{REF}$ is an analog voltage, the voltage setting circuit 230D may have the same configuration as shown in FIG. 12 assuming that the correction voltage $V_{CMP}$ is regarded as the reference signal $S_{REF}$. In a case in which the reference signal $S_{REF}$ is a digital signal, the voltage setting circuit 230D may have a configuration including only the microcontroller 240 shown in FIG. 12 assuming that the setting value $D_{CMP}$ is regarded as the reference signal $S_{REF}$.

The feedback circuit 226D generates the feedback voltage $V_{FB}$ that corresponds to the control target voltage $V_{CNT}$, and supplies the feedback voltage $V_{FB}$ to the feedback pin FB.

As in the example 1.2, the control target voltage $V_{CNT}$ may be the output voltage $V_{OUT}$. In this case, the feedback voltage $V_{FB}$ is represented by the following Expression (10).

$$V_{FB}=K_1 \cdot V_{OUT} \quad (10)$$

As in Example 1.1, the power supply circuit 220D and the variable light distribution light source 210D may be coupled via the detection line LSNS. Also, the detection voltage $V_{SNS}(=V_{DD})$ may be employed as the control target voltage $V_{CNT}$. In this case, the feedback voltage $V_{FB}$ is represented by the following Expression (11).

$$V_{FB}=K_1 \cdot V_{SNS}=K_1 \cdot V_{DD} \quad (11)$$

As in Example 1.3, the output voltage $V_{OUT}$ may be employed as the control target voltage $V_{CNT}$. Also, a voltage obtained by correcting the voltage drop $V_{DROP}$ in the power supply line LVDD may be employed as the feedback voltage $V_{FB}$. In this case, the feedback voltage $V_{FB}$ is represented by the following Expression (12).

$$V_{FB}=K_1 \cdot V_{OUT}+K_3 \cdot V_{DROP} \quad (12)$$

As explained in Example 1.3, the voltage drop $V_{DROP}$ can be obtained as follows. That is to say, the power supply circuit 220D and the variable light distribution light source 210D are coupled via the detection line LSNS. With this, the difference between $V_{OUT}$ and $V_{SNS}$ is calculated so as to obtain the voltage drop $V_{DROP}$.

With Example 1.4, the same effects can be obtained as in Examples 1.1 through 1.3.

Next, description will be made regarding modifications relating to Example 1.

Modification 1.1

Figure 19:
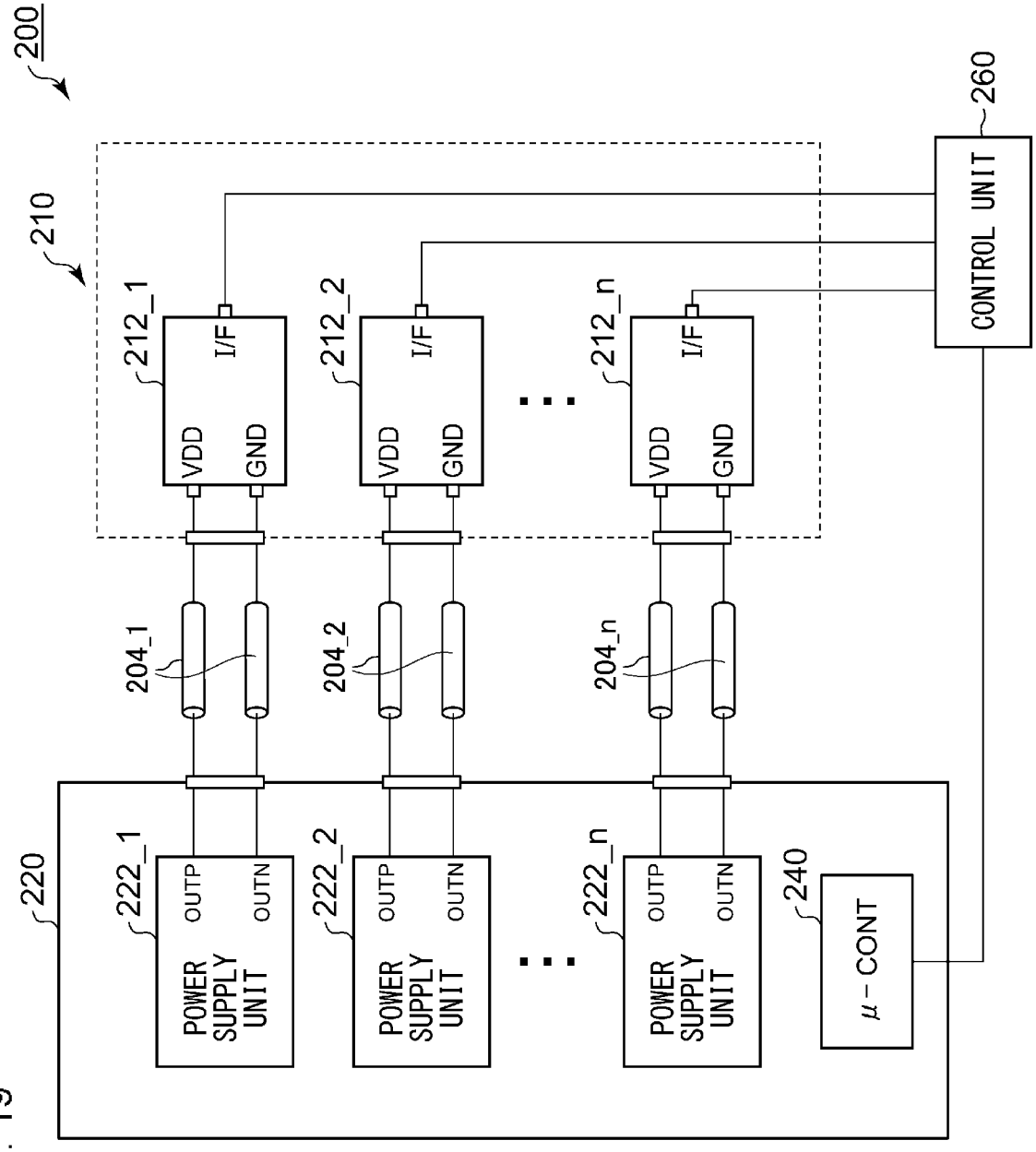
FIG. 19 is a diagram showing a headlamp according to a modification 1.1.

FIG. 19 is a diagram showing the headlamp 200 according to a modification 1.1. Description has been made above regarding the variable light distribution light source 210 including a single array-type light-emitting device 212. Also, the variable light distribution light source 210 may include multiple array-type light-emitting devices 212. In this case, the power supply circuit 220 may be configured as a unit (which will be referred to as a "power supply unit 222"). Also, multiple power supply units 222 may be provided corresponding to the multiple array-type light-emitting devices 212. The output terminal of each power supply unit 222 is coupled to the power supply terminal of the corresponding array-type light-emitting device 212 via an independent power supply cable LVDD. Also, a detection line LSNS may preferably be provided for each pair of a power supply unit 222 and an array-type light-emitting device 212 as necessary. In this modification, the microcontroller 240 may be configured as a common component for the multiple power supply units.

In the modification 1.1, the variable light distribution light source 210 has a configuration provided by division thereof into multiple array-type light-emitting devices 212 each having an independent power supply terminal. Furthermore, a power supply unit 222 is provided for each array-type light-emitting device 212. Moreover, each array-type light-emitting device 212 is coupled to a corresponding power supply unit 222 via a power supply cable in a one-to-one manner. This allows the current that flows through the variable light distribution light source 210 to be distributed to multiple DC/DC converters included in the multiple systems. This allows the effects of voltage drop across each DC/DC converter to be reduced, thereby providing improved load responsiveness. In addition, this allows the number of options for the components of the DC/DC converters, power supply cables, and connectors to be increased, thereby providing an improved degree of design freedom.

Modification 1.2

Figure 20:
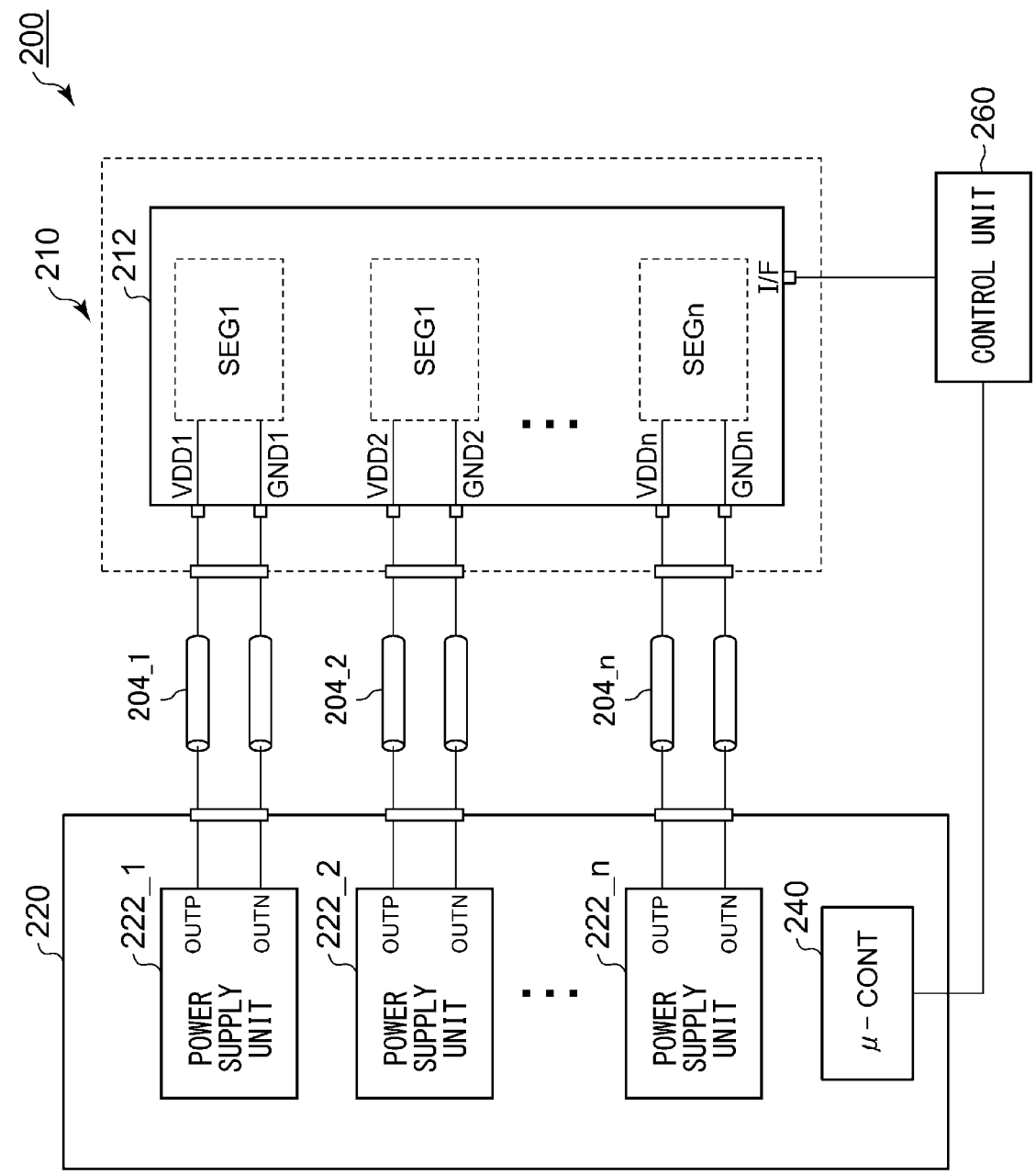
FIG. 20 is a diagram showing a headlamp according to a modification 1.2.

FIG. 20 is a diagram showing the headlamp 200 according to a modification 1.2. The array-type light-emitting device 212 may be configured such that the multiple internal light-emitting pixels are divided into multiple segments SEG1 through SEGn. Also, the multiple segments SEG1 through SEGn may be provided with corresponding multiple power supply terminals VDD. Also, the multiple segments SEG1 through SEGn may be provided with corresponding multiple power supply terminals VDD. The output terminal OUT of each power supply unit 222 is coupled to the corresponding power supply terminal VDD of the array-type light-emitting device 212 via an independent power supply cable LVDD. Also, a detection line LSNS may preferably be provided for each power supply unit 222 as necessary.

With the modification 1.2, this allows the current that flows through the variable light distribution light source 210 to be distributed to the DC/DC converters included in the multiple systems. Such an arrangement provides the same effects as in the modification 1.1.

Modification 1.3

The power supply unit 222 may be configured as a phase-shift converter. By employing such a phase-shift converter, this allows the ripples that occur in the output voltage $V_{OUTi}$ and the output current $I_{OUTi}$ to be reduced. Furthermore, such an arrangement provides improved efficiency. Furthermore, in a case in which PWM control is employed for each pixel circuit of the array-type light-emitting device 212, the output current $I_{OUTi}$ of the power supply unit 222 fluctuates at high speed according to the lighting-on ratio of the multiple pixel circuits. With this, by employing such a phase-shift converter, such an arrangement provides improved tracking performance (responsiveness) with respect to load fluctuations.

Modification 1.4

Description has been made regarding an arrangement in which the power supply circuit 220 and the control unit 260 are built into the headlamp 200. Also, either one or both of the power supply circuit 220 and the control unit 260 may be arranged outside the body of the headlamp 200. The variable light distribution light source 210 serves as a heat generator. Accordingly, an arrangement in which the control unit 260, which has a weak point with respect to heat, is arranged in the vehicle interior away from the variable light distribution light source 210 is advantageous from a thermal design viewpoint.

Modification 1.5

The power supply control circuit 225 may directly receive the information with respect to the light distribution pattern from a host controller 104 without going through the control unit 260.

Modification 1.6

The power supply control circuit 225 may determine the target value based on the maximum value of the forward voltages $V_{F1}$ through $V_{Fn}$ of all the pixels regardless of whether or not each pixel circuit PIX is turned on. The power supply control circuit 225 may also determine the target value based on the maximum value of the forward voltages $V_F$ that are actually turned on from among the multiple pixel circuits PIX.

Modification 1.7

The array-type light-emitting device may be configured such that the maximum value $V_{F(MAX)}$ of the forward voltages $V_F$ of the multiple internal light-emitting elements are measured beforehand, and the maximum value thus measured is held in internal nonvolatile memory. The forward voltage $V_{F(MAX)}$ may be the maximum value of all the pixels in all temperature ranges. Alternatively, the forward voltage $V_{F(MAX)}$ may be held for each temperature range. Also, data including the maximum value that corresponds to the current temperature may be transmitted.

Embodiment 2

Figure 21:
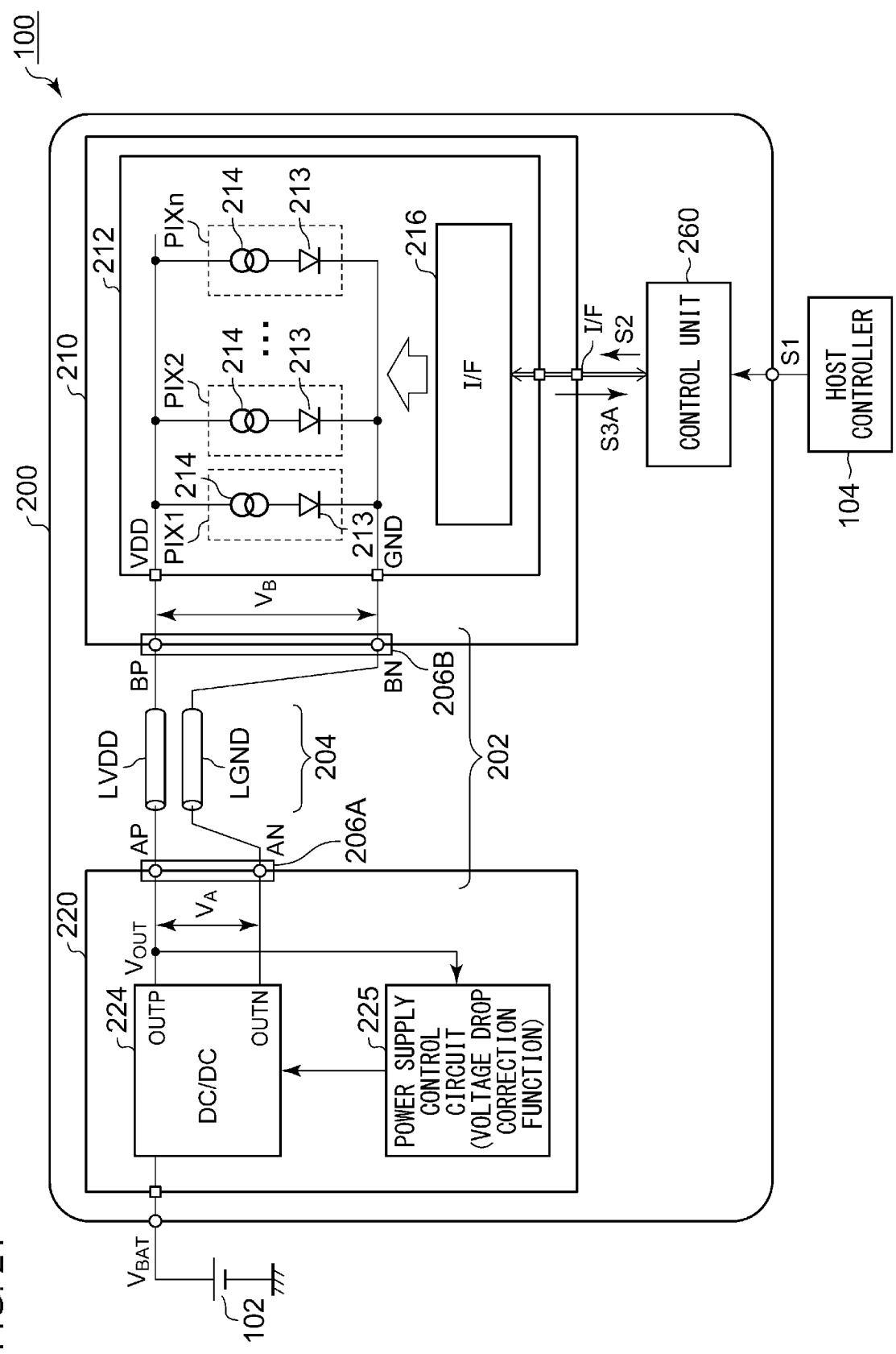
FIG. 21 is a block diagram of a lamp system according to an embodiment 2.

FIG. 21 is a block diagram showing a lamp system 100 according to an embodiment 2. The lamp system 100 is configured as an ADB lamp system including a battery 102, a host controller 104, and a headlamp 200.

The host controller 104 generates a light distribution instruction for the headlamp 200. The light distribution instruction may include a lighting instruction and additional information. The lighting instruction may include a signal for specifying the on/off of the high beam or low beam. A basic light distribution to be formed by the headlamp 200 is determined according to the lighting instruction. On the other hand, the additional information may include data with respect to a region (shielded region) that should not be irradiated with the high beam and information with respect to the vehicle speed, steering angle, etc. The basic light distribution is modified according to the additional information, thereby determining the final light distribution. The host controller 104 may be configured as a vehicle-side Electronic Control Unit (ECU). Also, the host controller 104 may be configured as a lamp-side ECU built into the headlamp 200.

The headlamp 200 is configured as an ADB lamp including a variable light distribution light source 210, a power supply circuit 220, a coupling means, and a control unit 260.

The variable light distribution light source 210 is provided with multiple pixels arranged in an array, and is configured to be capable of independently controlling the on/off state of each pixel. In the headlamp 200, the on/off states of the multiple pixels are controlled so as to provide a desired light distribution.

More specifically, the variable light distribution light source 210 includes an array-type light-emitting device 212. The array-type light-emitting device 212 includes n pixel circuits PIX1 through PIXn and a power supply terminal VDD coupled to the multiple pixel circuits PIX1 through PIXn.

Each pixel circuit PIXj (1≤j≤n) includes a light-emitting element 213_j and a current source 214_j provided in series between the power supply terminal VDD and a ground terminal (ground line) GND. The multiple light-emitting elements 213_1 through 213_n are each configured as a semiconductor light-emitting element such as an LED, LD (semiconductor laser), organic EL element, or the like, and are spatially arranged in an array (in a matrix).

The multiple current sources 214_1 through 214_n are each configured to have independently controllable on/off states. When the j-th current source 214_j is turned on, the corresponding light-emitting element 213_j emits light. That is to say, the corresponding pixel circuit PIXj is set to the lighting-on state.

An interface circuit 216 controls the on/off states of the current sources 214_1 through 214_n according to a control signal S2 from the control unit 260. The interface circuit 216 is coupled to the control unit 260 via a high-speed serial interface, and receives the control signal S2 for specifying the on/off states of all the pixels.

The power supply circuit 220 supplies electric power to the variable light distribution light source 210. The power supply circuit 220 includes a converter for outputting a constant voltage. The power supply circuit 220 supplies the stabilized power supply voltage $V_{DD}$ to the power supply terminal VDD of the array-type light-emitting device 212. The power supply voltage $V_{DD}$ is determined based on $V_F+V_{SAT}$. Typically, the power supply voltage $V_{DD}$ is set to on the order of 4 to 5 V. Here, $V_F$ represents the forward voltage of the light-emitting element 213, and $V_{SAT}$ represents the minimum operating voltage of the current source 214. Accordingly, the power supply circuit 220 may be configured as a step-down converter (Buck converter) that steps down a battery voltage $V_{BAT}$ on the order of 12 V (or 24 V).

The control unit 260 receives a light distribution instruction S1 from the host controller 104, generates a control signal S2 that corresponds to the light distribution instruction S1, and transmits the control signal S2 to the variable light distribution light source 210. The control unit 260 will also be referred to as a "drawing ECU". For example, the control unit 260 PWM-controls the multiple pixel circuits PIX1 through PIXn of the array-type light-emitting device 212 so as to control the light distribution. A PWM frequency of several hundred Hz (e.g., 100 to 400 Hz) is employed. Accordingly, the PWM cycle is set to several milliseconds to several dozen milliseconds (ms).

The power supply circuit 220 and the array-type light-emitting device 212 are coupled via a coupling means 202 including the power supply cable 204. The coupling means 202 may include connectors (couplers) 206A and 206B or the like in addition to the power supply cable 204.

Next, description will be made regarding a configuration of the power supply circuit 220. The power supply circuit 220 includes a DC/DC converter 224 and a power supply control circuit 225.

The power supply cable 204 includes a power supply line LVDD and a ground line LGND. A positive electrode output terminal OUTP of the DC/DC converter 224 is coupled to the power supply terminal VDD of the array-type light-emitting device 212 via the power supply line LVDD. Furthermore, the negative output terminal OUTN of the DC/DC converter 224 is coupled to the ground terminal GND of the array-type light-emitting device 212 via a ground line LGND.

Description will be made with the impedance of the power supply line LVDD as $R_{VDD}$, and with the impedance of the ground line LGND as $R_{GND}$.

The voltage $V_{BAT}$ from the battery is supplied to the input of the DC/DC converter 224. The output of the DC/DC converter 224 is coupled to the array-type light-emitting device 212 via the coupling means 202. The power supply control circuit 225 senses the voltage drop $V_{DROP}$ across the coupling means 202.

The voltage drop $V_{DROP}$ across the coupling means 202 can include a voltage drop across the power supply cable 204 and a voltage drop across the connector 206. More specifically, the voltage drop $V_{DROP}$ across the coupling means 202 can include a voltage drop $V_1$ across the power supply line LVDD, a voltage drop $V_2$ across the ground line LGND, a voltage drop $V_3$ across a connector 206A, and a voltage drop $V_4$ across a connector 206B. The power supply control circuit 225 may acquire the sum total of the voltage drops $V_1$ through $V_4$ as the voltage drop $V_{DROP}$ across the coupling means 202.

$$V_{DROP}=V_1+V_2+V_3+V_4$$

Alternatively, in a case in which the voltage drop across the connector 206 is relatively small compared to that in the power supply cable 204, the sum total of only the voltage drops $V_1$ and $V_2$ across the power supply cable 204 may be acquired as the voltage drop $V_{DROP}$.

$$V_{DROP}=V_1+V_2$$

Alternatively, in a case in which a body ground is employed as the ground line LGND, the impedance of the ground line LGND is sufficiently low. In this case, only the voltage drop $V_1$ across the power supply line LVDD of the power supply cable 204 may be acquired as the voltage drop $V_{DROP}$.

The power supply control circuit 225 sets the target value $V_{OUT(REF)}$ according to the voltage drop $V_{DROP}$.

$$V_{OUT(REF)}=V_{DD(MIN)}+V_{DROP}$$

With this, the power supply control circuit 225 controls the DC/DC converter 224 such that the output voltage $V_{OUT}$ of the DC/DC converter 224 approaches a target value $V_{OUT(REF)}$.

The above is the configuration of the lamp system 100. Next, description will be made regarding the operation of the lamp system 100.

Figure 22:
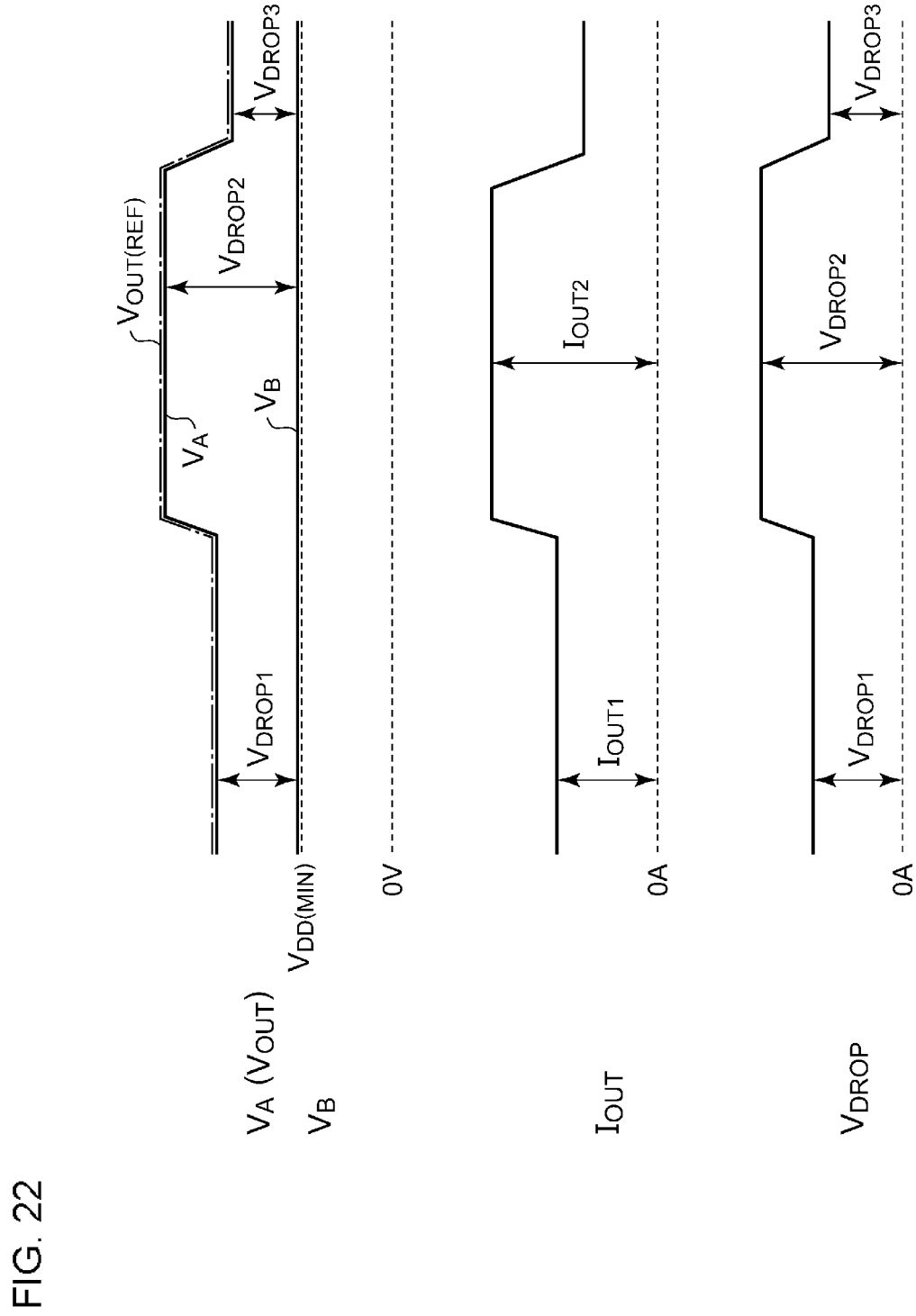
FIG. 22 is a diagram for explaining the operation of the lamp system shown in FIG. 21.

FIG. 22 is a diagram for explaining the operation of the lamp system 100 shown in FIG. 21. The output current $I_{OUT}$ changes with time. A voltage drop $V_{DROP}$ that is proportional to the output current $I_{OUT}$ occurs in the coupling means 202.

$$V_{DROP}=R \times I_{OUT}$$

Here, "R" represents the impedance of the coupling means 202.

The power supply control circuit 225 senses the voltage drop $V_{DROP}$, and sets the target value $V_{OUT(REF)}$ that corresponds to the voltage drop $V_{DROP}$. Subsequently, the power supply control circuit 225 stabilizes the output voltage $V_{OUT}$ of the DC/DC converter 224 to the target value $V_{OUT(REF)}$ represented by the above Expression.

The input voltage $V_B$ applied across the power supply terminal VDD of the array-type light-emitting device 212 and the ground terminal GND is lower than the voltage VA across the positive output OUTP and the negative output OUTN of the DC/DC converter 224, i.e., the output voltage $V_{OUT}$ of the DC/DC converter 224, by the voltage drop $V_{DROP}$ in the coupling means 202. With the present embodiment, the power supply circuit 220 adds a voltage that is equal to the voltage drop $V_{DROP}$ in the coupling means 202 to the output voltage $V_{OUT}$. Accordingly, the input voltage $V_B$ of the array-type light-emitting device 212 is maintained at a constant level regardless of the magnitude of the voltage drop $V_{DROP}$. Accordingly, the power supply voltage $V_{DD}$ is maintained in the vicinity of the minimum operating voltage $V_{DD(MIN)}$ regardless of the magnitude of the output current $I_{OUT}$, thereby allowing unnecessary power consumption to be reduced.

The present invention encompasses various kinds of apparatuses and methods that can be regarded as a block configuration or a circuit configuration shown in FIG. 21, or otherwise that can be derived from the aforementioned description. That is to say, the present invention is not restricted to a specific configuration. More specific description will be made below regarding example configurations or examples for clarification and ease of understanding of the essence of the present invention and the operation thereof. That is to say, the following description will by no means be intended to restrict the technical scope of the present invention.

Example 2.1

Figure 23:
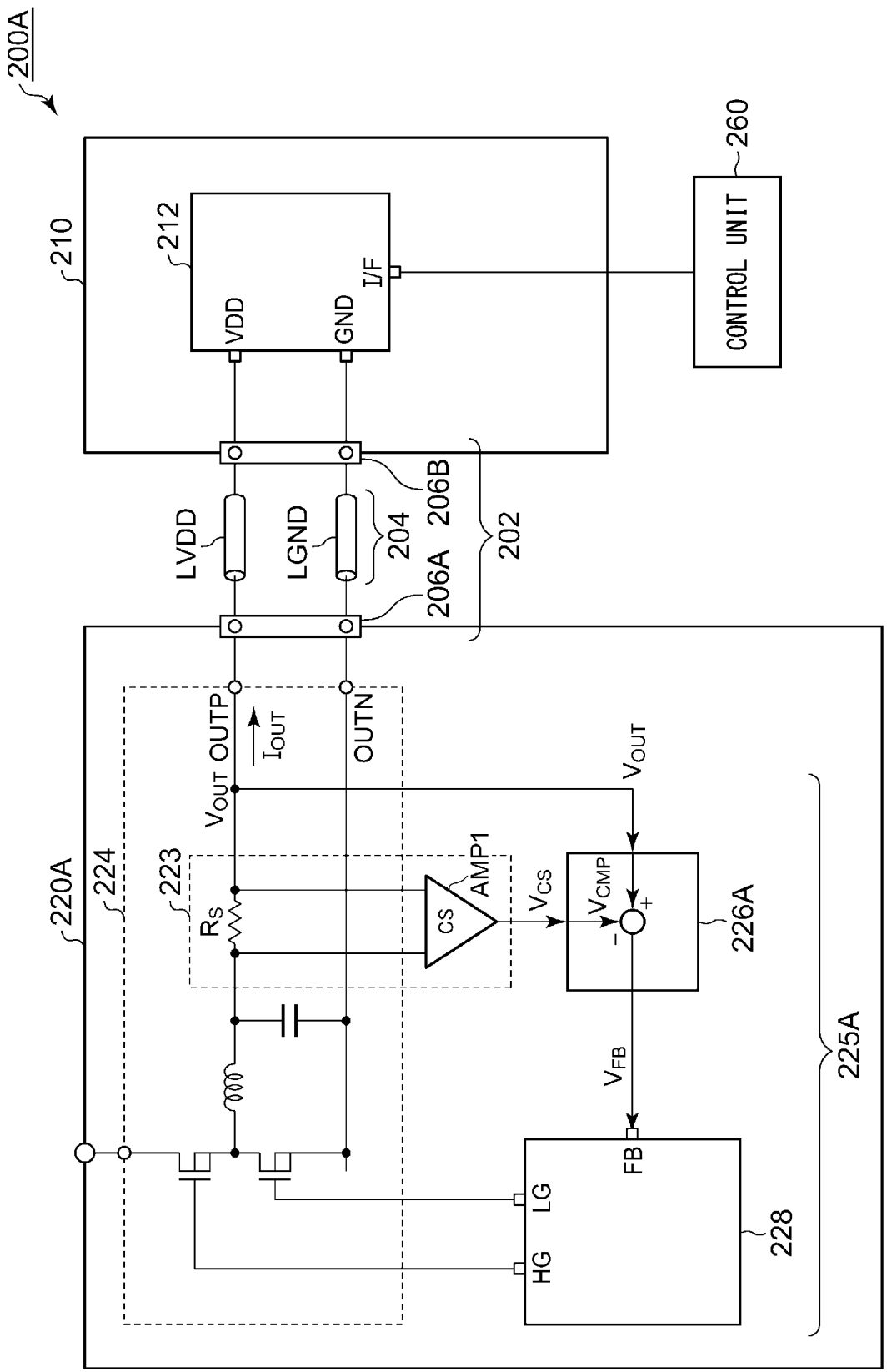
FIG. 23 is a block diagram of a headlamp according to an example 2.1.

FIG. 23 is a block diagram showing a headlamp 200A according to an example 2.1. The headlamp 200A includes a variable light distribution light source 210, a power supply circuit 220A, and a control unit 260.

The power supply circuit 220A includes a DC/DC converter 224, a current sensor 223, and a power supply control circuit 225A.

The current sensor 223 generates a current detection signal $V_{CS}$ that corresponds to the output current $I_{OUT}$ of the DC/DC converter 224. For example, the current sensor 223 includes a sense resistor Rs and an amplifier AMP1. The sense resistor Rs is provided on a path of the output current $I_{OUT}$. It should be noted that FIG. 23 shows an arrangement in which the sense resistor Rs is provided on the positive electrode output terminal OUTP side. Also, the sense resistor Rs may be provided on the negative output terminal OUTN side. The amplifier AMP1 amplifies the voltage drop that occurs in the sense resistor Rs, and outputs the current detection signal $V_{CS}$. The current detection signal $V_{CS}$ is proportional to the output current $I_{OUT}$. Accordingly, the current detection signal $V_{CS}$ is a signal that corresponds to the voltage drop $V_{DROP}$ across the coupling means 202. With the detection gain of the current sensor 223 as A, the following Expression holds true.

$$V_{CS}=A \times I_{OUT}$$

The power supply control circuit 225A sets the target value $V_{OUT(REF)}$ based on the current detection signal $V_{CS}$, which has a correlation with the voltage drop $V_{DROP}$, so as to control the DC/DC converter 224.

In the example 2.1, the power supply control circuit 225A includes a feedback circuit 226A and a converter controller 228. As the converter controller 228, a commercially available DC/DC converter control IC (Integrated Circuit) may be employed. The converter controller 228 generates a pulse signal where at least one from among the pulse width, frequency, and duty cycle is controllable, which is adjusted such that the feedback voltage $V_{FB}$ input to the feedback pin FB approaches the internally generated reference voltage $V_{REF}$. With this, the converter controller 228 feedback controls the DC/DC converter 224 according to the pulse signal.

The feedback circuit 226A subtracts the correction voltage $V_{CMP}$ based on the current detection signal $V_{CS}$ from the output voltage $V_{OUT}$ of the DC/DC converter 224, so as to generate the feedback voltage $V_{FB}$. The feedback voltage $V_{FB}$ is supplied to the feedback pin FB of the converter controller 228.

The feedback circuit $V_{FB}$ is a signal that changes according to each of the output voltage $V_{OUT}$ and the correction voltage $V_{CMP}$, which is represented by the following Expression (1).

$$V_{FB}=K_1 \cdot V_{OUT}-K_2 \cdot V_{CMP} \tag{1}$$

$$K_1, K_2 > 0$$

The converter controller 228 controls the DC/DC converter 224 such that the feedback signal $V_{FB}$ approaches the target value $V_{REF}$.

In a steady state in which the system is stabilized, the relation $K_1 \cdot V_{OUT} - K_2 \cdot V_{CMP} = V_{REF}$ holds true. Accordingly, in a steady state, the output voltage $V_{OUT}$ is stabilized to the target value $V_{OUT(REF)}$ represented by the following Expression (2).

$$V_{OUT(REF)}=(V_{REF}+K_2 \cdot V_{CMP})/K_1 \tag{2}$$

Accordingly, when $V_{CMP}=V_{CS}=A \times I_{OUT}$ holds true, the following relation is obtained.

$$V_{OUT(REF)}=(V_{REF}+K_2 \cdot A \times I_{OUT})/K_1 \tag{2'}$$

In a case in which the circuit constant is designed such that $K_2/K_1 \cdot A$ matches the impedance R of the coupling means 202 and $V_{REF}/K_1$ matches $V_{DD(MIN)}$, the relation $V_{OUT(REF)}=V_{DD(MIN)}+I_{OUT} \times R = V_{DD(MIN)}+V_{DROP}$ holds true.

Figure 24:
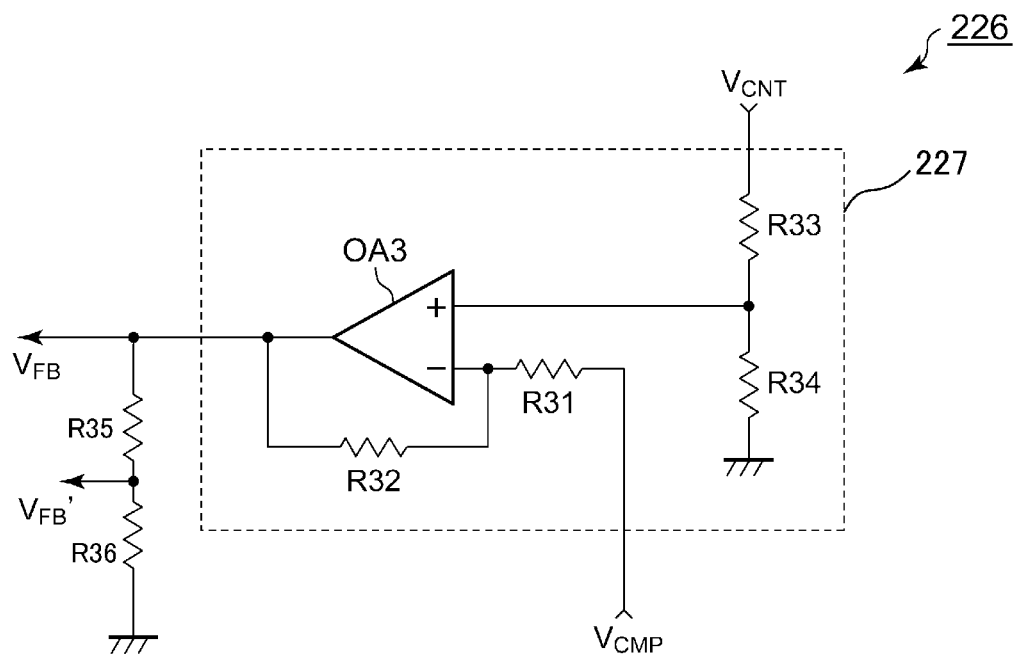
FIG. 24 is a circuit diagram showing an example configuration of a feedback circuit.

FIG. 24 is a circuit diagram showing an example configuration of the feedback circuit 226A. The feedback circuit 226A includes a subtraction circuit 227 including an operational amplifier. The subtraction circuit 227 includes resistors R31 through R34 and an operational amplifier OA3. The input/output characteristics of the subtraction circuit 227 are represented by the following Expression (3).

$$Vx=(R31+R32)/R31 \times \{R34/(R33+R34) \times V_{CNT}-R32/(R31+R32) \times V_{CMP}\} \tag{3}$$

The output voltage Vx of the subtraction circuit 227 may be employed as the feedback voltage $V_{FB}$. Alternatively, after the voltage Vx is divided by resistors R35 and R36, a voltage $V_{FB'}$ thus divided may be output as the feedback voltage.

In a case in which $Vx=V_{FB}$ holds true, making a comparison between Expression (1) and Expression (2), the following Expressions are obtained.

$$K_1=(R31+R32)/R31 \times R34/(R33+R34)$$

$$K_2=(R31+R32)/R31 \times R32/(R31+R32)$$

Example 2.2

Figure 25:
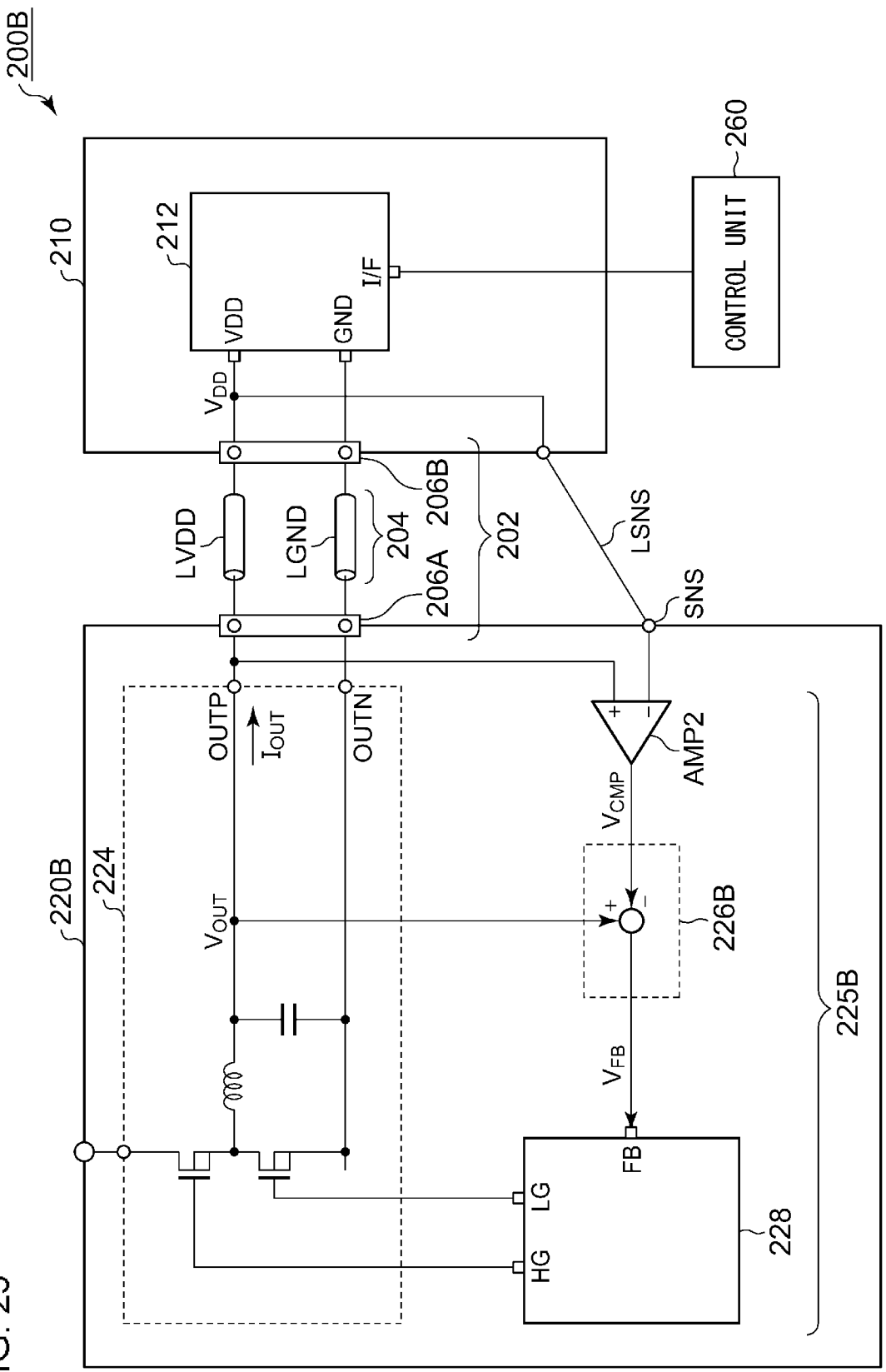
FIG. 25 is a block diagram of a headlamp according to an example 2.2.

FIG. 25 is a block diagram showing a headlamp 200B according to an example 2.2. The headlamp 200B includes a variable light distribution light source 210, a power supply circuit 220B, and a control unit 260.

The power supply circuit 220B includes a DC/DC converter 224, a power supply control circuit 225B, and a detection terminal SNS.

The detection terminal SNS is coupled to the power supply terminal VDD of the array-type light-emitting device 212 via a detection line (single-signal line) LSNS separate from the coupling means 202. The power supply control circuit 225B has a sufficiently high input impedance. Accordingly, no current flows through the detection line LSNS. Accordingly, the detection voltage $V_{SNS}$ that occurs at the detection terminal SNS is equal to the voltage $V_{DD}$ at the power supply terminal VDD of the array-type light-emitting device 212.

The power supply control circuit 225B senses the voltage drop $V_{DROP}$ across the coupling means 202 based on the difference between the output voltage $V_{OUT}$ of the DC/DC converter 224 and the detection voltage $V_{SNS}$ of the detection terminal SNS, i.e., $\Delta V = V_{OUT} - V_{SNS}$. The difference $\Delta V$ represents the voltage drop across the power supply line LVDD of the coupling means 202 and the connector on the positive electrode side.

For example, in a case in which the coupling means 202 has the same impedance on the positive electrode side and on the negative electrode side, ($\Delta V \times 2$) represents the voltage drop $V_{DROP}$ across the coupling means 202. The power supply control circuit 225B includes an amplifier AMP2, a feedback circuit 226B, and a converter controller 228. The amplifier AMP2 amplifies the difference between the output voltage $V_{OUT}$ and the detection voltage $V_{SNS}$, so as to generate the correction voltage $V_{CMP}$. The correction voltage $V_{CMP}$ is proportional to the output current $I_{OUT}$.

$$V_{CMP}=B \times (V_{OUT}-V_{SNS})=A \times I_{OUT}$$

The feedback circuit 226B subtracts the correction voltage $V_{CMP}$ from the output voltage $V_{OUT}$ of the DC/DC converter 224, so as to generate the feedback voltage $V_{FB}$. Subsequently, the feedback voltage $V_{FB}$ is supplied to the feedback pin FB of the converter controller 228.

The feedback voltage $V_{FB}$ is a signal that changes according to each of the output voltage $V_{OUT}$ and the correction voltage $V_{CMP}$, which is represented by the following Expression (1).

$$V_{FB}=K_1 \cdot V_{OUT}-K_2 \cdot V_{CMP} \tag{1}$$

The converter controller 228 controls the DC/DC converter 224 such that the feedback signal $V_{FB}$ approaches the target value $V_{REF}$. In a steady state, the output voltage $V_{OUT}$ is stabilized to the target value $V_{OUT(REF)}$ represented by the following Expression (2).

$$V_{OUT(REF)}=(V_{REF}+K_2 \cdot V_{CMP})/K_1 \tag{2}$$

Accordingly, when $V_{CMP}=A \times I_{OUT}$ holds true, the following relation is obtained.

$$V_{OUT(REF)}=(V_{REF}+K_2 \cdot A \times I_{OUT})/K_1 \tag{2'}$$

In a case in which the circuit constant is designed such that $K_2/K_1 \cdot A$ matches the impedance R of the coupling means 202 and $V_{REF}/K_1$ matches $V_{DD(MIN)}$, the relation $V_{OUT(REF)}=V_{DD(MIN)}+I_{OUT} \times R = V_{DD(MIN)}+V_{DROP}$ holds true.

Example 2.3

Figure 26:
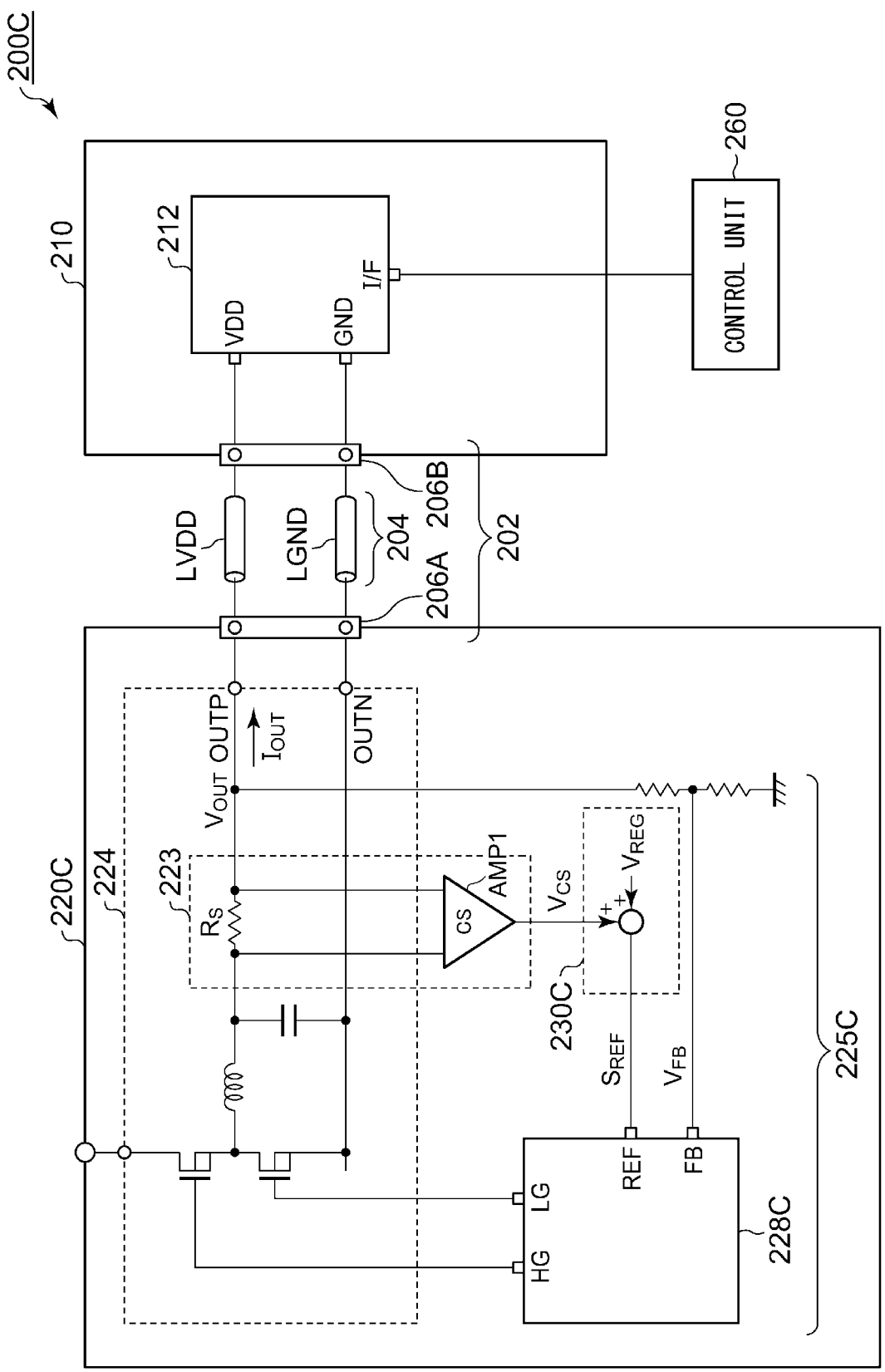
FIG. 26 is a block diagram of a headlamp according to an example 2.3.

FIG. 26 is a block diagram showing a headlamp 200C according to an example 2.3. The headlamp 200C includes a variable light distribution light source 210, a power supply circuit 220C, and a control unit 260.

The power supply circuit 220C includes a DC/DC converter 224, a current sensor 223, and a power supply control circuit 225C.

The current sensor 223 generates a current detection signal $V_{CS}$ that corresponds to the output current $I_{OUT}$ of the DC/DC converter 224.

$$V_{CS}=A \times I_{OUT}$$

The power supply control circuit 225C includes a voltage setting circuit 230C and a converter controller 228C. The converter controller 228C includes a voltage setting pin REF in addition to the feedback pin FB, which allows the reference voltage $V_{REF}$ to be set according to the reference signal $S_{REF}$ input to the reference voltage setting pin REF. The converter controller 228C receives the reference signal $S_{REF}$ in the form of an analog signal, and uses the analog reference signal $S_{REF}$ itself as the internal reference voltage $V_{REF}$. The converter controller 228C feedback controls the DC/DC converter 224 such that the voltage $V_{FB}$ of the feedback pin FB approaches the reference voltage $V_{REF}$ based on the reference signal $S_{REF}$.

The feedback voltage $V_{FB}$ that corresponds to the output voltage $V_{OUT}$ is input to the feedback pin FB of the converter controller 228C. In this example, the feedback voltage $V_{FB}$ is obtained by dividing the output voltage $V_{OUT}$, which is represented by the following Expression (4).

$$V_{FB}=K_1 \times V_{OUT} \tag{4}$$

The voltage setting circuit 230C generates the reference signal $S_{REF}$ that corresponds to the voltage drop $V_{DROP}$ across the coupling means 202, and supplies the reference signal $S_{REF}$ to the reference voltage setting pin REF of the converter controller 228C. In this example, the voltage setting circuit 230C adds a predetermined voltage $V_{REG}$ and the correction voltage $V_{CMP}$ based on the current detection signal $V_{CS}$, so as to generate the analog reference voltage $V_{REF}$.

$$V_{REF}=K_2 \cdot V_{REG}+K_3 \cdot V_{CMP} \tag{5}$$

In a steady state, the relation $V_{REF}=V_{FB}$ holds true. Accordingly, the following Expression (6) is derived.

$$K_2 \cdot V_{REG}+K_3 \cdot V_{CMP}=K_1 \times V_{OUT} \tag{6}$$

Accordingly, the target value $V_{OUT(REF)}$ of the output voltage $V_{OUT}$ is represented by the following Expression (7).

$$V_{OUT(REF)}=(K_2 \cdot V_{REG}+K_3 \cdot V_{CMP})/K_1 \tag{7}$$

By substituting the relation $V_{CMP}=V_{CS}=A \times I_{OUT}$ into the Expression (7), the following Expression (8) is obtained.

$$V_{OUT(REF)}=(K_2 \cdot V_{REG}+K_3 \cdot A \cdot I_{OUT})/K_1 \tag{8}$$

Accordingly, by designing the circuit constant such that the relations $K_2/K_1 \times V_{REG}=V_{DD(MIN)}$ and $K_3 \cdot A/K_1=R$ hold true, the following Expression is obtained.

$$V_{OUT(REF)}=V_{DD(MIN)}+R \times I_{OUT}$$

Example 2.4

Figure 27:
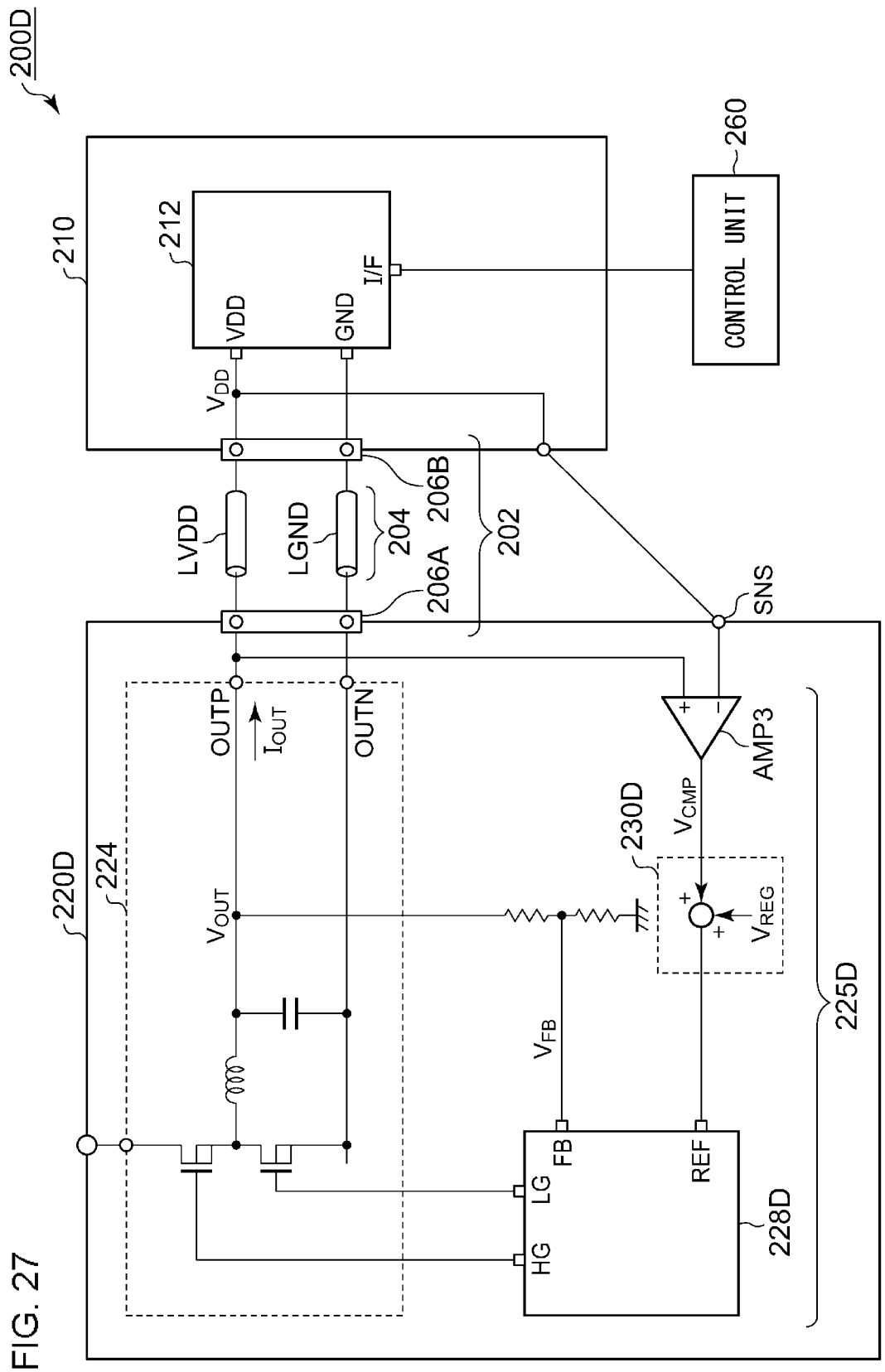
FIG. 27 is a block diagram of a headlamp according to an example 2.4.

FIG. 27 is a block diagram showing a headlamp 200D according to an example 2.4. The headlamp 200D includes a variable light distribution light source 210, a power supply circuit 220D, and a control unit 260.

The power supply circuit 220D includes a DC/DC converter 224, a power supply control circuit 225D, and a detection terminal SNS. The detection terminal SNS is coupled to the power supply terminal VDD of the array-type light-emitting device 212 via a detection line (single-signal line) separate from the coupling means 202.

The power supply control circuit 225D includes an amplifier AMP3, a voltage setting circuit 230D, and a converter controller 228D. The converter controller 228D includes a reference voltage setting pin REF in addition to the feedback pin FB, which allows the reference voltage $V_{REF}$ to be set according to the reference signal $S_{REF}$ input to the reference voltage setting pin REF. The feedback voltage $V_{FB}=K_1 \times V_{OUT}$ is input to the feedback pin of the converter controller 228D.

The amplifier AMP3 amplifies the difference between the output voltage $V_{OUT}$ and the detection voltage $V_{SNS}$, so as to generate a correction voltage $V_{CMP}$. The correction voltage $V_{CMP}$ is proportional to the output current $I_{OUT}$.

$$V_{CMP}=B \times (V_{OUT}-V_{SNS})=A \times I_{OUT}$$

The voltage setting circuit 230D generates the reference signal $S_{REF}$ that corresponds to the voltage drop $V_{DROP}$ across the coupling means 202, and supplies the reference signal $S_{REF}$ to the reference voltage setting pin REF of the converter controller 228D. In this example, the voltage setting circuit 230D adds a predetermined voltage $V_{REF}$ and the correction voltage $V_{CMP}$, so as to generate the analog reference voltage $V_{REF}$.

$$V_{REF}=K_2 \cdot V_{REG}+K_3 \cdot V_{CMP} \tag{9}$$

In this power supply circuit 220D, the target value $V_{OUT(REF)}$ of the output voltage $V_{OUT}$ is represented by the following Expression (10).

$$V_{OUT(REF)}=(K_2 \cdot V_{REG}+K_3 \cdot V_{CMP})/K_1 \tag{10}$$

By substituting the relation $V_{CMP}=A \times I_{OUT}$ into the Expression (10), the following Expression (11) is obtained.

$$V_{OUT(REF)}=(K_2 \cdot V_{REG}+K_3 \cdot A \times I_{OUT})/K_1 \tag{11}$$

Accordingly, by designing the circuit constant such that the relations $K_2/K_1 \times V_{REG}=V_{DD(MIN)}$ and $K_3 \cdot A/K_1=R$ hold true, the following Expression is obtained.

$$V_{OUT(REF)}=V_{DD(MIN)}+R \times I_{OUT}$$

Description will be made regarding modifications relating to the embodiment 2.

Figure 28:
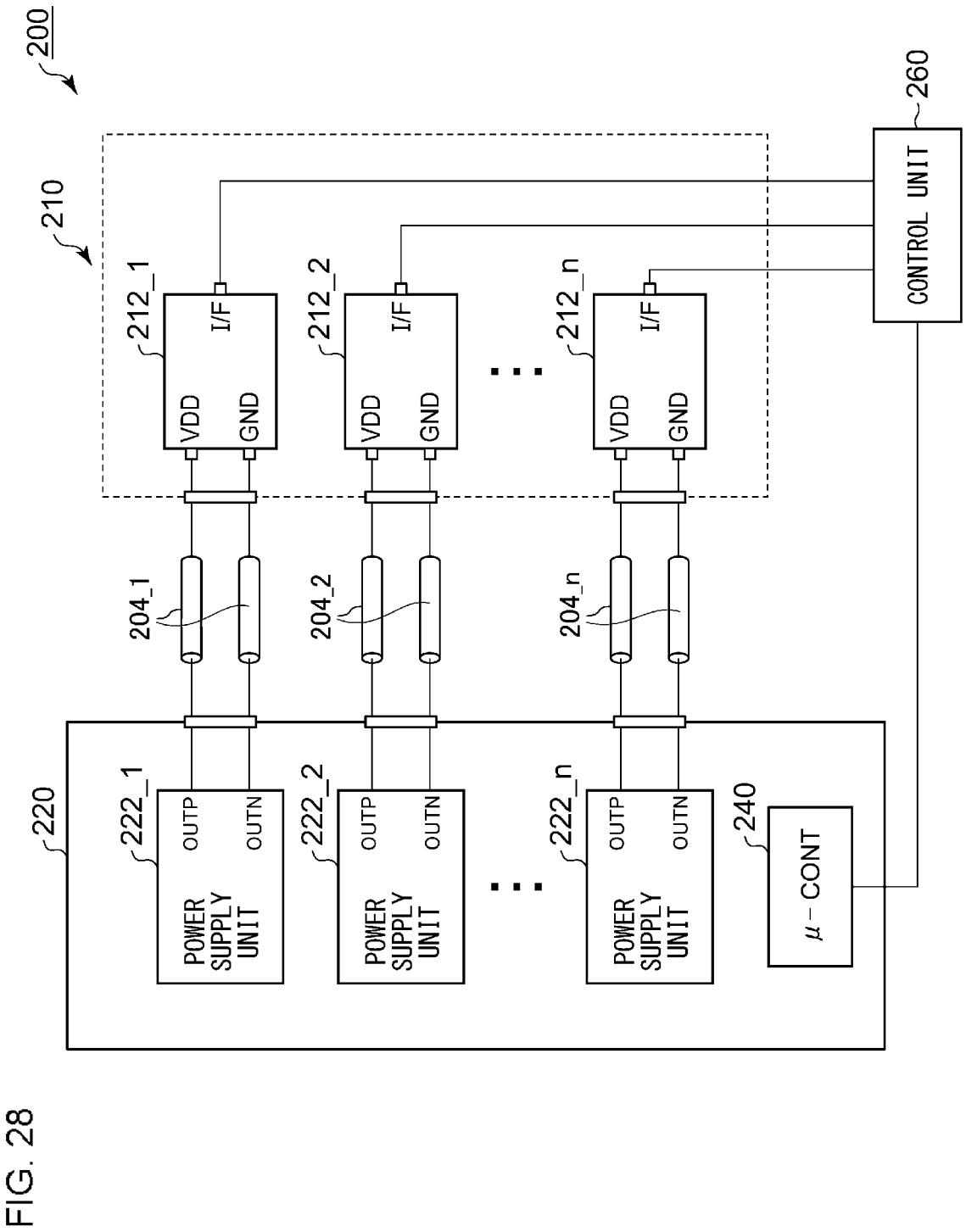
FIG. 28 is a diagram of a headlamp according to an modification 2.1.

FIG. 28 is a diagram showing the headlamp 200 according to a modification 2.1. Description has been made above regarding the variable light distribution light source 210 including a single array-type light-emitting device 212. Also, the variable light distribution light source 210 may include multiple array-type light-emitting devices 212. In this case, the power supply circuit 220 may be configured as a unit (which will be referred to as a "power supply unit 222"). Also, multiple power supply units 222 may be provided corresponding to the multiple array-type light-emitting devices 212. The output terminal of each power supply unit 222 is coupled to the power supply terminal of the corresponding array-type light-emitting device 212 via an independent power supply cable LVDD. Also, a detection line LSNS may preferably be provided for each pair of a power supply unit 222 and an array-type light-emitting device 212 as necessary. In this modification, the microcontroller 240 may be configured as a common component for the multiple power supply units.

In the modification 2.1, the variable light distribution light source 210 has a configuration provided by division thereof into multiple array-type light-emitting devices 212 each having an independent power supply terminal. Furthermore, a power supply unit 222 is provided for each array-type light-emitting device 212. Moreover, each array-type light-emitting device 212 is coupled to a corresponding power supply unit 222 via a power supply cable in a one-to-one manner. This allows the current that flows through the variable light distribution light source 210 to be distributed to multiple DC/DC converters included in the multiple systems. This allows the effects of voltage drop that occurs in each DC/DC converter to be reduced, thereby providing improved load responsiveness. In addition, this allows the number of options for the components of the DC/DC converters, power supply cables, and connectors to be increased, thereby providing an improved degree of design freedom.

Modification 2.2

Figure 29:
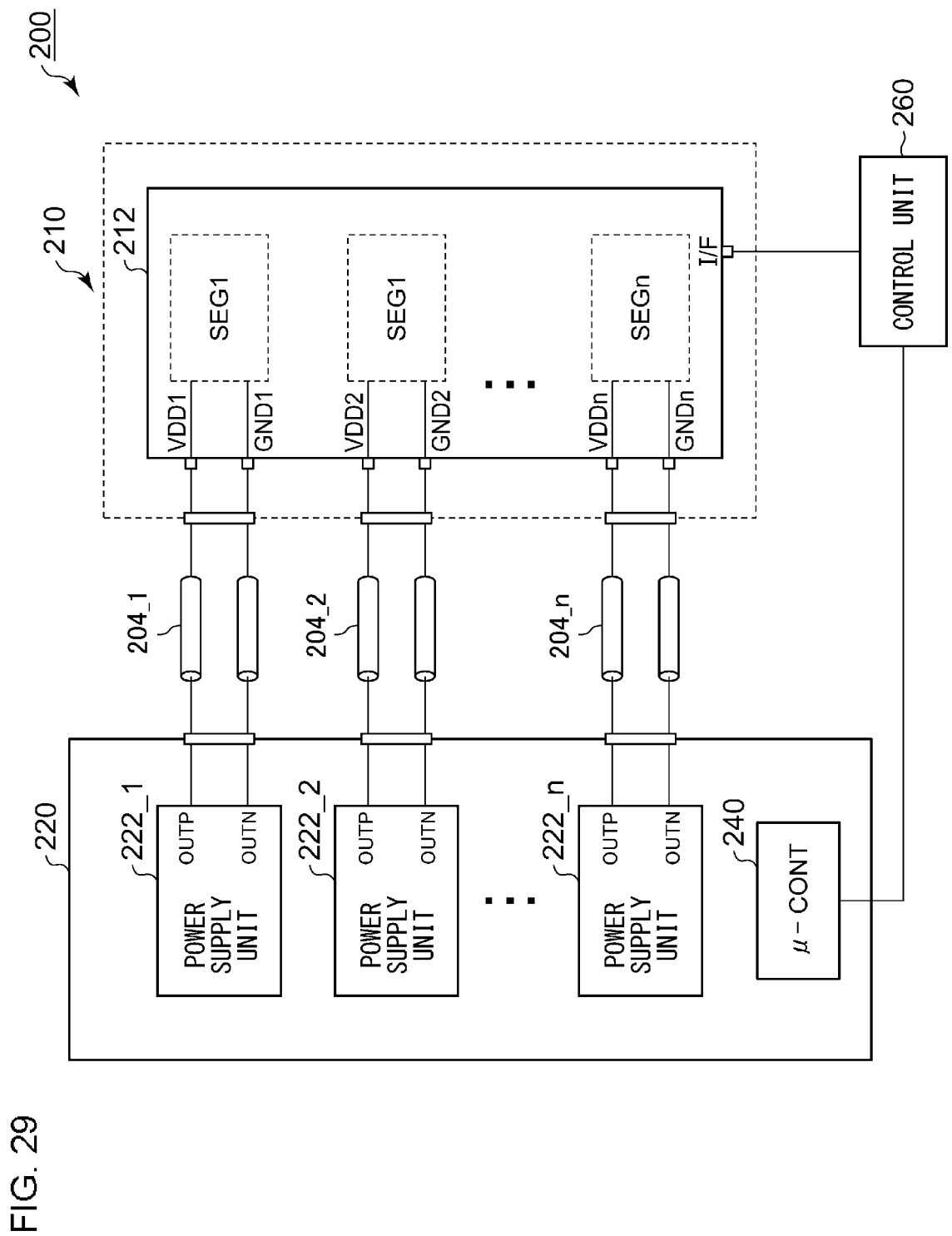
FIG. 29 is a diagram of a headlamp according to an modification 2.2.

FIG. 29 is a diagram showing the headlamp 200 according to a modification 2.2. The array-type light-emitting device 212 may be configured such that the multiple internal light-emitting pixels are divided into multiple segments SEG1 through SEGn. Also, the multiple segments SEG1 through SEGn may be provided with corresponding multiple power supply terminals VDD. The power supply circuit 220 is provided with multiple power supply units 222 corresponding to the multiple power supply terminals VDD. The output terminal OUT of each power supply unit 222 is coupled to the corresponding power supply terminal VDD of the array-type light-emitting device 212 via an independent power supply cable LVDD. Also, a detection line LSNS may preferably be provided for each power supply unit 222 as necessary.

With the modification 2.2, this allows the current that flows through the variable light distribution light source 210 to be distributed to the DC/DC converters included in the multiple systems. Such an arrangement provides the same effects as in the modification 2.1.

Modification 2.3

The power supply unit 222 may be configured as a phase-shift converter. By employing such a phase-shift converter, this allows the ripples that occur in the output voltage $V_{OUTi}$ and the output current $I_{OUTi}$ to be reduced. Furthermore, such an arrangement provides improved efficiency. Furthermore, in a case in which PWM control is employed for each pixel circuit of the array-type light-emitting device 212, the output current $I_{OUTi}$ of the power supply unit 222 fluctuates at high speed according to the lighting-on ratio of the multiple pixel circuits. With this, by employing such a phase-shift converter, such an arrangement provides improved tracking performance (responsiveness) with respect to load fluctuations.

Modification 2.4

Description has been made regarding an arrangement in which the power supply circuit 220 and the control unit 260 are built into the headlamp 200. Also, either one or both of the power supply circuit 220 and the control unit 260 may be arranged outside the body of the headlamp 200. The variable light distribution light source 210 serves as a heat generator. Accordingly, an arrangement in which the control unit 260, which has a weak point with respect to heat, is arranged in the vehicle interior away from the variable light distribution light source 210 is advantageous from a thermal design viewpoint.

Modification 2.5

Description has been made in the examples 2.1 through 2.4 regarding an arrangement in which the power supply control circuit 225 is configured as an analog circuit. Also, a part of or all of the power supply control circuit may be configured as a digital circuit. For example, the power supply control circuit 225 may include a microcontroller. The microcontroller may convert the current detection signal $V_{CS}$ or the output voltage of the amplifier AMP3 into a digital value so as to acquire the voltage drop $V_{DROP}$ across the coupling means 202, and may set the target value $V_{OUT(REF)}$ of the output voltage $V_{OUT}$ by digital signal processing.

Modification 2.6

In the example 2.2 or 2.4, the detection terminal SNS may be coupled to the ground terminal GND of the array-type light-emitting device 212 via the detection line LSNS. In this case, the amplifier AMP2 or AMP3 may preferably amplify the difference between the voltage $V_{SNS}$ of the detection terminal SNS and the voltage of the negative electrode output OUTN of the DC/DC converter 224.

Embodiment 3

Figure 30:
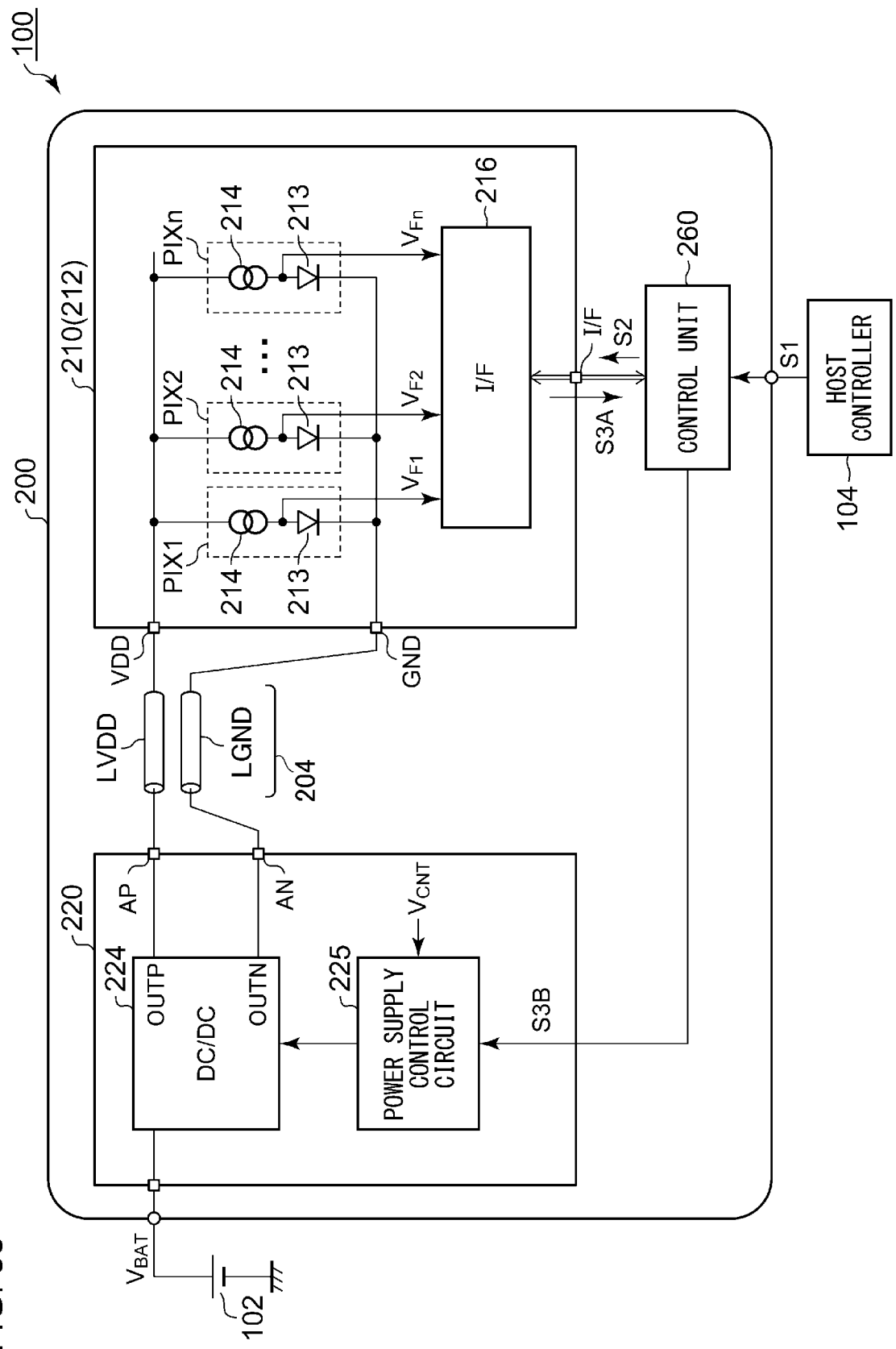
FIG. 30 is a block diagram of a lamp system according to an embodiment 3.

FIG. 30 is a block diagram showing a lamp system 100 according to an embodiment 3. The lamp system 100 is configured as an ADB lamp system including a battery 102, a host controller 104, and a headlamp 200.

The host controller 104 generates a light distribution instruction for the headlamp 200. The light distribution instruction may include a lighting instruction and additional information. The lighting instruction may include a signal for specifying the on/off of the high beam or low beam. A basic light distribution to be formed by the headlamp 200 is determined according to the lighting instruction. On the other hand, the additional information may include data with respect to a region (shielded region) that should not be irradiated with the high beam and information with respect to the vehicle speed, steering angle, etc. The basic light distribution is modified according to the additional information, thereby determining the final light distribution. The host controller 104 may be configured as a vehicle-side ECU. Also, the host controller 104 may be configured as a lamp-side ECU built into the headlamp 200.

The headlamp 200 is configured as an ADB lamp including a variable light distribution light source 210, a power supply circuit 220, and a control unit 260.

The variable light distribution light source 210 is provided with multiple pixels arranged in an array, and is configured to be capable of independently controlling the on/off state of each pixel. In the headlamp 200, the on/off states of the multiple pixels are controlled so as to provide a desired light distribution.

More specifically, the variable light distribution light source 210 includes an array-type light-emitting device 212. The array-type light-emitting device 212 includes n pixel circuits PIX1 through PIXn and a power supply terminal VDD coupled to the multiple pixel circuits PIX1 through PIXn.

Each pixel circuit PIXj (1≤j≤n) includes a light-emitting element 213_j and a current source 214_j provided in series between the power supply terminal VDD and a ground terminal (ground line) GND. The multiple light-emitting elements 213_1 through 213_n are each configured as a semiconductor light-emitting element such as an LED, LD (semiconductor laser), organic EL element, or the like, and are spatially arranged in an array (in a matrix).

The multiple current sources 214_1 through 214_n are each configured to have independently controllable on/off states. When the j-th current source 214_j is turned on, the corresponding light-emitting element 213_j emits light. That is to say, the corresponding pixel circuit PIXj is set to the lighting-on state.

An interface circuit 216 controls the on/off states of the current sources 214_1 through 214_n according to a control signal S2 from the control unit 260. The interface circuit 216 is coupled to the control unit 260 via a high-speed serial interface, and receives the control signal S2 for specifying the on/off states of all the pixels.

Furthermore, the interface circuit 216 is configured to monitor the voltage drops (i.e., forward voltages) $V_{F1}$ through $V_{Fn}$ of the light-emitting elements 213 of the multiple respective pixel circuits PIX1 through PIXn, and to generate data S3A including information with respect to the forward voltages $V_{F1}$ through $V_{Fn}$. In the present embodiment, the data S3A is transmitted to the power supply circuit 220 as data S3B via the control unit 260.

The power supply circuit 220 supplies electric power to the variable light distribution light source 210. The power supply circuit 220 includes a converter for outputting a constant voltage. The power supply circuit 220 supplies the stabilized power supply voltage $V_{DD}$ to the power supply terminal VDD of the array-type light-emitting device 212. The power supply voltage $V_{DD}$ is determined based on $V_F + V_{SAT}$. Typically, the power supply voltage $V_{DD}$ is set to on the order of 4 to 5 V. Here, $V_F$ represents the forward voltage of the light-emitting element 213, and $V_{SAT}$ represents the minimum operating voltage of the current source 214. Accordingly, the power supply circuit 220 may be configured as a step-down converter (Buck converter) that steps down a battery voltage $V_{BAT}$ on the order of 12 V (or 24 V).

The control unit 260 receives a light distribution instruction S1 from the host controller 104, generates a control signal S2 that corresponds to the light distribution instruction S1, and transmits the control signal S2 to the variable light distribution light source 210. The control unit 260 will also be referred to as a "drawing ECU". For example, the control unit 260 PWM-controls the multiple pixel circuits PIX1 through PIXn of the array-type light-emitting device 212 so as to control the light distribution. A PWM frequency of several hundred Hz (e.g., 100 to 400 Hz) is employed. Accordingly, the PWM cycle is set to several milliseconds to several dozen milliseconds (ms).

Next, description will be made regarding a configuration of the power supply circuit 220. The power supply circuit 220 includes output terminals AP/AN, a ground terminal GND, a DC/DC converter 224, and a power supply control circuit 225.

The output terminals AP/AN are coupled to the power supply terminal VDD and the ground terminal GND of the array-type light-emitting device 212 via a power supply cable 204. The power supply cable 204 includes a power supply line LVDD and a ground line LGND. The positive electrode output OUTP of the DC/DC converter 224 is coupled to the power supply terminal VDD of the array-type light-emitting device 212 via the output terminal AP and the power supply line LVDD. The negative electrode output OUTN of the DC/DC converter 224 is coupled to the ground terminal GND of the array-type light-emitting device 212 via the output terminal AN and the ground line LGND. The voltage $V_{BAT}$ is supplied to the input of the DC/DC converter 224 from the battery.

The power supply control circuit 225 receives the data S3B from the control unit 260. The power supply control circuit 225 determines a target value $V_{CNT(REF)}$ of the control target voltage $V_{CNT}$ based on the data S3B thus received. The power supply control circuit 225 controls the DC/DC converter 224 such that the control target voltage $V_{CNT}$ approaches the target value $V_{CNT(REF)}$.

Also, the control target voltage $V_{CNT}$ may be the power supply voltage $V_{DD}$ of the array-type light-emitting device 212. Also, the control target voltage $V_{CNT}$ may be the output voltage $V_{OUT}$ of the DC/DC converter 224. Detailed description thereof will be described later.

The target value $V_{CNT(REF)}$ of the control target voltage $V_{CNT}$ may correspond to the maximum value $V_{F(MAX)}$ of the forward voltages $V_{F1}$ through $V_{Fn}$ of the light-emitting elements 213 for all the channels. For example, the data S3B received by the power supply control circuit 225 may include the forward voltages $V_{F1}$ through $V_{Fn}$ of the light-emitting elements 213 for all the channels. In this case, the power supply control circuit 225 may acquire the maximum value $V_{F(MAX)}$ of the forward voltages $V_{F1}$ through $V_{Fn}$, and may generate the target value $V_{CNT(REF)}$ based on the maximum value $V_{F(MAX)}$. Alternatively, the control unit 260 may acquire the maximum value $V_{F(MAX)}$ of the forward voltages $V_{F1}$ through $V_{Fn}$, and may transmit the data S3B including the maximum value $V_{F(MAX)}$ to the power supply control circuit 225.

Figure 31A:
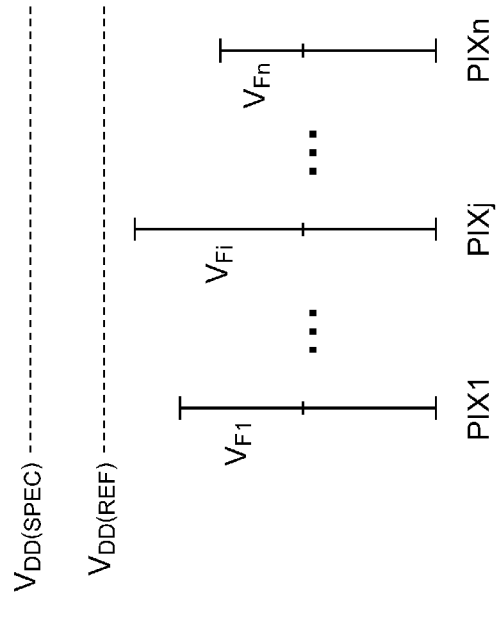
FIGS. 31A and 31B are diagrams each showing the operation of a lamp system.
Figure 31B:
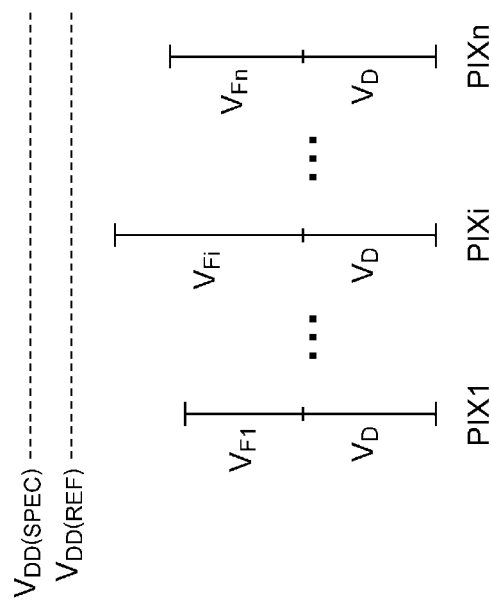

The above is the configuration of the lamp system 100. FIGS. 31A and 31B are diagrams each showing the operation of the lamp system 100. Description will be made assuming that the control target voltage $V_{CNT}$ is the power supply voltage VDD of the array-type light-emitting device 212.

FIGS. 31A and 31B show the operations of different individual lamp systems 100. FIG. 31A shows the operation in a case in which the forward voltage $V_{F1}$ of the i-th pixel PIXi of the array-type light-emitting device 212 is the maximum value $V_{F(MAX)}$. The target value $V_{DD(REF)}$ of the power supply voltage $V_{DD}$ employed as the control target voltage $V_{CNT}$ may be determined based on VDD(REF)=$V_D$+$V_{Fi(MAX)}$+α. Here, $V_D$ represents the voltage drop across the current source 214, and α represents a margin.

FIG. 31B shows the operation in a case in which the forward voltage $V_{Fj}$ of the j-th pixel PIXj of the array-type light-emitting device 212 is the maximum value $V_{F(MAX)}$. The target value $V_{DD(REF)}$ of the power supply voltage $V_{DD}$ employed as the control target voltage $V_{CNT}$ to be controlled may be determined based on $V_{DD(REF)}=V_D+V_{Fj(MAX)}+α$.

As shown in FIGS. 31A and 31B, with such an arrangement in which the target value $V_{DD(REF)}$ is determined using the forward voltages $V_F$ measured for each actual product, this allows the power supply voltage $V_{DD}$ to be reduced such that it is lower than the value $V_{DD(SPEC)}$ defined in the specification. This allows the power consumption of the array-type light-emitting device 212 to be reduced.

Figure 32:
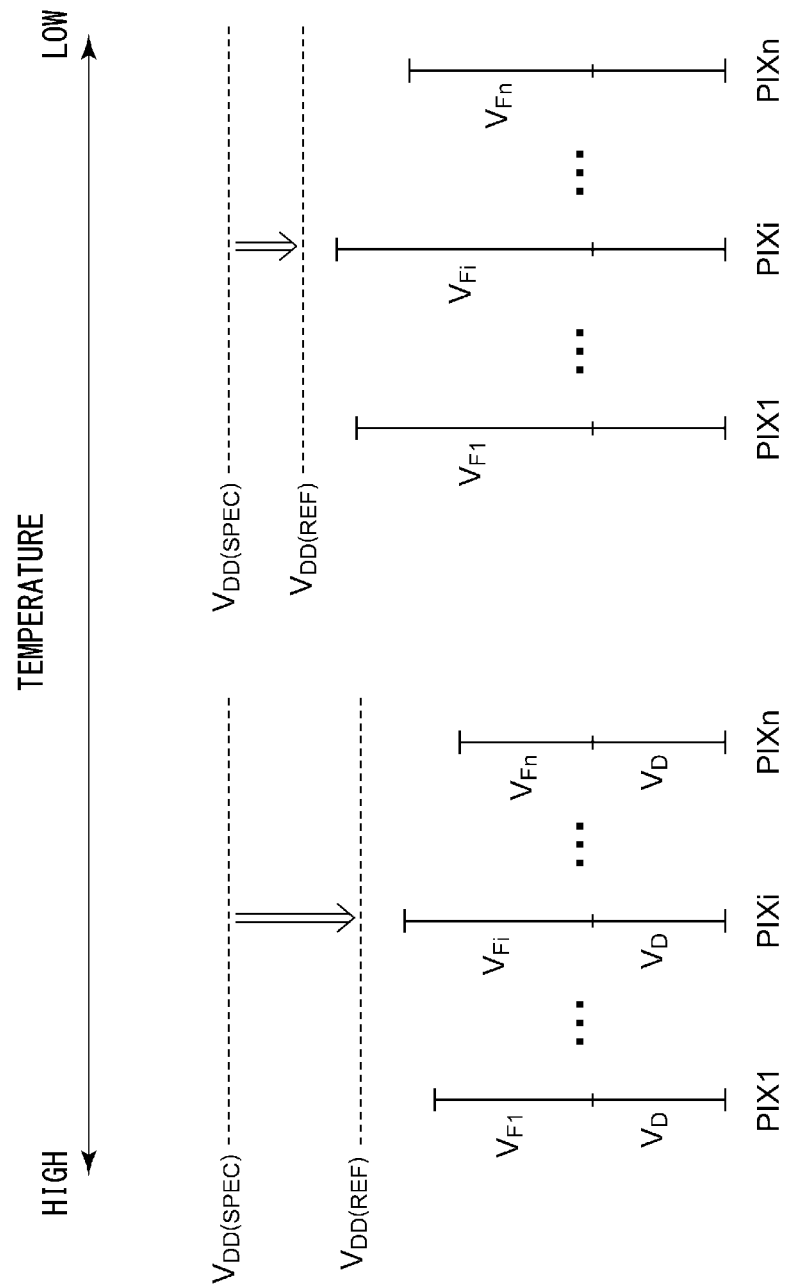
FIG. 32 is a diagram showing the operation of a lamp system.

FIG. 32 is a diagram showing the operation of the lamp system 100. FIG. 32 shows the operations of a single lamp system 100 in different temperature environments. The forward voltage $V_F$ of the LED has temperature dependence. Specifically, as the temperature becomes higher, the forward voltage $V_F$ of the LED becomes smaller. With the present embodiment, such an arrangement is capable of adaptively setting the target value $V_{DD(REF)}$ of the control target voltage VDD according to the temperature, thereby allowing power consumption to be reduced.

The above is the operation of the lamp system 100. With the lamp system 100, the information with respect to the voltage drop $V_F$ included in the data S3B is modified in a real-time manner such that it is reflected in the feedback control of the power supply circuit 220, thereby allowing the power consumption to be reduced. Specifically, by monitoring the forward voltage $V_F$ of each light-emitting element 213 that is actually operating, such an arrangement is capable of accurately estimating the actual minimum operating voltage $V_{DD(MIN)}$ of the array-type light-emitting device 212. The minimum operating voltage $V_{DD(MIN)}$ thus estimated reflects individual variation or temperature variation of the array-type light-emitting device 212. Specifically, the minimum operating voltage $V_{DD(MIN)}$ thus estimated is lower than the value $V_{DD(SPEC)}$ defined in the specification. Accordingly, by dynamically determining the operating conditions of the power supply circuit 220 based on the accurate minimum operating voltage $V_{DD(MIN)}$, this allows the power supply voltage VDD supplied to the array-type light-emitting device 212 to be reduced, thereby allowing the power consumption to be reduced.

The present invention encompasses various kinds of apparatuses and methods that can be regarded as a block configuration or a circuit configuration shown in FIG. 30, or otherwise that can be derived from the aforementioned description. That is to say, the present invention is not restricted to a specific configuration. More specific description will be made below regarding an example configuration or a modification for clarification and ease of understanding of the essence of the present invention and the operation. That is to say, the following description will by no means be intended to restrict the technical scope of the present invention.

Example 3.1

Figure 33:
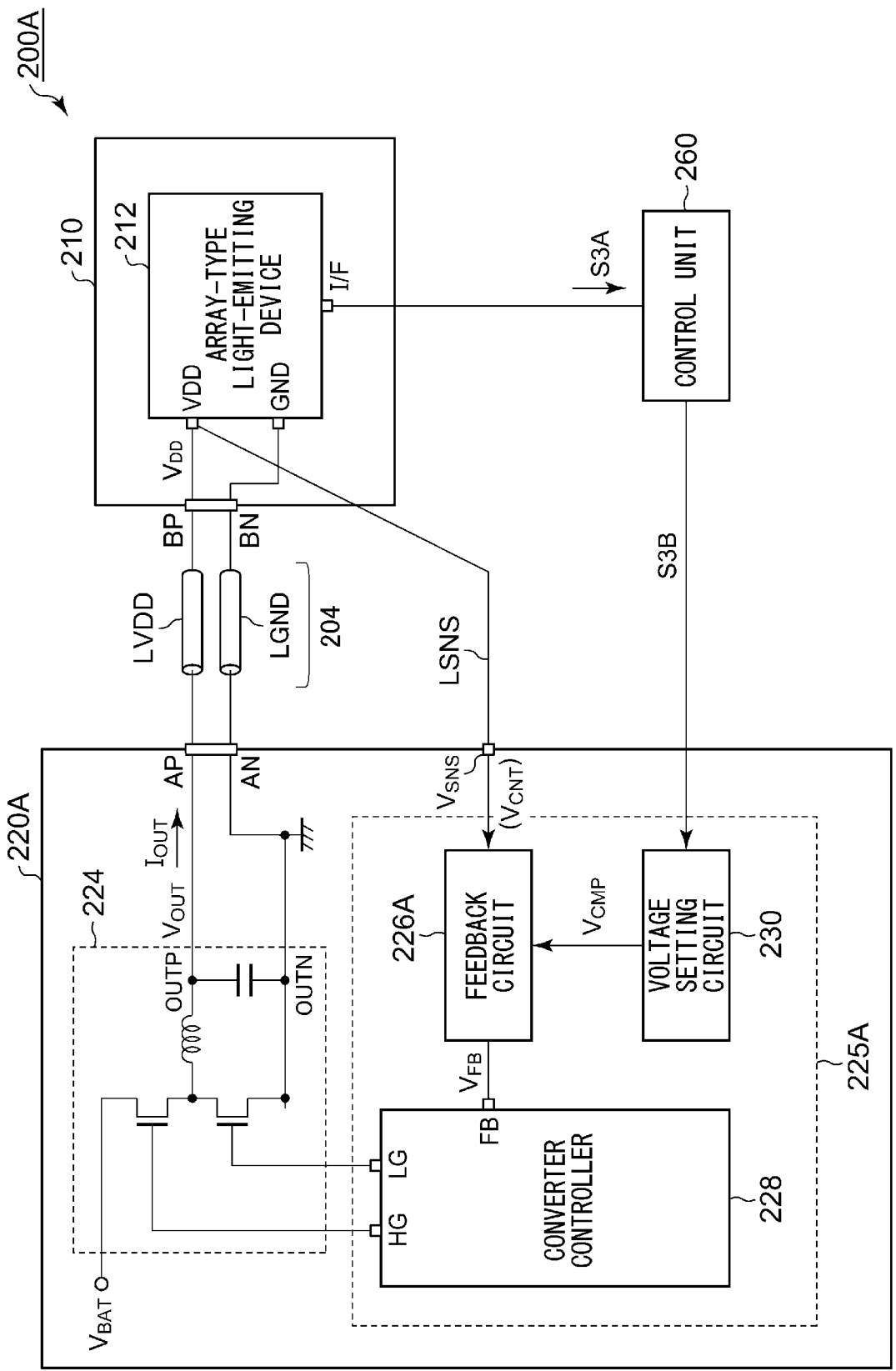
FIG. 33 is a block diagram of a headlamp according to an example 3.1.

FIG. 33 is a block diagram showing a headlamp 200A according to an example 3.1. The headlamp 200A includes a variable light distribution light source 210, a power supply circuit 220A, and a control unit 260.

The power supply circuit 220A includes an output terminal OUT, a detection terminal SNS, a DC/DC converter 224, and a power supply control circuit 225A. The power supply control circuit 225A includes a feedback circuit 226A, a converter controller 228, and a voltage setting circuit 230.

As the converter controller 228, a commercially available DC/DC converter control integrated circuit (IC) may be employed. The converter controller 228 generates a pulse signal where at least one from among the pulse width, frequency, and duty cycle is controllable, that is adjusted such that the feedback voltage $V_{FB}$ input to the feedback pin FB approaches the internally generated reference voltage $V_{REF}$. With this, the converter controller 228 feedback controls the DC/DC converter 224 according to the pulse signal.

The voltage setting circuit 230 receives the input of data S3B generated by the array-type light-emitting device 212. The voltage setting circuit 230 generates a correction voltage $V_{CMP}$ based on the data S3B thus received. The feedback circuit 226A generates the feedback voltage $V_{FB}$ based on the correction voltage $V_{CMP}$ and a control target voltage $V_{CNT}$ that corresponds to the output voltage $V_{OUT}$ of the DC/DC converter 224, and supplies the feedback voltage $V_{FB}$ to the feedback pin FB of the converter controller 228. The feedback voltage $V_{FB}$ is a signal that changes according to each of the control target voltage $V_{CNT}$ and the correction voltage $V_{CMP}$. The feedback voltage $V_{FB}$ is represented by the following Expression (1).

$$V_{FB}=K_1 \cdot V_{CNT}+K_2 \cdot V_{CMP} \quad (1)$$

Here, $K_1$ is a constant that is larger than 0, and $K_2$ is a non-zero constant. Description will be made assuming that $K_2<0$. The converter controller 228 controls the DC/DC converter 224 such that the feedback signal $V_{FB}$ approaches the target value $V_{REF}$.

In a steady state in which the system is stabilized, the relation $K_1 \cdot V_{CNT}+K_2 \cdot V_{CMP}=V_{REF}$ holds true. Accordingly, in the steady state, the control target voltage $V_{CNT}$ is stabilized to the target value $V_{CNT(REF)}$.

$$V_{CNT(REF)}=(V_{REF}-K_2 \cdot V_{CMP})/K_1 \quad (2)$$

In the example 3.1, as the control target voltage $V_{CNT}$, the voltage $V_{DD}$ at the power supply terminal VDD of the array-type light-emitting device 212 is employed.

The detection terminal SNS of the power supply circuit 220A is coupled to the power supply terminal VDD of the array-type light-emitting device 212 via a detection line (single-signal line) separate from the power supply cable 204 (power supply line LVDD). The feedback circuit 226A has a sufficiently high input impedance. Accordingly, no current flows through the detection line LSNS. Accordingly, the detection voltage $V_{SNS}$ is equal to the voltage $V_{DD}$ at the power supply terminal VDD of the array-type light-emitting device 212. The detection voltage $V_{SNS}$ that occurs at the detection terminal SNS is input to the feedback circuit 226A as the control target voltage $V_{CNT}$. Accordingly, the target voltage $V_{DD(REF)}$ of the power supply voltage $V_{DD}$ is represented by the following Expression (3).

$$V_{DD(REF)}=(V_{REF}-K_2 \cdot V_{CMP})/K_1 \quad (3)$$

That is to say, by changing the correction voltage $V_{CMP}$ according to the data S3B, this is capable of changing the target value $V_{DD(REF)}$ of the power supply voltage $V_{DD}$.

Figure 34:
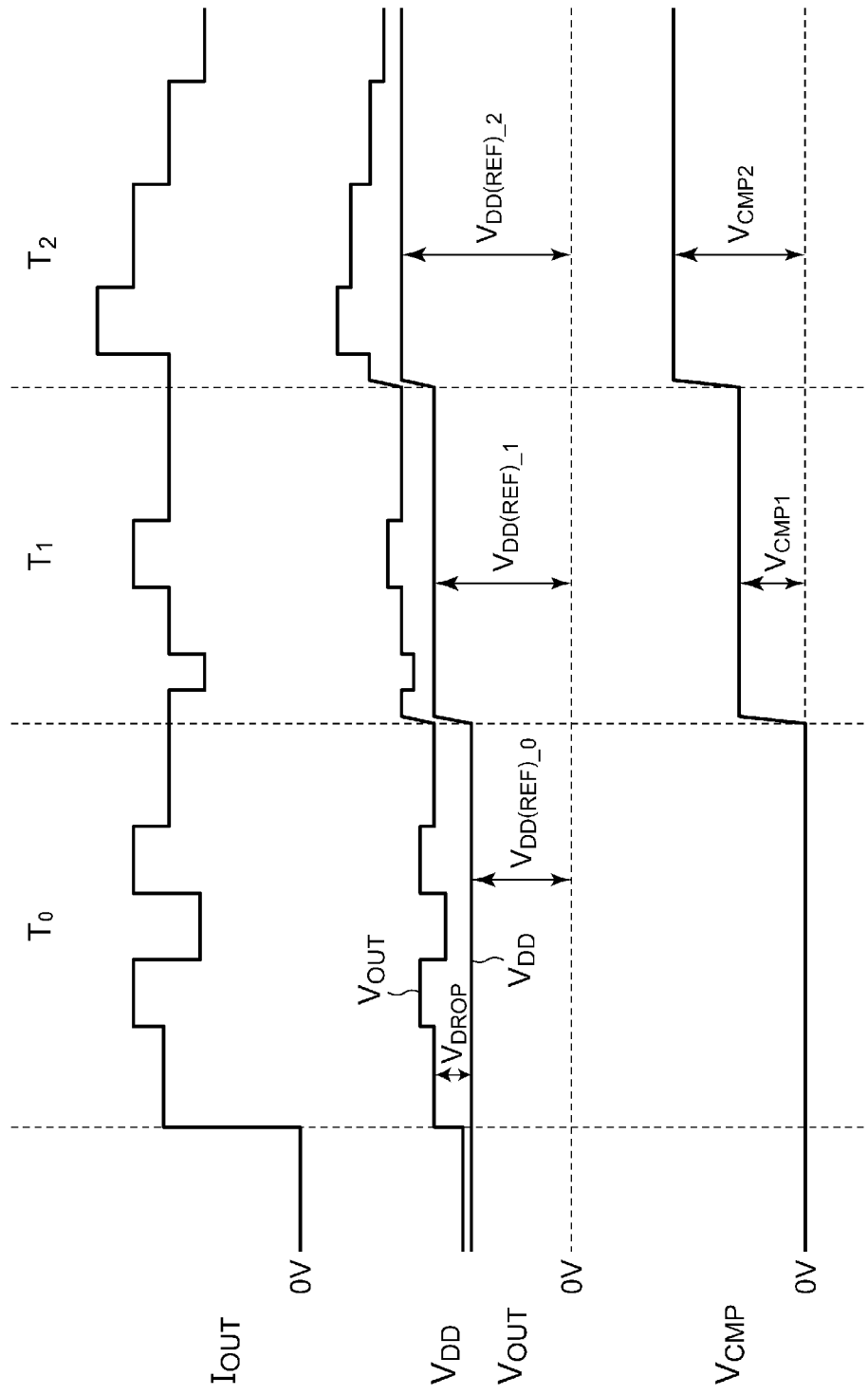
FIG. 34 is an operation waveform diagram of a headlamp shown in FIG. 33.

The above is the configuration of the headlamp 200A. Next, description will be made regarding the operation thereof. FIG. 34 is an operation waveform diagram of the headlamp 200A shown in FIG. 33. In the period $T_0$, the correction voltage $V_{CMP}$ is set to 0 V. The power supply voltage $V_{DD}$ is stabilized to $V_{DD(REFF)\_0}=V_{REF}/K_1$ in the period $T_0$. The output voltage $V_{OUT}$ of the DC/DC converter 224 is a voltage that is higher than the power supply voltage $V_{DD}$ by a voltage drop $V_{DROP}$ in the power supply line LVDD, connector, etc., which is represented by the following Expression (4).

$$V_{OUT}=V_{DD}+V_{DROP}=V_{DD}+R \times I_{OUT} \quad (4)$$

Here, "R" represents the impedance of the power supply line LVDD and the connector. During a period in which the headlamp 200A is turned on, the operating current $I_{OUT}$ of the array-type light-emitting device 212 fluctuates. Over a long time scale, an average value of the output current $I_{OUT}$ fluctuates according to the light distribution formed by the headlamp 200A. Furthermore, over a short time scale, an instantaneous value of the output current $I_{OUT}$ changes with the PWM control cycle. FIG. 34 shows the change of the output current $I_{OUT}$ over a long time scale or a short time scale. With the example 3.1, the power supply voltage $V_{DD}$ is stabilized, and the output voltage $V_{OUT}$ changes according to the output current $I_{OUT}$.

In the period $T_1$, the correction voltage $V_{CMP}$ is set to a positive value $V_{CMP1}$. The target value $V_{DD(REF)\_1}$ of the power supply voltage $V_{DD}$ in the period $T_1$ is represented by $V_{DD(REF)\_1}=(V_{REF}-K_2 \cdot V_{CMP1})/K_1$. Here, $K_2$ represents a negative constant. Accordingly, the target value $V_{DD(REF)}$ of the power supply voltage $V_{DD}$ is represented by $V_{DD(REF)\_1}=(V_{REF}+|K_2| \cdot V_{CMP1})/K_1$. That is to say, the target value $V_{DD(REF)}$ is a voltage obtained by applying a positive offset of $|K_2| \cdot V_{CMP1}/K_1$ to the target value $V_{DD(REF)\_0}$ to be set for the period $T_0$.

In the period $T_2$ in which the correction voltage $V_{CMP}$ is further increased to $V_{CMP2}$, the target value $V_{DD(REF)\_2}$ of the power supply voltage $V_{DD}$ is set to $V_{DD(REF)\_2}=(V_{REF}-K_2 \cdot V_{CMP2})/K_1$. That is to say, the target value $V_{DD(REF)}$ is set to a voltage obtained by applying a positive offset of $|K_2|V_{CMP2}/K_1$ to the target value $V_{DD(REF)\_0}$ to be set for the period $T_0$.

The above is the operation of the headlamp 200A. With the headlamp 200A, by changing the correction voltage $V_{CMP}$ based on the data S3B, such an arrangement is capable of controlling the target value $V_{DD(REF)}$ of the voltage $V_{DD}$ at the power supply terminal VDD of the array-type light-emitting device 212 in a flexible manner.

Next, description will be made regarding example configurations of the voltage setting circuit 230 and the feedback circuit 226A.

Figure 35:
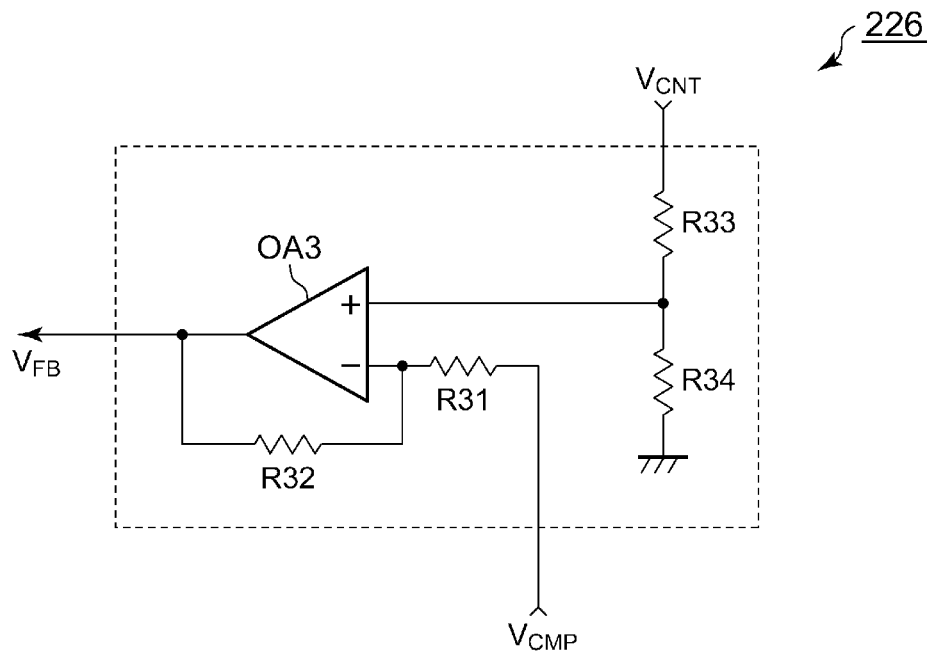
FIG. 35 is a circuit diagram showing an example configuration of a feedback circuit.

FIG. 35 is a circuit diagram showing an example configuration of the feedback circuit 226A. The feedback circuit 226A is configured as a subtraction circuit including an operational amplifier. Specifically, the feedback circuit 226A includes resistors R31 through R34 and an operational amplifier OA3. The input/output characteristics of the feedback circuit 226A are represented by the following Expression (5).

$$V_{FB}=(R31+R32)/R31\times\{R34/(R33+R34)\times V_{CNT}-R32/(R31+R32)\times V_{CMP}\} \quad (5)$$

In contrast to Expressions (1) and (5), the following expressions can be obtained.

$$K_1=(R31+R32)/R31\times R34/(R33+R34)$$

$$K_2=-(R31+R32)/R31\times R32/(R31+R32)$$

It should be noted that the feedback circuit 226A may be configured as an adder circuit employing an operational amplifier. In this case, $K_1>0$ and $K_2>0$ hold true. In a case in which the correction voltage $V_{CMP}$ is a positive value, the target value of the control target voltage $V_{CNT}$ can be shifted toward the low electric potential side according to the correction voltage $V_{CMP}$.

Figure 36:
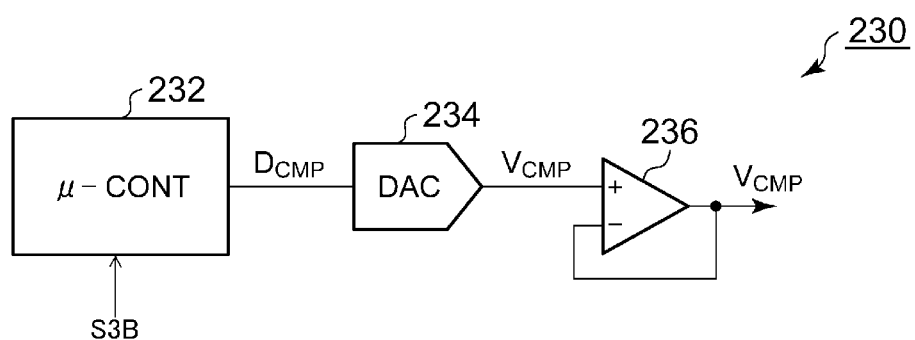
FIG. 36 is a circuit diagram showing an example configuration of a voltage setting circuit.

FIG. 36 is a circuit diagram showing an example configuration of the voltage setting circuit 230. The voltage setting circuit 230 includes a microcontroller 240, a D/A converter 234, and a buffer 236. The microcontroller 240 generates a digital setting value $D_{CMP}$ for specifying the correction voltage $V_{CMP}$ according to the data S3B with respect to the forward voltage $V_F$ of each light-emitting element 213. By employing the microcontroller 240, such an arrangement allows the correction voltage $V_{CMP}$ to be controlled by software.

The D/A converter 234 converts the setting value $D_{CMP}$ generated by the microcontroller 240 into an analog correction voltage $V_{CMP}$. The correction voltage $V_{CMP}$ is supplied to the feedback circuit 226A via the buffer 236. It should be noted that, in a case in which the D/A converter 234 has a sufficiently low output impedance, the buffer 236 may be omitted. Also, in a case of employing the microcontroller 240 including the D/A converter as a built-in component, the D/A converter 234 is provided as an internal component of the microcontroller 240.

Example 3.2

Figure 37:
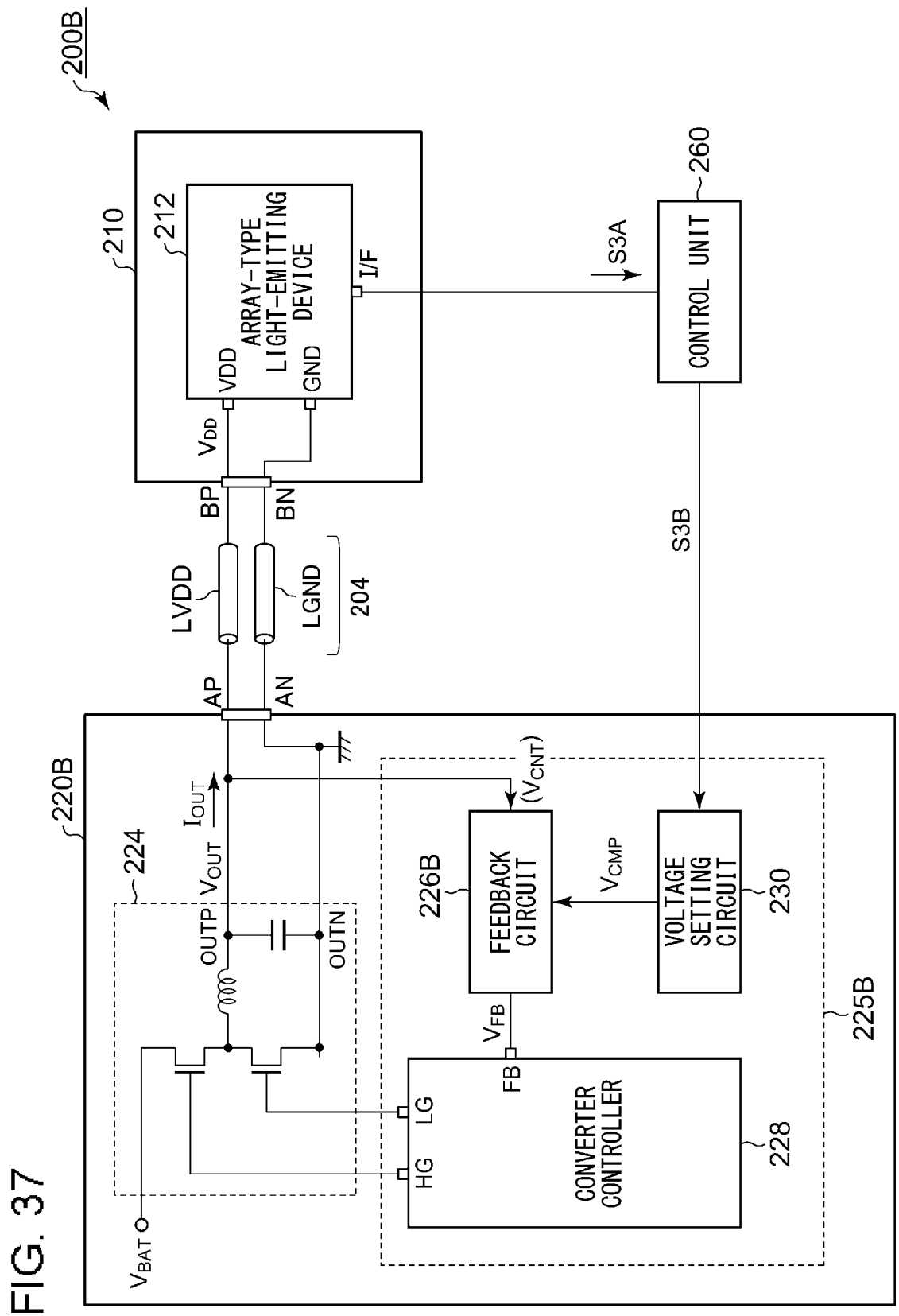
FIG. 37 is a block diagram of a headlamp according to an example 3.2.

FIG. 37 is a block diagram showing a headlamp 200B according to an example 3.2. Description will be made regarding the configuration of the headlamp 200B directing attention to the points of difference from the example 3.1. The headlamp 200B includes a variable light distribution light source 210, a power supply circuit 220B, and a control unit 260. In the example 3.2, the power supply circuit 220B has a configuration that differs from that of the power supply circuit 220A according to the example 3.1.

The power supply circuit 220B includes an output terminal OUT, a DC/DC converter 224, and a power supply control circuit 225B. The power supply control circuit 225B includes a feedback circuit 226B, a converter controller 228, and a voltage setting circuit 230.

In the example 3.2, the output voltage $V_{OUT}$ of the DC/DC converter 224 is employed as the control target voltage $V_{CNT}$. The output voltage $V_{OUT}$ that occurs at the output terminal OUT is input as the control target voltage $V_{CNT}$ to the feedback circuit 226B. Accordingly, the target voltage $V_{OUT(REF)}$ of the output voltage $V_{OUT}$ is represented by the following Expression (6). As with the feedback circuit 226A according to the example 3.1, the feedback circuit 226B may be configured as a subtraction circuit.

$$V_{OUT(REF)}=(V_{REF}-K_2\cdot V_{CMP})/K_1 \quad (6)$$

The correction voltage $V_{CMP}$ is generated such that the target value $V_{OUT(REF)}$ matches $V_{F(MAX)}+V_D+\alpha+V_{DROP}$. Here, "$V_{DROP}$" represents a voltage drop across the power supply line LVDD and a connector, which is represented by $V_{DROP}=I_{OUT}\times R$. $I_{OUT}$ changes with time. Accordingly, the value of the voltage drop $V_{DROP}$ may be determined assuming the maximum current $I_{OUT(MAX)}$.

Alternatively, as described in example 3.3, the voltage drop $V_{DROP}$ may be detected. Also, the correction voltage $V_{CMP}$ may be adjusted such that it reflects the voltage drop $V_{DROP}$ thus measured.

Figure 38:
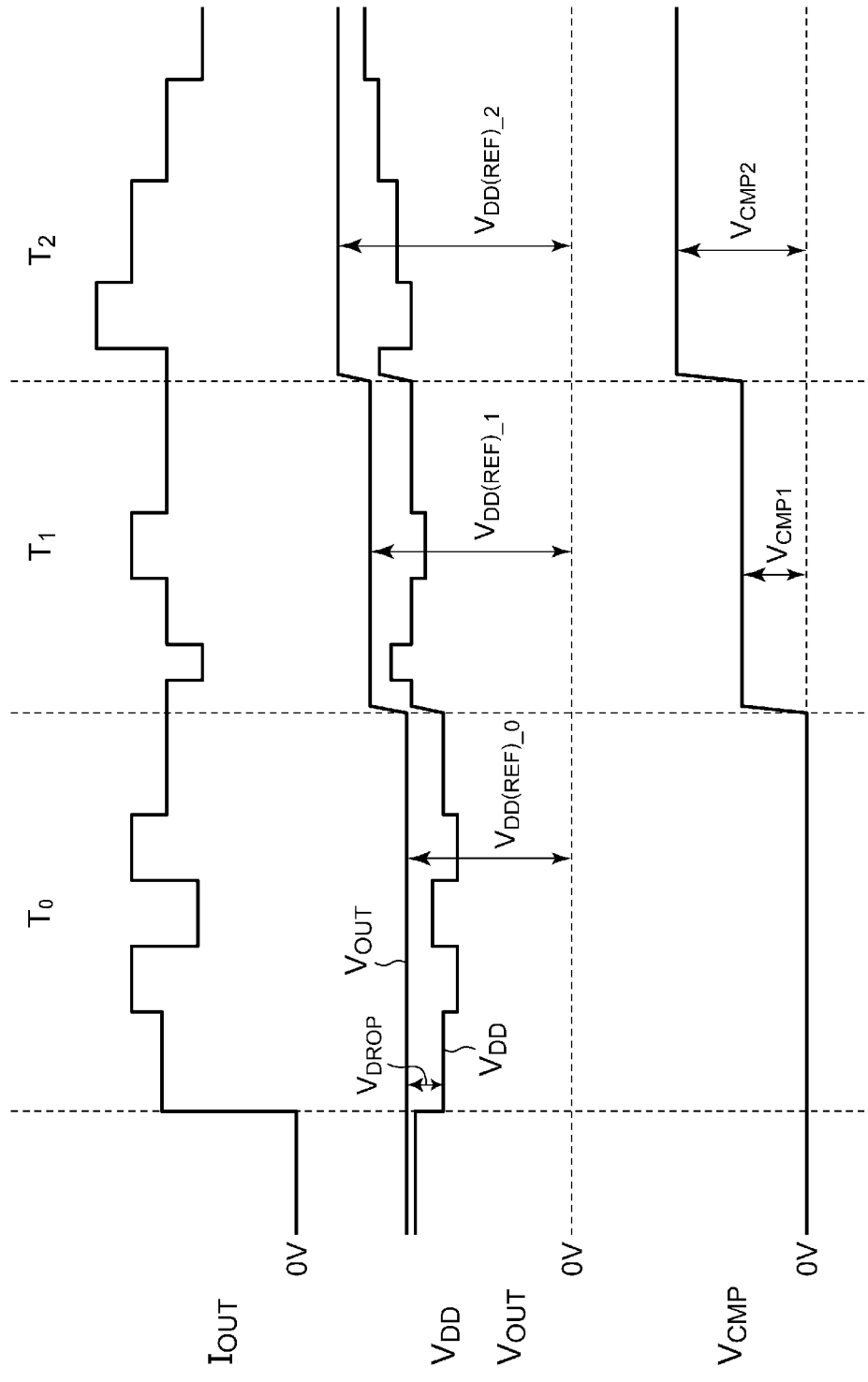
FIG. 38 is an operation waveform diagram of the headlamp shown in FIG. 37.

The above is the configuration of the headlamp 200B. Next, description will be made regarding the operation thereof. FIG. 38 is an operation waveform diagram of the headlamp 200B shown in FIG. 37. During the period $T_0$, the correction voltage $V_{CMP}$ is set to 0 V. The output voltage $V_{OUT}$ in the period $T_0$ is stabilized to $V_{OUT(REF)\_0}=V_{REF}/K_1$.

The power supply voltage $V_{DD}$ supplied to the array-type light-emitting device 212 is a voltage that is lower than the output voltage $V_{OUT}$ by the voltage drop $V_{DROP}$ across the power supply line LVDD, connector, etc., which is represented by the following Expression (7).

$$V_{DD}=V_{OUT}-V_{DROP}=V_{OUT}-R\times I_{OUT} \quad (7)$$

Here, "R" represents the impedance of the power supply line LVDD and a connector. During a period in which the headlamp 200B is turned on, the operating current $I_{OUT}$ of the array-type light-emitting device 212 fluctuates. Accordingly, with the example 3.2, the output voltage $V_{OUT}$ is stabilized, and the power supply voltage $V_{DD}$ fluctuates according to the output current $I_{OUT}$.

In the period $T_1$, the correction voltage $V_{CMP}$ is set to a positive value $V_{CMP1}$. The target value $V_{OUT(REF)\_1}$ of the output voltage $V_{OUT}$ in the period $T_1$ is set to $V_{OUT(REF)\_1}=(V_{REF}-K_2\cdot V_{CMP1})/K_1$. Here, $K_2$ represents a negative constant. Accordingly, the target value $V_{OUT(REF)}$ of the output voltage $V_{OUT}$ is represented by $V_{OUT(REF)}\_1=(V_{REF}+|K_2|\cdot V_{CMP1})/K_1$. That is to say, the target value $V_{OUT(REF)}$ is a voltage obtained by applying a positive offset of $|K_2|\cdot V_{CMP1}/K_1$ to the target value $V_{OUT(REF)\_0}$ to be set for the period $T_0$.

In the period $T_2$ in which the correction voltage $V_{CMP}$ is further increased to $V_{CMP2}$, the target value $V_{OUT(REF)\_2}$ of the output voltage $V_{OUT}$ is set to $V_{OUT(REF)\_2}=(V_{REF}-K_2\cdot V_{CMP2})/K_1$. That is to say, the target value is set to a voltage obtained by applying a positive offset of $|K_2|\cdot V_{CMP2}/K_1$ to the target value $V_{DD(REF)\_0}$ to be set for the period $T_0$.

The above is the operation of the headlamp 200B. With the headlamp 200B, this is capable of setting the output voltage $V_{OUT}$ of the DC/DC converter 224 in a flexible manner according to the correction voltage $V_{CMP}$. As a result, this is capable of setting the voltage $V_{DD}$ of the power supply terminal VDD of the array-type light-emitting device 212.

Example 3.3

Figure 39:
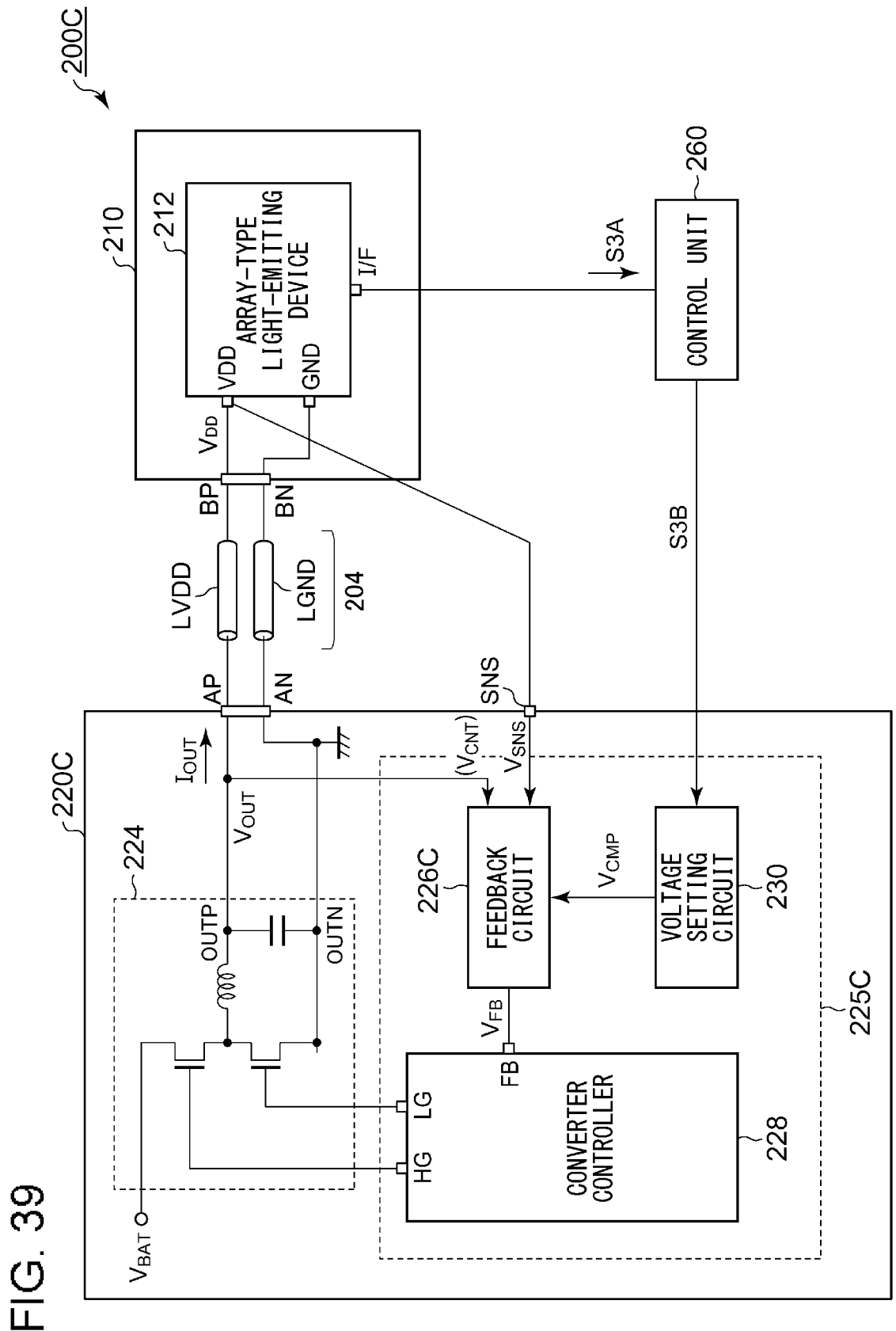
FIG. 39 is a block diagram of a headlamp according to an example 3.3.

FIG. 39 is a block diagram showing a headlamp 200C according to an example 3.3. Description will be made regarding a configuration of the headlamp 200C directing attention to the points of difference from the example 3.2.

The headlamp 200C includes a variable light distribution light source 210, a power supply circuit 220C, and a control unit 260. In the example 3.3, the power supply circuit 220C has a configuration that differs from that of the power supply circuit 220B according to the example 3.2.

Description will be made regarding the configuration of the power supply circuit 220C. The power supply circuit 220C includes an output terminal OUT, a detection terminal SNS, a DC/DC converter 224, and a power supply control circuit 225C.

The power supply control circuit 225C includes a feedback circuit 226C, a converter controller 228, and a voltage setting circuit 230.

The feedback circuit 226C receives an input of the output voltage $V_{OUT}$ as the control target voltage $V_{CNT}$. Furthermore, the feedback circuit 226C receives an input of the power supply voltage $V_{DD}$ via the detection line LSNS. Moreover, the feedback circuit 226C receives an input of the correction voltage $V_{CMP}$ generated by the voltage setting circuit 230.

The feedback circuit 226C generates the feedback voltage $V_{FB}$ based on the three voltages $V_{OUT}$, $V_{SNS}$, and $V_{CMP}$. The feedback circuit 226C detects the voltage drop $V_{DROP}=V_{OUT}-V_{SMS}$ across the power supply line LVDD based on the difference between $V_{OUT}$ and $V_{SNS}$.

The feedback voltage $V_{FB}$ generated by the feedback circuit 226C is represented by the following Expression (8).

$$V_{FB}=K_1 \cdot V_{OUT}+K_2 \cdot V_{CMP}+K_3 \cdot V_{DROP} \tag{8}$$

The above is the configuration of the headlamp 200C. In the headlamp 200C, the target value $V_{OUT(REF)}$ of the output voltage $V_{OUT}$, which is a control target voltage, is represented by the following Expression (9).

$$V_{OUT(REF)}=(V_{REF}-K_2 \cdot V_{CMP}-K_3 \cdot V_{DROP})/K_1 \tag{9}$$

Assuming that $K_2<0$ and $K_3<0$ hold true, the following Expression holds true.

$$V_{OUT(REF)}=(V_{REF}+|K_2| \cdot V_{CMP}+|K_3| \cdot V_{DROP})/K_1 \tag{9'}$$

Assuming that $|K_3|=K_1$ holds true, the following Expression holds true.

$$V_{OUT(REF)}=(V_{REF}+|K_2| \cdot V_{CMP})/K_1+V_{DROP}) \tag{9''}$$

With the example 3.3, this is capable of optimizing the target value $V_{OUT(REF)}$ of the output voltage $V_{OUT}$ based on the voltage drop $V_{DROP}$ actually detected, thereby allowing power consumption to be reduced. Furthermore, by appropriately determining the gain K3, this is capable of correcting the voltage drop across the ground line LGND.

Figure 40:
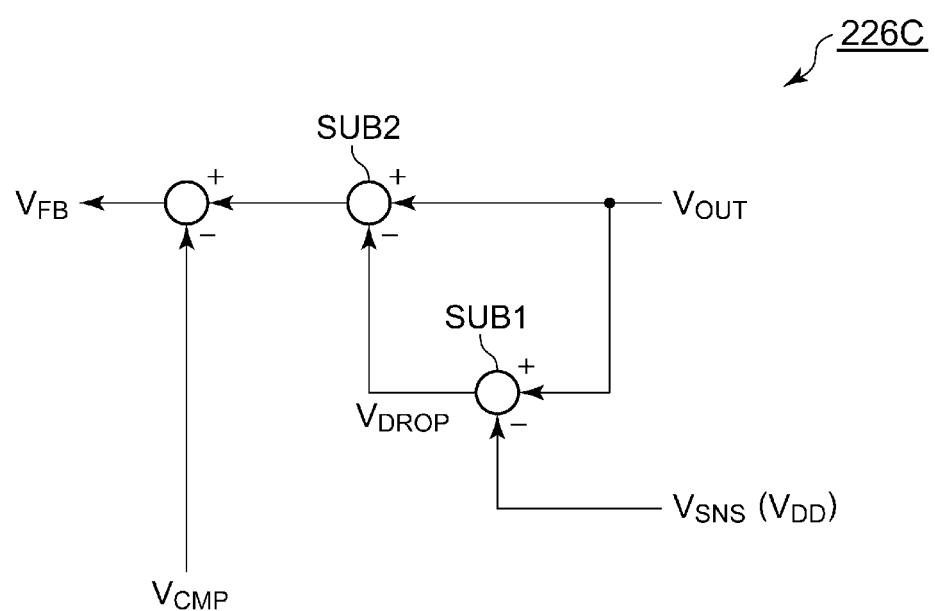
FIG. 40 is a function block diagram of a feedback circuit.

FIG. 40 is a function block diagram showing the feedback circuit 226C. The feedback circuit 226C may include three subtraction circuits SUB1 through SUB3. The subtraction circuit SUB1 subtracts the detection voltage $V_{SNS}$ from the output voltage $V_{OUT}$ so as to calculate the voltage drop $V_{DROP}$. The subtraction circuit SUB2 subtracts the voltage drop $V_{DROP}$ from the output voltage $V_{OUT}$. The subtraction circuit SUB3 subtracts the correction voltage $V_{CMP}$ from the output voltage of the subtraction circuit SUB2, i.e., ($V_{OUT}-V_{DROP}$). The subtraction order may be changed.

Example 3.4

Figure 41:
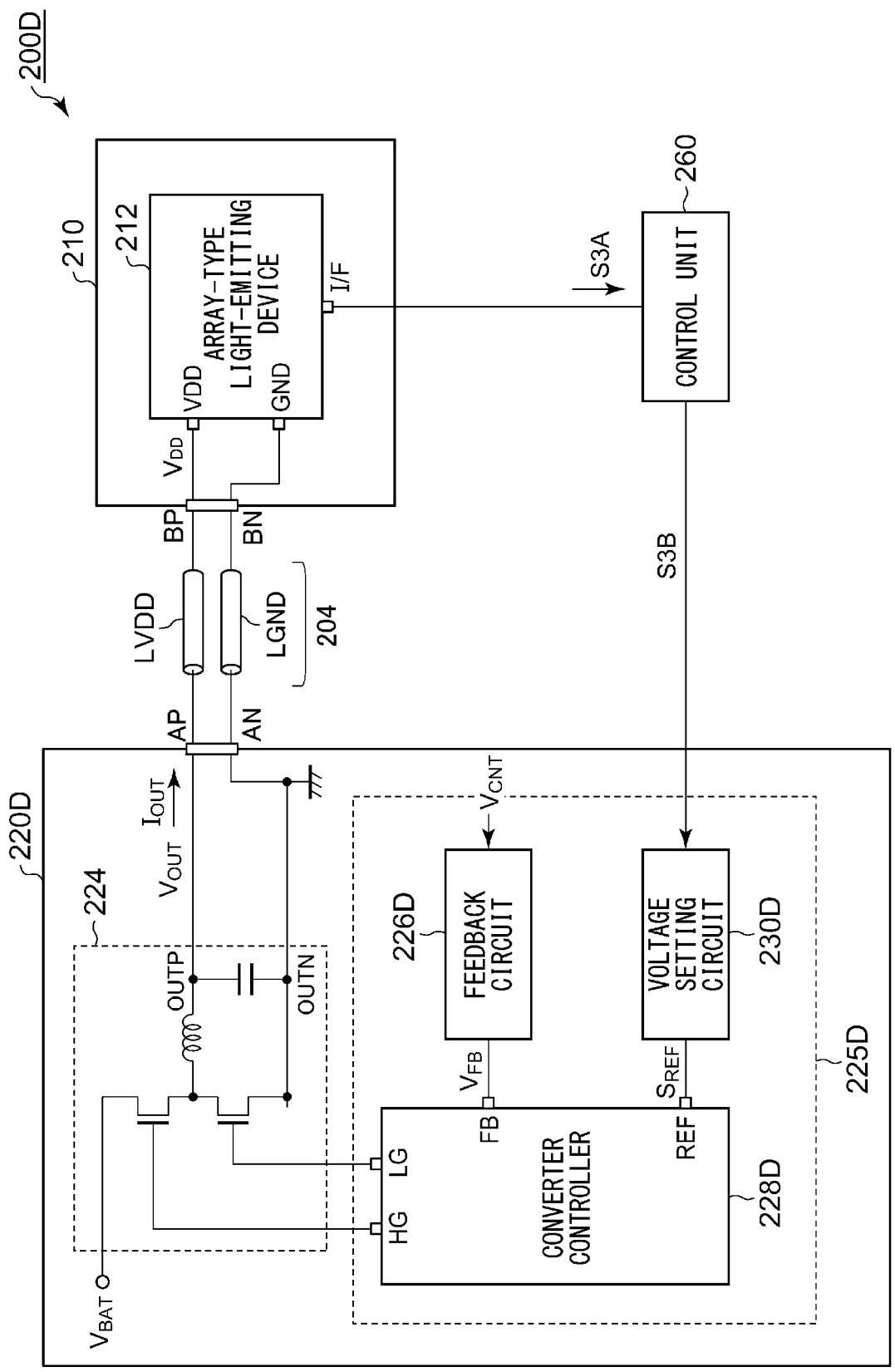
FIG. 41 is a circuit diagram of a headlamp according to an example 3.4.

FIG. 41 is a circuit diagram of a headlamp 200D according to an example 1.4. The headlamp 200D includes a variable light distribution light source 210, a power supply circuit 220D, and a control unit 260.

Description will be made regarding a configuration of the power supply circuit 220D. The power supply circuit 220D includes an output terminal OUT, a detection terminal SNS, a DC/DC converter 224, and a power supply control circuit 225D.

The power supply control circuit 225D includes a feedback circuit 226D, a converter controller 228D, and a voltage setting circuit 230D. In this example, the converter controller 228D includes a reference voltage setting pin REF, and is configured to be capable of setting the reference voltage $V_{REF}$ according to a reference signal $S_{REF}$ input to the reference voltage setting pin REF. The converter controller 228D may receive the reference signal $S_{REF}$ in the form of a digital signal, and may generate a reference voltage $V_{REF}$ using an internal voltage source. Alternatively, the converter controller 228D may receive an analog reference signal $S_{REF}$, and may employ the reference signal $S_{REF}$ itself as an internal reference voltage $V_{REF}$. The converter controller 228D feedback controls the DC/DC converter 224 such that the voltage $V_{FB}$ at the feedback pin FB approaches the reference voltage $V_{REF}$ based on the reference signal $S_{REF}$.

The voltage setting circuit 230D generates the reference signal $S_{REF}$ according to the data S3B, and supplies the reference signal $S_{REF}$ to the reference voltage setting pin REF of the converter controller 228D. In a case in which the reference signal $S_{REF}$ is an analog voltage, the voltage setting circuit 230D may have the same configuration as shown in FIG. 36 assuming that the correction voltage $V_{CMP}$ is regarded as the reference signal $S_{REF}$. In a case in which the reference signal $S_{REF}$ is a digital signal, the voltage setting circuit 230D can be configured using only the microcontroller 240 shown in FIG. 36. In this case, it can be assumed that the setting value $D_{CMP}$ is regarded as the reference signal $S_{REF}$.

The feedback circuit 226D generates the feedback voltage $V_{FB}$ that corresponds to the control target voltage $V_{CNT}$, and supplies the feedback voltage $V_{FB}$ to the feedback pin FB of the converter controller 228D.

As in the example 3.2, the control target voltage $V_{CNT}$ may be the output voltage $V_{OUT}$. In this case, the feedback voltage $V_{FB}$ is represented by the following Expression (10).

$$V_{FB}=K_1 \cdot V_{OUT} \tag{10}$$

As in the example 3.1, the power supply circuit 220D and the variable light distribution light source 210D may be coupled via the detection line LSNS. Also, the detection voltage $V_{SNS}(=V_{DD})$ may be employed as the control target voltage $V_{CNT}$. In this case, the feedback voltage $V_{FB}$ is represented by the following Expression (11).

$$V_{FB}=K_1 \cdot V_{SNS}+K_1 \cdot V_{DROP} \tag{11}$$

As in Example 3.3, the output voltage $V_{OUT}$ may be employed as the control target voltage $V_{CNT}$. Also, a voltage obtained by correcting the voltage drop $V_{DROP}$ across the power supply line VLDD may be employed as the feedback voltage $V_{FB}$. In this case, the feedback voltage $V_{FB}$ is represented by the following Expression (12).

$$V_{FB}=K_1 \cdot V_{OUT}+K_3 \cdot V_{DROP} \tag{12}$$

As explained in Example 3.3, the voltage drop $V_{DROP}$ can be obtained as follows. That is to say, the power supply circuit 220D and the variable light distribution light source 210D are coupled via the detection line LSNS. With this, the difference between $V_{OUT}$ and $V_{SNS}$ is calculated so as to obtain the voltage drop $V_{DROP}$.

With Example 3.4, the same effects can be obtained as in Examples 3.1 through 3.3.

Figure 42:
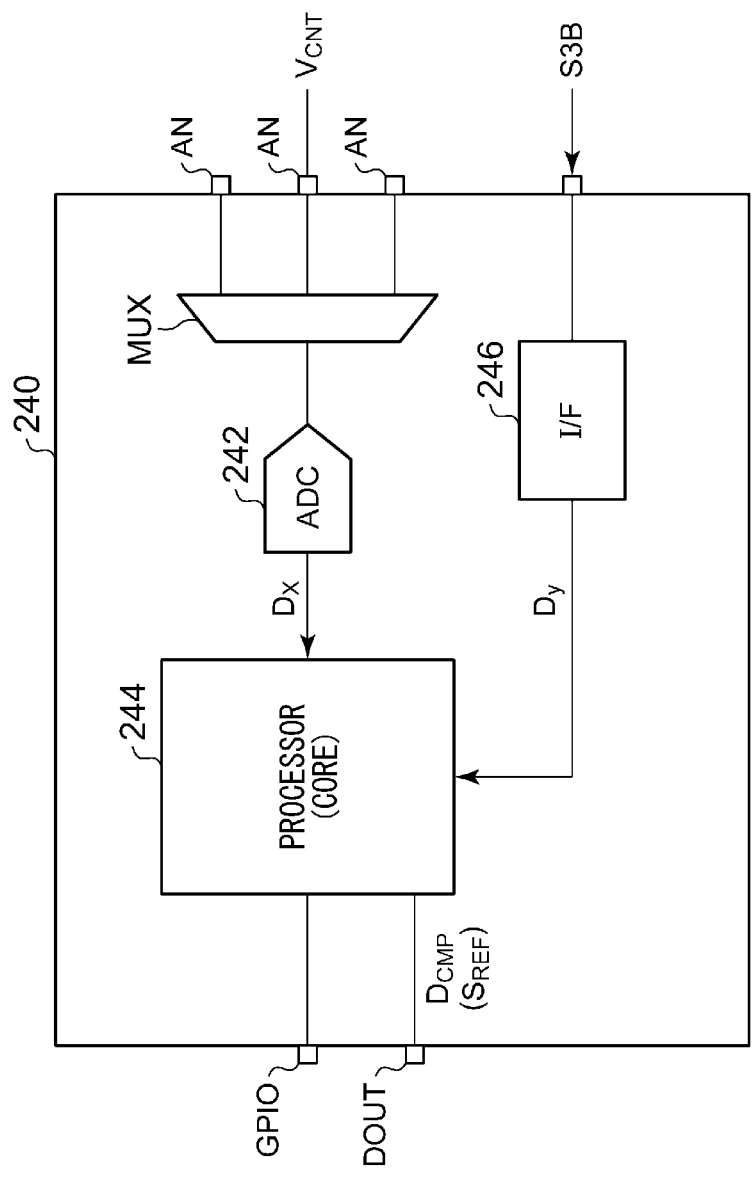
FIG. 42 is a block diagram showing a configuration of a microcontroller.

In the several examples described above, the microcontroller may be provided with the following functions. FIG. 42 is a block diagram showing a configuration of the microcontroller 240.

Abnormality Detection Function

The microcontroller 240 may acquire the difference ΔV between the control target voltage $V_{CNT}$ and the target value $V_{CNT}$ (REF) based on the data S3B. In a case in which the converter controller 228 is not able to detect a situation in which the control target voltage $V_{CNT}$ has deviated from its target value $V_{CNT\ (REF)}$, the microcontroller 240 monitors the difference between the control target voltage $V_{CNT}$ and the target value $V_{CNT(REF)}$, thereby allowing an abnormal state to be detected Fail Judgement The microcontroller 240 includes multiple analog input pins AN1 through ANX, a multiplexer MUX, an A/D converter 242, a processor (core) 244, and an interface circuit 246.

The input of the A/D converter 242 configured as a built-in component can be switched by the multiplexer MUX. The A/D converter 242 is configured to be capable of converting a voltage input to a desired analog input pin into a digital value. Furthermore, the interface circuit 246 is capable of receiving the data S3B. Also, the A/D converter 242 may be configured to be capable of receiving the input of an internal reference voltage of the microcontroller 240 or a power supply voltage in addition to the analog voltage configured as an external signal.

The control target voltage $V_{CNT}$ is input to one of the analog input pins AN of the microcontroller 240. As described above, the control target voltage $V_{CNT}$ may be the output voltage $V_{OUT}$ or the power supply voltage VDD. The A/D converter 242 generates a digital value Dx of the control target voltage $V_{CNT}$.

The processor 244 executes a software program so as to generate the setting value $D_{CMP}$ (or reference signal $S_{REF}$) that corresponds to the data S3B received by the interface circuit 246, and outputs the setting value $D_{CMP}$ from the digital output pin DOUT.

Furthermore, the processor 244 calculates a digital value Dy that represents the target value $V_{CNT(REF)}$ of the control target voltage $V_{CNT}$ based on the data S3B. Subsequently, the processor 244 calculates the difference between the digital value Dx acquired by the A/D converter 242 and the digital value Dy obtained by calculation, and compares the difference thus calculated with a threshold value. When the difference (Dx−Dy) exceeds the threshold value, the processor 244 judges that an abnormality has occurred. After performing judgment of an abnormality, the processor 244 may output a flag that represents the occurrence of the abnormality from a general-purpose output pin GPIO.

In an embodiment, when the microcontroller 240 has judged that an abnormality has occurred, the setting value $D_{CMP}$ (reference signal $S_{REF}$) may be fixed to a predetermined value. By setting the predetermined value to a high value, such an arrangement is capable of forcibly raising the target value $V_{CNT}$ (REF) of the control target value $V_{CNT}$ (REF) of the control target voltage $V_{CNT}$. With this, in an abnormal state, a high voltage is forcibly supplied to the array-type light-emitting device. This allows the lighting-on state to be maintained. That is to say, such an arrangement has a failsafe function.

Calibration of A/D Converter

In many cases, the A/D converter 242 built into the microcontroller 240 does not have sufficiently high accuracy. In a case in which the A/D converter 242 has low accuracy, this leads to degradation of the failsafe function described above. Accordingly, in a manufacturing step or a testing step of the headlamp 200, the following processing may be executed.

Figure 43:
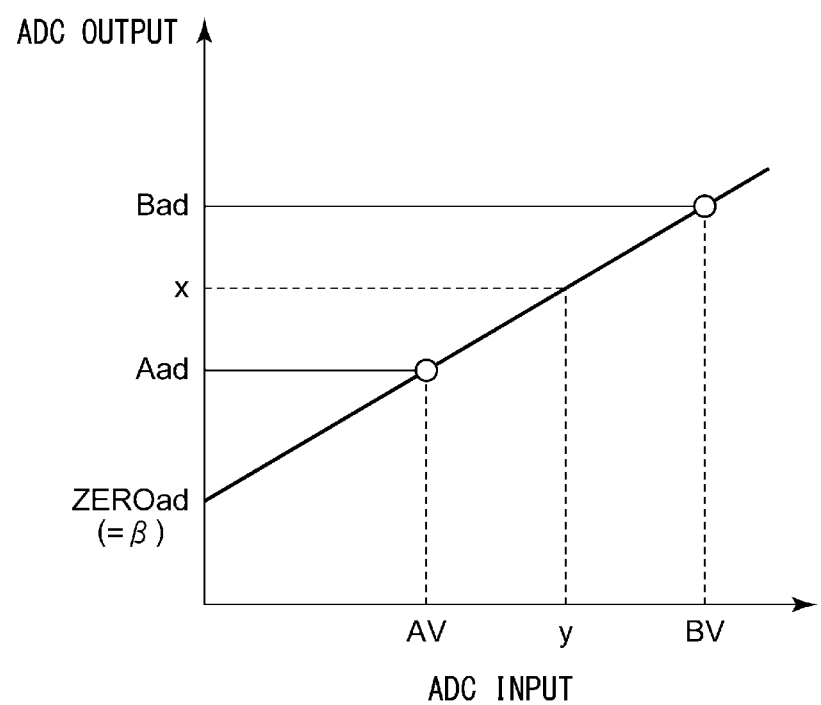
FIG. 43 is a diagram for explaining calibration of an A/D converter built into a microcontroller.

FIG. 43 is a diagram for explaining calibration of the A/D converter built into the microcontroller. An analog signal having a known voltage level is input to the analog input pin AN. Furthermore, the voltage level is switched between at least two values AV and BV. Subsequently, the two voltage levels AV and BV are converted into digital values Aad and Bad by the A/D converter 242.

Subsequently, the difference Δad between the digital values Aad and Bad is calculated. A value ΔV/Δad obtained by dividing the difference ΔV between the two analog values AV and BV by the difference Δad between the digital values is stored as a correction parameter α in a nonvolatile manner. Furthermore, the offset value ZEROad in FIG. 43 is acquired and stored as a correction parameter β in a nonvolatile manner. The offset value ZEROad may be calculated using the measurement results for the two points. Also, the offset value ZEROad may be acquired by inputting 0 V to the A/D converter 242.

After the headlamp 200 is shipped, the processor 244 of the microcontroller 240 corrects the output x of the A/D converter 242 using the parameters α and β. The corrected value, i.e., the true value y, can be obtained using the following Expression.

$$y=(x-\beta)\times\alpha$$

The microcontroller 240 may log information useful for analysis of the headlamp 200 or development of a new product. Description will be made regarding examples of information to be logged by the microcontroller 240.

Temperature Information

The microcontroller 240 logs temperature information acquired using an external or a built-in temperature sensor. The temperature information can include the maximum temperature, minimum temperature, and average temperature.

Power Supply Voltage Information

The microcontroller 240 logs information with respect to various kinds of power supply voltages supplied from an external component and/or generated by a built-in power supply circuit. The voltage information can include the maximum voltage, minimum voltage, and average voltage.

Measurement Information when an Abnormality is Detected

When an abnormality has been detected, the microcontroller 240 logs the time at which the abnormality occurred and the kind of the abnormality. In this case, ancillary information such as the temperature, power supply voltage, etc., when the abnormality occurred is also logged.

Information with Respect to Accumulated Operating Time

The microcontroller 240 logs information with respect to the accumulated time since shipment from the factory. The accumulated operating time can include the accumulated time during which the power supply circuit 220 has been operated, the time during which the variable light distribution light source 210 including the array-type light-emitting device 212 has been operated, etc., based on various kinds of power supply voltages supplied from an external component and/or generated by a built-in power supply circuit.

Description will be made regarding modifications relating to the embodiment 3.

Modification 3.1

Figure 44:
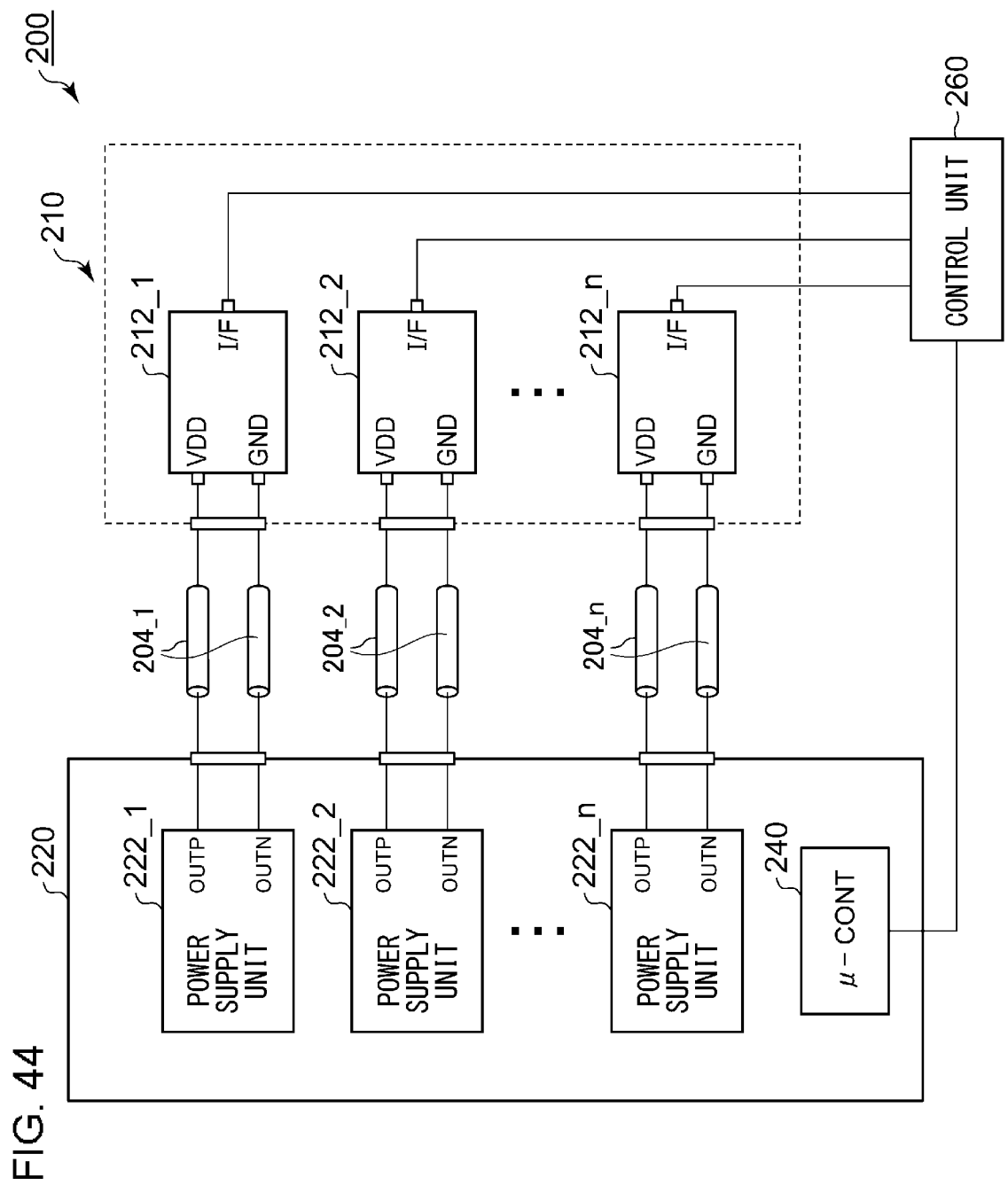
FIG. 44 is a diagram showing a headlamp according to a modification 3.1.

FIG. 44 is a diagram showing the headlamp 200 according to a modification 3.1. Description has been made above regarding the variable light distribution light source 210 including a single array-type light-emitting device 212. Also, the variable light distribution light source 210 may include multiple array-type light-emitting devices 212. In this case, the power supply circuit 220 may be configured as a unit (which will be referred to as a "power supply unit 222"). Also, multiple power supply units 222 may be provided corresponding to the multiple array-type light-emitting devices 212. The output terminal of each power supply unit 222 is coupled to the power supply terminal of the corresponding array-type light-emitting device 212 via an independent power supply cable LVDD. Also, a detection line LSNS may preferably be provided for each pair of a power supply unit 222 and an array-type light-emitting device 212 as necessary. In this modification, the microcontroller 240 may be configured as a common component for the multiple power supply units.

In the modification 3.1, the variable light distribution light source 210 has a configuration provided by division thereof into multiple array-type light-emitting devices 212 each having an independent power supply terminal. Furthermore, a power supply unit 222 is provided for each array-type light-emitting device 212. Moreover, each array-type light-emitting device 212 is coupled to a corresponding power supply unit 222 via a power supply cable in a one-to-one manner. This allows the current that flows through the variable light distribution light source 210 to be distributed to multiple DC/DC converters included in the multiple systems. This allows the effects of voltage drop that occurs in each DC/DC converter to be reduced, thereby providing improved load responsiveness. In addition, this allows the number of options for the components of the DC/DC converters, power supply cables, and connectors to be increased, thereby providing an improved degree of design freedom.

Modification 3.2

Figure 45:
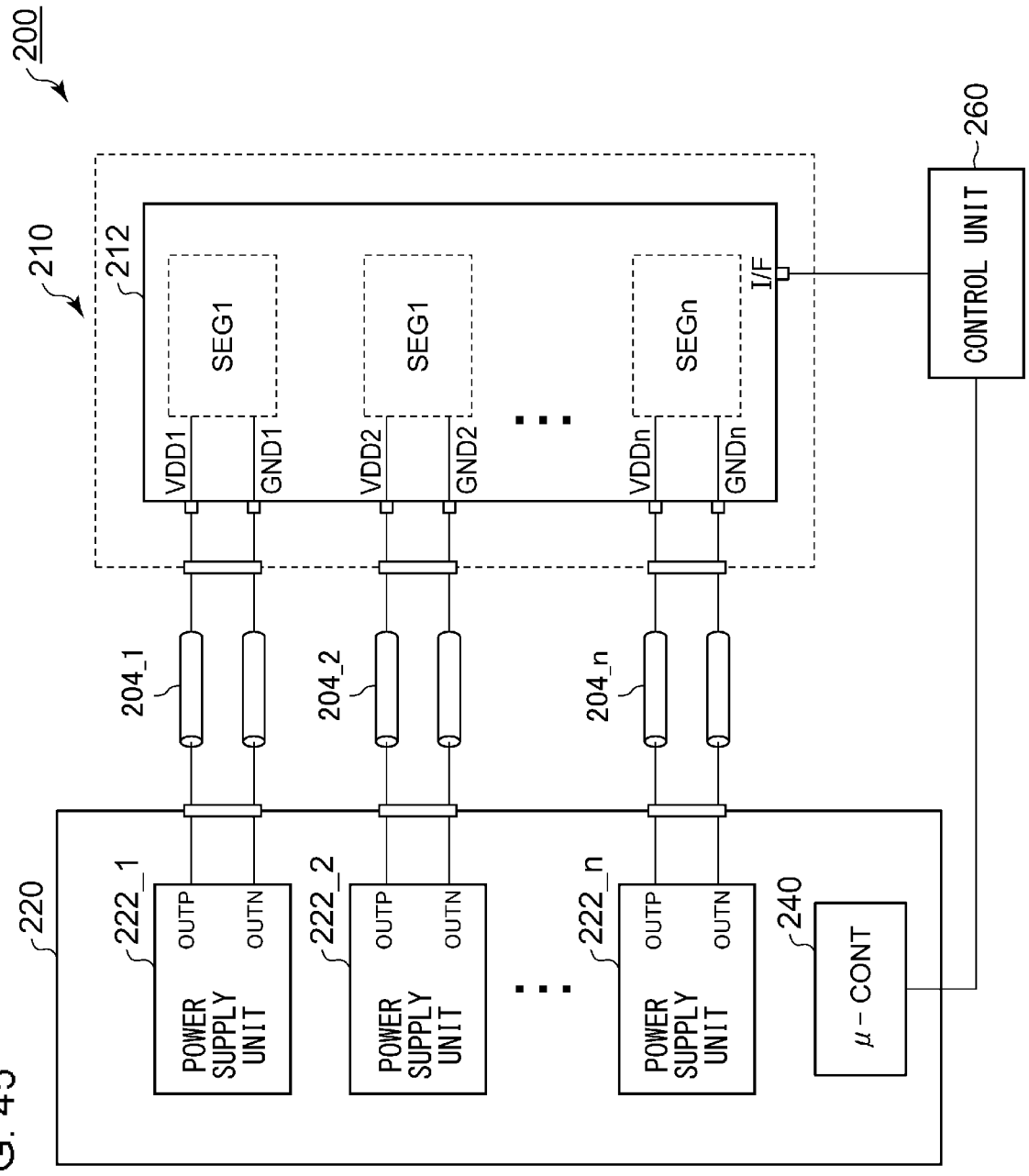
FIG. 45 is a diagram showing a lamp system according to a modification 3.2.

FIG. 45 is a diagram showing the headlamp 200 according to a modification 3.2. The array-type light-emitting device 212 may be configured such that the multiple internal light-emitting pixels are divided into multiple segments SEG1 through SEGn. Also, the multiple segments SEG1 through SEGn may be provided with corresponding multiple power supply terminals VDD. The power supply circuit 220 is provided with multiple power supply units 222_1 through 222_n corresponding to the multiple power supply terminals VDD. The output terminal OUT of each power supply unit 222 is coupled to the corresponding power supply terminal VDD of the array-type light-emitting device 212 via an independent power supply cable LVDD. Also, a detection line LSNS may preferably be provided for each power supply unit 222 as necessary.

With the modification 3.2, this allows the current that flows through the variable light distribution light source 210 to be distributed to the DC/DC converters included in the multiple systems. Such an arrangement provides the same effects as in the modification 3.1.

Modification 3.3

The power supply unit 222 may be configured as a phase-shift converter. By employing such a phase-shift converter, this allows the ripples that occur in the output voltage $V_{OUT}$ and the output current $I_{OUT}$ to be reduced. Furthermore, such an arrangement provides improved efficiency. Furthermore, in a case in which PWM control is employed for each pixel circuit of the array-type light-emitting device 212, the output current $I_{OUT}$ of the power supply unit 222 fluctuates at high speed according to the lighting-on ratio of the multiple pixel circuits. With this, by employing such a phase-shift converter, such an arrangement provides improved tracking performance (responsiveness) with respect to load fluctuations.

Modification 3.4

Description has been made regarding an arrangement in which the power supply circuit 220 and the control unit 260 are built into the headlamp 200. Also, either one or both of the power supply circuit 220 and the control unit 260 may be arranged outside the body of the headlamp 200. The variable light distribution light source 210 serves as a heat generator. Accordingly, an arrangement in which the control unit 260, which has a weak point with respect to heat, is arranged in the vehicle interior away from the variable light distribution light source 210 is advantageous from a thermal design viewpoint.

Modification 3.5

The power supply control circuit 225 may directly receive the data S3 output from the interface circuit 216 without going through the control unit 260.

Modification 3.6

The power supply control circuit 225 may determine the target value based on the maximum value of the forward voltages $V_{F1}$ through $V_{Fn}$ of all the pixels regardless of whether or not each pixel circuit PIX is turned on. The power supply control circuit 225 may determine the target value based on the maximum value of the forward voltages $V_F$ that are actually turned on from among the multiple pixel circuits PIX.

Modification 3.7

The array-type light-emitting device may be configured such that the maximum value $V_{F(MAX)}$ of the forward voltages $V_F$ of the multiple internal light-emitting elements are measured beforehand, and the maximum value thus measured is held in internal nonvolatile memory. The forward voltage $V_{F(MAX)}$ may be the maximum value of all the pixels in all temperature ranges. Alternatively, the forward voltage $V_{F(MAX)}$ may be held for each temperature range. Also, data including the maximum value that corresponds to the current temperature may be transmitted.

Description has been made regarding the present invention with reference to the embodiments using specific terms. However, the above-described embodiments show only the mechanisms and applications of the present invention. Rather, various modifications and various changes in the layout can be made without departing from the spirit and scope of the present invention defined in appended claims.

What is claimed is:

1. A lamp system comprising:
   an array-type light-emitting device comprising a plurality of pixel circuits electrically coupled in parallel, and spatially arranged in a matrix; and
   a power supply circuit structured to supply electric power to the array-type light-emitting device,
   wherein the power supply circuit comprises:
   a DC/DC converter having an output coupled to the array-type light-emitting device via a power supply cable; and
   a power supply control circuit structured to set a target value according to a light distribution pattern, and to control the DC/DC converter such that a control target voltage which is based on an output voltage of the DC/DC converter approaches the target value.

2. The lamp system according to claim 1, wherein the power supply control circuit changes the target value before the change of the light distribution pattern.

3. The lamp system according to claim 1, further comprising a control unit structured to control the plurality of pixel circuits according to the light distribution pattern,
wherein the power supply control circuit sets the target value according to first data with respect to the light distribution pattern received from the control unit.

4. The lamp system according to claim 1, wherein the power supply control circuit comprises:
a voltage setting circuit structured to generate a correction voltage that corresponds to the light distribution pattern;
a feedback circuit structured to generate a feedback voltage based on the control target voltage and the correction voltage; and
a converter controller structured to receive the feedback voltage via a feedback pin thereof, and to control the DC/DC converter such that the feedback voltage approaches a predetermined reference voltage.

5. The lamp system according to claim 4, wherein the voltage setting circuit comprises:
a microcontroller structured to generate a digital setting value that corresponds to the light distribution pattern; and
a D/A converter structured to convert the setting value into the correction voltage in the form of an analog signal.

6. The lamp system according to claim 1, wherein the power supply circuit comprises:
a voltage setting circuit structured to generate a reference signal that corresponds to the light distribution pattern; and
a converter controller having a feedback pin structured to receive a feedback voltage that corresponds to the control target voltage and a reference voltage setting pin structured to receive the reference signal, and structured to control the DC/DC converter such that the feedback voltage approaches a reference voltage based on the reference signal.

7. The lamp system according to claim 6, wherein the voltage setting circuit comprises a microcontroller structured to generate a digital setting value that corresponds to the light distribution pattern,
and wherein the reference voltage corresponds to the setting value.

8. The lamp system according to claim 1, wherein the power supply circuit further comprises a detection terminal to be coupled to a power supply terminal of the array-type light-emitting device via a detection line separate from the power supply cable,
and wherein the control target voltage is a detection voltage that occurs at the detection terminal.

9. The lamp system according to claim 1, wherein the control target voltage is an output voltage of the DC/DC converter.

10. The lamp system according to claim 1, wherein the array-type light-emitting device is configured to generate second data with respect to voltage drops across a plurality of light-emitting elements included in the plurality of pixel circuits, and to transmit the second data to an external circuit,
and wherein the power supply control circuit sets the target value based on the second data in addition to the light distribution pattern.

11. A lamp system comprising an array-type light-emitting device comprising a plurality of pixel circuits electrically coupled in parallel, and spatially arranged in a matrix;
a power supply circuit structured to supply electric power to the array-type light-emitting device; and
a coupling means comprising a power supply cable structured to couple the power supply circuit and the array-type light-emitting device,
wherein the power supply circuit comprises:
a DC/DC converter having an output coupled to the array-type light-emitting device via the coupling means; and
a power supply control circuit structured to acquire a voltage drop across the coupling means, to set a target value according to the voltage drop across the coupling means, and to control the DC/DC converter such that an output voltage of the DC/DC converter approaches the target value.

12. The lamp system according to claim 11, wherein the power supply circuit further comprises a current sensor structured to generate a current detection signal that corresponds to an output current of the DC/DC converter,
and wherein the power supply control circuit sets the target value according to the current detection signal.

13. The lamp system according to claim 11, wherein the power supply circuit further comprises a detection terminal coupled to a power supply terminal of the array-type light-emitting device via a detection line separate from the power supply cable,
and wherein the power supply control circuit acquires the voltage drop across the coupling means based on a difference between an output voltage of the DC/DC converter and a detection voltage at the detection terminal.

14. The lamp system according to claim 11, wherein the power supply control circuit comprises:
a feedback circuit structured to generate a feedback voltage based on an output voltage of the DC/DC converter and a correction voltage that corresponds to the voltage drop across the coupling means; and
a converter controller structured to receive the feedback voltage via a feedback pin, and to control the DC/DC converter such that the feedback voltage approaches a predetermined reference voltage.

15. The lamp system according to claim 11, wherein the power supply control circuit comprises:
a voltage setting circuit structured to generate a reference signal that corresponds to the voltage drop across the coupling means; and
a converter controller comprising a feedback pin structured to receive a feedback voltage that corresponds to the output voltage and a reference voltage setting pin structured to receive the reference signal, and structured to control the DC/DC converter such that the feedback voltage approaches a reference voltage based on the reference signal.

16. A power supply circuit structured to supply electric power to an array-type light-emitting device comprising a plurality of pixel circuits electrically coupled in parallel, and spatially arranged in a matrix, the power supply circuit comprising:
a DC/DC converter having an output coupled to the array-type light-emitting device via a coupling means comprising a power supply cable;
a current sensor structured to generate a current detection signal that corresponds to an output current of the DC/DC converter;
a converter controller comprising a feedback pin, and structured to control the DC/DC converter such that a feedback voltage input to the feedback pin approaches a predetermined reference voltage; and a feedback circuit structured to supply a feedback signal that corresponds to an output voltage of the DC/DC converter and the current detection signal to the feedback pin of the converter controller.

17. A lamp system comprising:

a variable light distribution light source comprising an array-type light-emitting device; and a power supply circuit structured to supply electric power to the array-type light-emitting device, wherein the array-type light-emitting device comprises a plurality of pixel circuits electrically coupled in parallel, spatially arranged in a matrix, and each comprising a light-emitting element and a current source coupled in series, and the array-type light-emitting device is structured to generate data with respect to voltage drops across the plurality of light-emitting elements included in the plurality of pixel circuits, and to transmit the data to an external circuit, and wherein the power supply circuit comprises:

a DC/DC converter having an output coupled to the array-type light-emitting device via a power supply cable; and a power supply control circuit structured to control the DC/DC converter such that the control target voltage approaches a target value that corresponds to the data.

18. The lamp system according to claim 17, wherein the target value is designed based on a maximum value of voltage drops across the plurality of light-emitting elements.

19. The lamp system according to claim 17, wherein the current control circuit comprises:

a voltage setting circuit structured to generate a correction voltage that corresponds to the data;

a feedback circuit structured to generate a feedback voltage based on the control target voltage and the correction voltage; and a converter controller structured to receive the feedback voltage via a feedback pin, and to control the DC/DC converter such that the feedback voltage approaches a predetermined reference voltage.

20. The lamp system according to claim 19, wherein the voltage setting circuit comprises:

a microcontroller structured to generate a digital setting value that corresponds to the data; and a D/A converter structured to convert the setting value into the correction voltage configured as an analog signal.

21. The lamp system according to claim 20, wherein the microcontroller acquires a difference between the control target voltage and the target value thereof based on the data.

22. The lamp system according to claim 21, wherein, when a difference between the control target voltage and the target value exceeds a predetermined threshold value, the microcontroller judges that an abnormality has occurred.

23. The lamp system according to claim 22, wherein, when the microcontroller has judged that an abnormality has occurred, the setting value is fixed to a predetermined value.

24. The lamp system according to claim 20, wherein the microcontroller stores a history of the data.

25. The lamp system according to claim 20, further comprising a temperature sensor, wherein the microcontroller stores information with respect to a temperature acquired by the temperature sensor.

26. The lamp system according to claim 17, wherein the power supply control circuit comprises:

a voltage setting circuit structured to generate a reference signal that corresponds to the data; and a converter controller comprising a feedback pin structured to receive a feedback voltage that corresponds to the control target voltage and a reference voltage setting pin structured to receive the reference signal, and structured to control the DC/DC converter such that the feedback voltage approaches a reference voltage based on the reference signal.

27. The lamp system according to claim 26, wherein the voltage setting circuit comprises a microcontroller structured to generate a digital setting value that corresponds to the data, and wherein the reference voltage corresponds to the setting value.

28. The lamp system according to claim 17, wherein the power supply circuit further comprises a detection terminal coupled to a power supply terminal of the array-type light-emitting device via a detection line separate from the power supply cable, and wherein the control target voltage is a detection voltage that occurs at the detection terminal.

29. The lamp system according to claim 17, wherein the control target voltage is an output voltage of the DC/DC converter.

30. The lamp system according to claim 17, further comprising a control unit coupled to an interface circuit of the array-type light-emitting device, and structured to control an on/off state of each of the plurality of pixel circuits of the array-type light-emitting device, and wherein the power supply control circuit receives the data via the control unit.

* * * * *